US008395699B2

(12) United States Patent
Wada et al.

(10) Patent No.: US 8,395,699 B2
(45) Date of Patent: Mar. 12, 2013

(54) SOLID-STATE IMAGING DEVICE, CAMERA, ELECTRONIC APPARATUS, AND METHOD FOR MANUFACTURING SOLID-STATE IMAGING DEVICE

(75) Inventors: Kazushi Wada, Kagoshima (JP); Yoichi Otsuka, Kanagawa (JP)

(73) Assignee: Sony Corporation, Tokyo (JP)

( * ) Notice: Subject to any disclaimer, the term of this patent is extended or adjusted under 35 U.S.C. 154(b) by 406 days.

(21) Appl. No.: 12/698,314

(22) Filed: Feb. 2, 2010

(65) Prior Publication Data

US 2010/0201855 A1 Aug. 12, 2010

(30) Foreign Application Priority Data

Feb. 9, 2009 (JP) ................................. 2009-027341
Mar. 26, 2009 (JP) ................................. 2009-075978

(51) Int. Cl.
*H04N 5/225* (2006.01)

(52) U.S. Cl. . 348/374; 257/291; 257/294; 257/E21.026; 257/E21.027

(58) Field of Classification Search .................. 348/374; 257/291, 294, E21.026, E21.027
See application file for complete search history.

(56) References Cited

U.S. PATENT DOCUMENTS

| | | | |
|---|---|---|---|
| 2006/0125020 A1* | 6/2006 | Jung | 257/369 |
| 2007/0210239 A1* | 9/2007 | Lee et al. | 250/208.1 |
| 2008/0316449 A1* | 12/2008 | Adachi | 355/53 |
| 2009/0243123 A1* | 10/2009 | Meisner et al. | 257/797 |

FOREIGN PATENT DOCUMENTS

| | | |
|---|---|---|
| JP | HEI 03-181168 A | 8/1991 |
| JP | HEI 05-021768 A | 1/1993 |
| JP | HEI 06-045569 A | 2/1994 |
| JP | HEI 06-209094 A | 7/1994 |
| JP | HEI 08-288483 A | 11/1996 |
| JP | 11-103037 | 4/1999 |
| JP | 2001-267543 | 9/2001 |
| JP | 2002-110954 A | 4/2002 |
| JP | 2002-359363 | 12/2002 |
| JP | 2004-304148 | 10/2004 |
| JP | 2004-356503 | 12/2004 |
| JP | 2005-109196 | 4/2005 |
| JP | 2007-324481 | 12/2007 |
| JP | 2008-187028 | 8/2008 |

OTHER PUBLICATIONS

Japanese Office Action dated Sep. 6, 2011, in connection with counterpart Japanese Patent Application No. 2009-075978.
Japanese Patent Office, Office Action issued in Patent Application JP 2009-027341, on Jan. 18, 2011.

* cited by examiner

*Primary Examiner* — Anthony J Daniels
(74) *Attorney, Agent, or Firm* — SNR Denton US LLP

(57) ABSTRACT

A method for manufacturing a solid-state imaging device, in which a photoelectric conversion portion to receive light with a light-receiving surface and generate a signal charge is disposed in a substrate, includes the steps of forming a metal light-shield layer above the substrate and in a region other than a region corresponding to the light-receiving surface, forming a light-reflection layer above the metal light-shield layer, and forming a photoresist pattern layer from a negative type photoresist film formed above the light-reflection layer, by conducting an exposing treatment and a developing treatment, wherein in the forming of the light-reflection layer, the light-reflection layer includes a shape corresponding to a pattern shape of the photoresist pattern layer, and the light-reflection layer is formed in such a way as to reflect exposure light to the photoresist film in conduction of the exposing treatment in the forming of the photoresist pattern layer.

6 Claims, 42 Drawing Sheets

FIG. 21
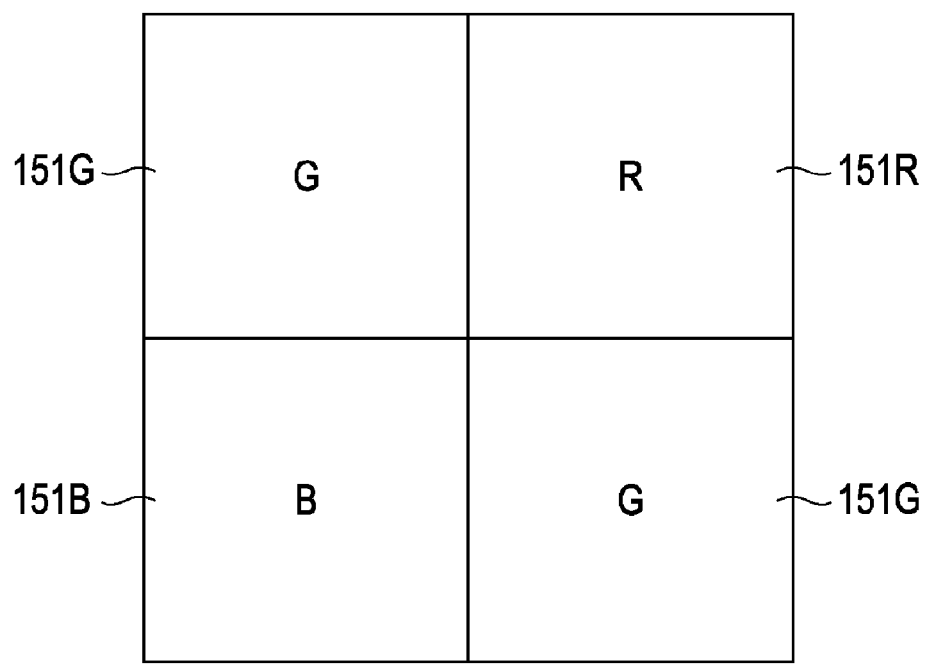
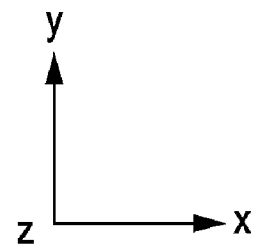

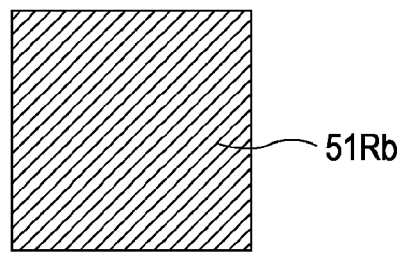
FIG. 35A
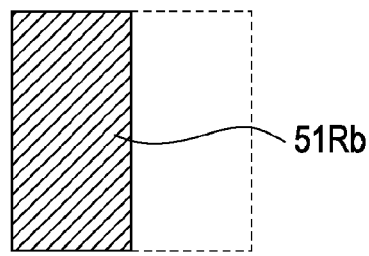
FIG. 35B
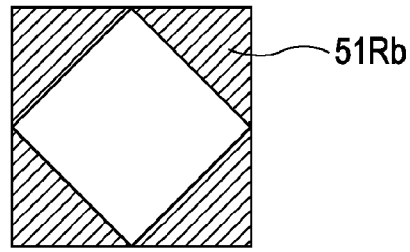
FIG. 35C
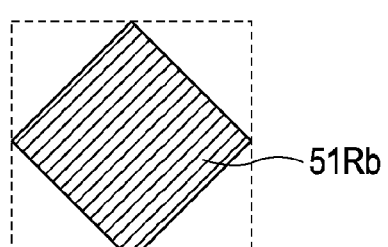
FIG. 35D
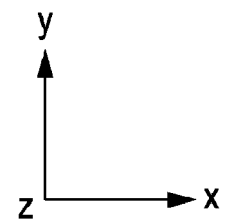

FIG. 41
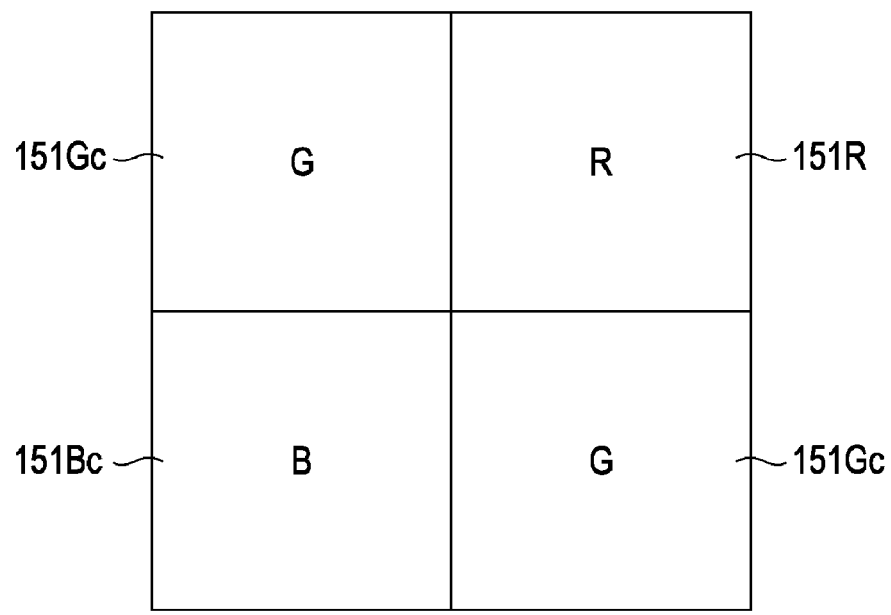
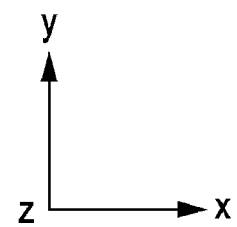

SOLID-STATE IMAGING DEVICE, CAMERA, ELECTRONIC APPARATUS, AND METHOD FOR MANUFACTURING SOLID-STATE IMAGING DEVICE

BACKGROUND OF THE INVENTION

1. Field of the Invention

The present invention relates to a solid-state imaging device, a camera, an electronic apparatus, and a method for manufacturing a solid-state imaging device.

2. Description of the Related Art

Cameras, e.g., digital video cameras and digital steel cameras, include solid-state imaging devices. For example, a charge coupled device (CCD) type image sensor is included as the solid-state imaging device.

For example, in the CCD type image sensor, an imaging region, in which a plurality of pixels are arranged in the matrix in a horizontal direction and a vertical direction, is disposed on a surface of a substrate. In this imaging region, a plurality of photoelectric conversion portions to receive the light based on a subject image and generate signal charges are disposed in such a way as to correspond to the plurality of pixels. For example, a photodiode is disposed as this photoelectric conversion portion. A microlens is disposed above the photoelectric conversion portion, and the photoelectric conversion portion is configured to receive the light incident through this microlens.

Furthermore, vertical transfer register portions are disposed between lines of a plurality of photoelectric conversion portions aligned in the vertical direction in the imaging region. The vertical transfer register portion includes a plurality of transfer electrodes disposed opposing to vertical transfer channel regions with a gate insulating film therebetween and transfers the signal charge read from the photoelectric conversion portion by a charge readout portion in the vertical direction. Then, the signal charges, which are transferred by the vertical transfer register portion on a horizontal line (pixels in one line) basis, are transferred in the horizontal direction sequentially by a horizontal transfer portion, and are output by an output portion (refer to Japanese Unexamined Patent Application Publication No. 2002-359363, for example).

Furthermore, in the imaging region, a metal light-shield layer is disposed in such a way as to block the light incident on the vertical transfer register portion in order to prevent an occurrence of a problem, e.g., a smear.

In the above-described solid-state imaging device, an alias referred to as a flare or a ghost may occur. For example, in the case where the incident light is reflected diffusely by a reflection layer, e.g., a metal light-shield layer, and enters the photoelectric conversion portion, an alias may occur.

In order to prevent an occurrence of an alias, it has been proposed that a black color resist pattern layer, which is referred to as on chip black (OCB) and which serves as a light-shield layer, is further disposed above the metal light-shield layer (refer to Japanese Unexamined Patent Application Publication No. 2007-324481 and Japanese Unexamined Patent Application Publication No. 2004-356503, for example).

Moreover, a color filter is disposed above the above-described photoelectric conversion portion, and the light colored with this color filter is received by the photoelectric conversion portion. The color filter includes, for example, color filters of three primary colors, and the color filters of three primary colors are arranged in the Bayer pattern. In addition, a microlens is disposed above the color filter and the light condensed with this microlens enters the photoelectric conversion portion through the color filter (refer to Japanese Unexamined Patent Application Publication No. 2001-267543, for example).

Besides, it is proposed that an intralayer lens is disposed between the photoelectric conversion portion and the microlens. The intralayer lens is disposed to apply the light incident through an on-chip lens to the photoelectric conversion portion efficiently (refer to Japanese Unexamined Patent Application Publication No. 2004-304148 and Japanese Unexamined Patent Application Publication No. 11-103037, for example).

Furthermore, in the above-described solid-state imaging device, in order to cut infrared rays other than visible rays from the incident light, an infrared cut filter is disposed.

The infrared cut filters are roughly divided into a light absorption type, e.g., color glass filters, and a light reflection type by using an inorganic interference multilayer film.

FIG. 2 is a diagram showing a spectral transmission characteristic of an infrared cut filter. In FIG. 2, a broken line indicates the case of the light absorption type, and the solid line indicates the case of the light reflection type.

As indicated by the broken line shown in FIG. 2, in the case of the light absorption type, infrared rays are cut through absorption of the infrared rays. The light in the wavelength range out of the cut wavelength range corresponding to the infrared rays may be absorbed to a large extent. On the other hand, as indicated by the solid line shown in FIG. 2, in the case of the light reflection type by using an inorganic interference multilayer film, the light in the wavelength range out of the cut wavelength range is almost transmitted. Specifically, the light having a red component is transmitted by the light reflection type to a large extent as compared with that by the light absorption type.

Consequently, regarding the solid-state imaging device, the infrared cut filter of the light reflection type by using an inorganic interference multilayer film is used favorably in order to improve the sensitivity (refer to Japanese Unexamined Patent Application Publication No. 2005-109196, for example).

SUMMARY OF THE INVENTION

However, in the above-described cases, formation of an OCB film into a desired shape may be difficult because of an occurrence of variations in line width or the like. Consequently, the light incident on the photoelectric conversion portion may be rejected by such an OCB film and the image quality of an image acquired through imaging may deteriorate.

FIG. 1 is a sectional view of a key portion of a solid-state imaging device 1J.

As shown in FIG. 1, in the solid-state imaging device 1J, an OCB film 43J may be patterned into a normal taper shape.

This is because in some cases where an exposing treatment is conducted to pattern a negative type photoresist film containing a black colorant into the OCB film 43J, the exposure light may be reflected by a metal light-shield layer 41J located as a layer thereunder. Consequently, in the case where the OCB film 43J is patterned into a normal taper shape, variations may occur in the line width thereof and the above-described problem may become apparent.

Deterioration of image quality may occur because it is difficult to form a photoresist pattern layer, such as, the OCB film 43J, into a desired pattern, as described above.

Therefore, it is desirable to provide a solid-state imaging device, a camera, and methods for manufacturing them, wherein a photoresist pattern layer can be formed into a desired pattern and the image quality can be improved.

It is desired that the solid-state imaging device has a finer cell size (pixel size). However, in the case where the cell size is made finer, outputs (spectral outputs) may be different depending on colors, and the image quality of color image acquired through imaging may deteriorate.

FIGS. 3A and 3B are diagrams showing the results of undulation simulation conducted with respect to the manner, in which the parallel light incident on a solid-state imaging device is transferred passing through a microlens, a color filter, and an intralayer lens. FIG. 3A shows the case of green light, and FIG. 3B shows the case of red light. In FIGS. 3A and 3B, a brighter portion indicates higher light intensity.

As shown in FIGS. 3A and 3B, in the solid-state imaging device having a fine cell size, the red light with a large wavelength (FIG. 3B) is susceptible to diffraction and scattering as compared with the green light (FIG. 3A) with a wavelength smaller than that of the red light. Consequently, the red light is not easily condensed on a light receiving surface of a photodiode accurately as compared with the green light, and the sensitivity characteristic may deteriorate. The same holds for the blue light because the wavelength is smaller than that of the red light.

In order to improve this issue, it is considered that the above-described intralayer lens is disposed while the structure is adjusted appropriately.

FIG. 4 is a diagram showing the spectral output of a solid-state imaging device. In FIG. 4, the spectral output Vr of the red component, the spectral output Vg of the green component, and the spectral output Vb of the blue component are indicated.

Here, the spectral output Vr of the red can be improved by providing an intralayer lens in the same shape to each of pixels of individual colors. However, as shown in FIG. 4, the spectral output Vr of the red component may become high significantly as compared with the spectral outputs Vg and Vb of the other colors.

In this case, it is desirable to adjust the white balance in a camera system. However, in the case where the sensitivity to red is significantly high as described above, the adjustment is difficult. Consequently, the image quality of the image acquired through imaging may deteriorate.

Furthermore, a ghost may occur, in a color image acquired through imaging, resulting from the above-described infrared cut filter of the light reflection type by using an inorganic interference multilayer film, and the image quality may deteriorate. Specifically, in the case where the incident light passed through the individual portions is reflected and returned to the infrared cut filter of the light reflection type, the light may reflected by the infrared cut filter again and enter another pixel, so that a ghost may occur in the image acquired through imaging.

In particular, among the colored light of three primary colors, the red light with a large wavelength is reflected by the infrared cut filter of the light reflection type, in contrast to the other colored light, an occurrence of this issue becomes apparent.

Moreover, the green light or the blue light other than the red light may be reflected at members other than the infrared cut filter and enter another pixel, so that a ghost may occur in the image acquired through imaging likewise.

As described above, regarding the solid-state imaging device and electronic apparatuses, e.g., a camera including a solid-state imaging device, the image quality of the image acquired through imaging may deteriorate as the pixel is made finer.

Accordingly, it is desirable to provide a solid-state imaging device, an electronic apparatus, and a method for manufacturing a solid-state imaging device, wherein the image quality of the image acquired through imaging can be improved.

According to an embodiment of the present invention, a method for manufacturing a solid-state imaging device, in which a photoelectric conversion portion to receive light with a light-receiving surface and generate a signal charge is disposed in a substrate, includes the steps of forming a metal light-shield layer above the above-described substrate and in a region other than a region corresponding to the above-described light-receiving surface, forming a light-reflection layer, which reflects light, above the above-described metal light-shield layer, and forming a photoresist pattern layer from a negative type photoresist film by conducting an exposing treatment and a developing treatment of the above-described photoresist film formed above the above-described light-reflection layer, wherein in the above-described forming of the light-reflection layer, the above-described light-reflection layer includes a shape corresponding to a pattern shape of the above-described photoresist pattern layer, and the above-described light-reflection layer is formed in such a way as to reflect exposure light to the above-described photoresist film in conduction of the above-described exposing treatment in the above-described forming of the photoresist pattern layer.

According to an embodiment of the present invention, a method for manufacturing a camera including a solid-state imaging device, in which a photoelectric conversion portion to receive light with a light-receiving surface and generate a signal charge is disposed in a substrate, includes the steps of forming a metal light-shield layer above the above-described substrate and in a region other than a region corresponding to the above-described light-receiving surface, forming a light-reflection layer, which reflects light, above the above-described metal light-shield layer, and forming a photoresist pattern layer from a negative type photoresist film by conducting an exposing treatment and a developing treatment of the above-described photoresist film formed above the above-described light-reflection layer, wherein in the above-described forming of the light-reflection layer, the above-described light-reflection layer includes a shape corresponding to a pattern shape of the above-described photoresist pattern layer, and the above-described light-reflection layer is formed in such a way as to reflect exposure light to the above-described photoresist film in conduction of the above-described exposing treatment in the above-described forming of the photoresist pattern layer.

According to an embodiment of the present invention, a solid-state imaging device includes a photoelectric conversion portion, which is disposed in a substrate, to receive light with a light-receiving surface and generate a signal charge, a metal light-shield layer disposed above the above-described substrate and in a region other than a region corresponding to the above-described light-receiving surface, a light-reflection layer disposed above the above-described metal light-shield layer, and a photoresist pattern layer disposed above the above-described light-reflection layer, wherein the above-described photoresist pattern layer is formed from a negative type photoresist film by conducting an exposing treatment and a developing treatment of the above-described photoresist film formed above the above-described light-reflection layer, the above-described light-reflection layer includes a shape corresponding to a pattern shape of the above-described photoresist pattern layer and the light-reflection layer is formed in such a way as to reflect exposure light to the above-described photoresist film in conduction of the above-described exposing treatment.

According to an embodiment of the present invention, a camera includes a photoelectric conversion portion, which is disposed in a substrate, to receive light with a light-receiving surface and generate a signal charge, a metal light-shield layer disposed above the above-described substrate and in a region other than a region corresponding to the above-described light-receiving surface, a light-reflection layer disposed above the above-described metal light-shield layer, and a photoresist pattern layer disposed above the above-described light-reflection layer, wherein the above-described photoresist pattern layer is formed from a negative type photoresist film by conducting an exposing treatment and a developing treatment of the above-described photoresist film formed above the above-described light-reflection layer, the above-described light-reflection layer includes a shape corresponding to a pattern shape of the above-described photoresist pattern layer and the light-reflection layer is formed in such a way as to reflect exposure light to the above-described photoresist film in conduction of the above-described exposing treatment.

In an embodiment according to the present invention, the light-reflection layer is formed in such a way as to include a shape corresponding to a pattern shape of the photoresist pattern layer to be formed. In conduction of the exposing treatment in the forming of the photoresist pattern layer, the exposure light is reflected by the light-reflection layer to the negative type photoresist film. Consequently, the photoresist pattern layer is formed having a desired pattern after the developing treatment.

According to an embodiment of the present invention, a solid-state imaging device includes a photoelectric conversion portion, which is disposed in an imaging region of a substrate, to receive incident light with a light-receiving surface and generate a signal charge, and a color filter disposed above the above-described light-receiving surface in the imaging region of the above-described substrate and configured to color the above-described incident light and transmit to the above-described light-receiving surface, wherein the above-described color filter contains a black colorant.

According to an embodiment of the present invention, a solid-state imaging device includes a photoelectric conversion portion, which is disposed in an imaging region of a substrate, to receive incident light with a light-receiving surface and generate a signal charge, a color filter disposed in the imaging region of the above-described substrate and configured to color the above-described incident light and transmit to the above-described light-receiving surface, and a black colorant-containing layer, which is disposed in the imaging region of the above-described substrate and which contains a black colorant, wherein the above-described black colorant-containing layer is disposed above the above-described light-receiving surface and is configured to transmit the above-described incident light to the above-described light-receiving surface.

According to an embodiment of the present invention, an electronic apparatus includes a photoelectric conversion portion, which is disposed in an imaging region of a substrate, to receive incident light with a light-receiving surface and generate a signal charge, and a color filter disposed above the above-described light-receiving surface in the imaging region of the above-described substrate and configured to color the above-described incident light and transmit to the above-described light-receiving surface, wherein the above-described color filter contains a black colorant.

According to an embodiment of the present invention, an electronic apparatus includes a photoelectric conversion portion, which is disposed in an imaging region of a substrate, to receive incident light with a light-receiving surface and generate a signal charge, and a color filter disposed above the above-described light-receiving surface in the imaging region of the above-described substrate and configured to color the above-described incident light and transmit to the above-described light-receiving surface, wherein a black colorant-containing layer, which contains a black colorant, is disposed between the above-described color filter and the above-described light-receiving surface.

According to an embodiment of the present invention, a method for manufacturing a solid-state imaging device includes the steps of forming a photoelectric conversion portion, which receives incident light with a light-receiving surface and generates a signal charge, in an imaging region of a substrate, and forming a color filter, which colors the above-described incident light and transmits to the above-described light-receiving surface, above the above-described light-receiving surface in the imaging region of the above-described substrate, wherein the above-described color filter is formed in such a way as to contain a black colorant in the above-described forming of the color filter.

According to an embodiment of the present invention, a method for manufacturing a solid-state imaging device includes the steps of forming a photoelectric conversion portion, which receives incident light with a light-receiving surface and generates a signal charge, in an imaging region of a substrate, forming a color filter, which colors the above-described incident light and transmits to the above-described light-receiving surface, above the above-described light-receiving surface in the imaging region of the above-described substrate, and forming a black colorant-containing layer, which contains a black colorant, above the above-described light-receiving surface.

In the embodiments of the present invention, the layer containing the black colorant is disposed above the light-receiving surface and, thereby, the amount of the light incident on the light-receiving surface is adjusted.

According to the embodiments of the present invention, a solid-state imaging device, a camera, and methods for manufacturing them can be provided, wherein a photoresist pattern layer can be formed into a desired pattern and the image quality can be improved.

According to the embodiments of the present invention, a solid-state imaging device, an electronic apparatus, and a method for manufacturing a solid-state imaging device can be provided, wherein the image quality of the image acquired through imaging can be improved.

BRIEF DESCRIPTION OF THE DRAWINGS

FIG. 21 is a diagram showing a color filter in the fourth embodiment according to the present invention;

FIGS. 35A to 35D are magnified diagrams showing black colorant-containing layers in the fifth embodiment according to the present invention;

FIG. 41 is a diagram showing a key portion of a solid-state imaging device in a sixth embodiment according to the present invention.

DESCRIPTION OF THE PREFERRED EMBODIMENTS

The embodiments according to the present invention will be described below with reference to the drawings.

In this regard, explanations will be made in the following order.

1. First embodiment

2. Second embodiment (in the case where an exposure light absorption film is disposed)

3. Third embodiment (in the case where an OCB film is disposed directly on a light-reflection layer)

4. Other

1. First Embodiment

Configuration of Apparatus (1) Whole Configuration

Figure 5:
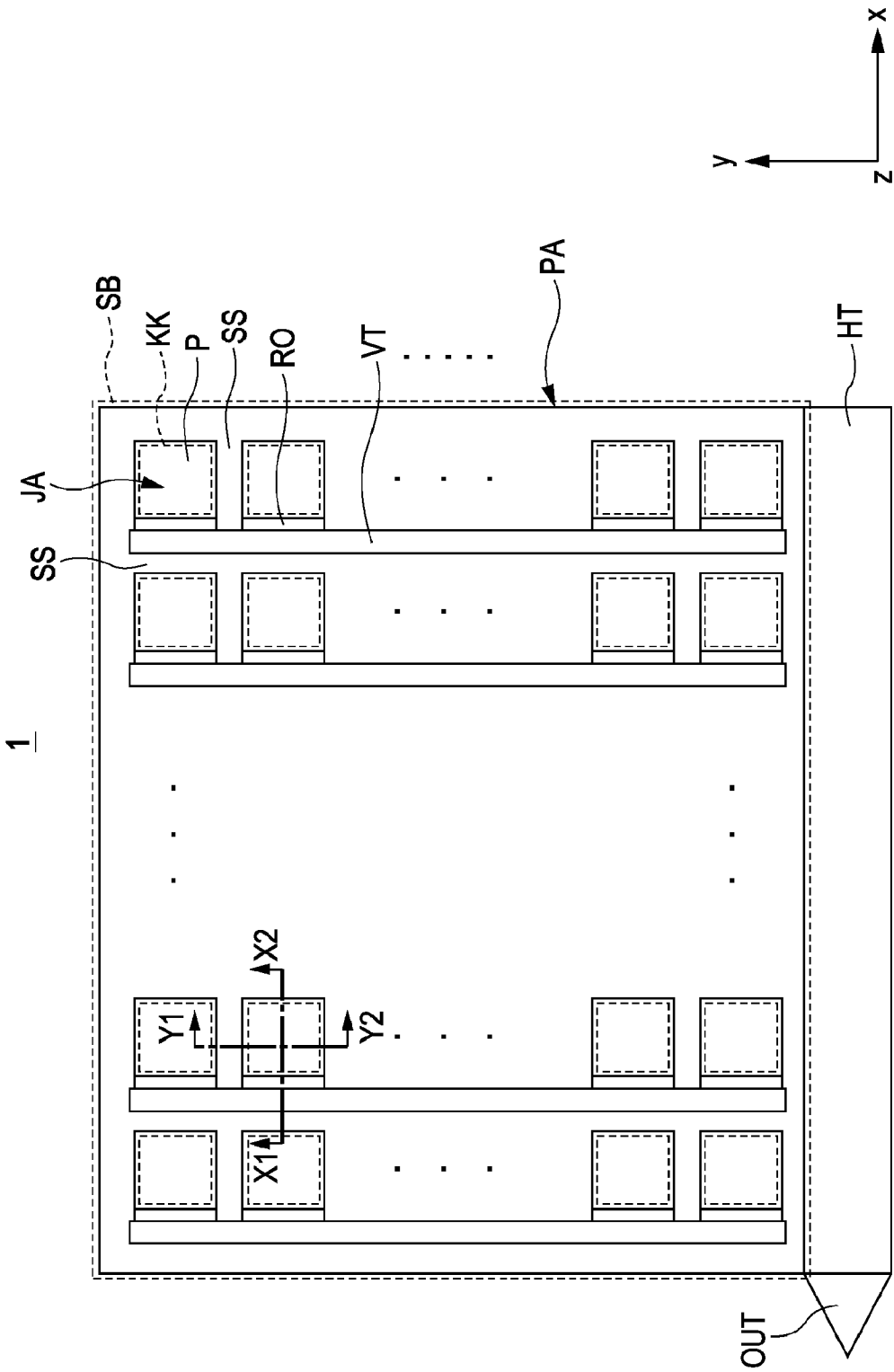
FIG. 5 is a plan view schematically showing the whole configuration of a solid-state imaging device in a first embodiment according to the present invention.

FIG. 5 is a plan view schematically showing the whole configuration of a solid-state imaging device 1 in a first embodiment according to the present invention.

Reference numerals 1, 1b, and 1c denote a solid-state imaging device, reference numeral 21 denotes a photodiode, reference numeral 22 denotes a charge readout channel region, reference numeral 23 denotes a charge transfer channel region, reference numeral 24 denotes a channel stopper region, reference numeral 31 denotes a first transfer electrode, reference numeral 32 denotes a second transfer electrode, reference numeral 41 denotes a metal light-shield layer, reference numeral 42 denotes a light-reflection layer, reference numeral 43 denotes an OCB film, reference numeral 45 denotes an intralayer lens, reference numeral 51 denotes an exposure light absorption film, reference numeral 151 denotes a color filter, reference numerals 151B and 151Bc denote a blue filter layer, reference numerals 151G and 151Gc denote a green filter layer, reference numeral 151K denotes a black colorant-containing layer, reference numerals 151R and 151Rb denote a red filter layer, reference numeral 61 denotes a microlens, reference numeral 101 denotes a substrate, reference numeral 200 denotes a camera, reference numeral 201 denotes an optical system, reference numeral 202 denotes an infrared cut filter, reference numeral 203 denotes a drive circuit, reference numeral 204 denotes a signal processing circuit, reference numeral FT denotes a flattening film, reference numeral Gx denotes a gate insulating film, reference numeral H denotes exposure light, reference numeral HT denotes a horizontal transfer resistor portion, reference numeral JA denotes a light-receiving region, reference numeral JS denotes a light-receiving surface, reference numeral KK denotes an opening, reference numeral OUT denotes an output portion, reference numeral P denotes a photoelectric conversion portion, reference numeral PA denotes an imaging region, reference numeral PM denotes a photomask, reference numeral PR denotes a photoresist film, reference numeral RO denotes a charge readout portion, reference numeral SB denotes a light-shield portion, reference numeral SS denotes an element isolation portion, reference numeral VT denotes a vertical transfer resistor portion, reference numeral HT1 denotes a flattening film, reference numeral HT2 denotes a flattening film, and reference numeral Sz denotes an insulating film.

As shown in FIG. 5, the solid-state imaging device 1 is, for example, a CCD type image sensor of an interline system, and imaging is conducted in the imaging region PA.

As shown in FIG. 5, the photoelectric conversion portion P, the charge readout portion RO, and the vertical transfer resistor portion VT are disposed in this imaging region PA.

As shown in FIG. 5, a plurality of photoelectric conversion portions P are disposed in the imaging region PA and are arranged in the matrix in a horizontal direction x and a vertical direction y. Furthermore, the element isolation portion SS is disposed around the plurality of photoelectric conversion portions P in such a way as to isolate the individual photoelectric conversion portions P from each other. Moreover, in the light-receiving region JA, the photoelectric conversion portion P is configured to receive light from a subject image and generate a signal charge through photoelectrical conversion.

As shown in FIG. 5, in the imaging region PA, a plurality of charge readout portions RO are disposed in such a way as to correspond to the plurality of photoelectric conversion portions P and are configured to read the signal charges generated by the photoelectric conversion portions P to the vertical transfer resistor portions VT.

As shown in FIG. 5, in the imaging region PA, the vertical transfer resistor portion VT extends in the vertical direction y in such a way as to correspond to the plurality of photoelectric conversion portions P arranged in the vertical direction y. Furthermore, the vertical transfer resistor portion VT is disposed between lines, in which the plurality of photoelectric conversion portions P are arranged in the vertical direction y. A plurality of vertical transfer resistor portions VT are disposed in the imaging region PA, and a plurality of vertical transfer resistor portions VT are arranged in the horizontal direction x in such a way as to correspond to each of the plurality of photoelectric conversion portions P arranged in the horizontal direction x. The vertical transfer resistor portion VT is a so-called vertical transfer CCD and transfers signal charges sequentially in the vertical direction y, while the signal charges are read from the photoelectric conversion portions P through the charge readout portion RO. Although a detailed explanation will be provided later, in the vertical transfer resistor portion VT, a plurality of transfer electrodes (not shown in the drawing) are disposed aligning in the vertical direction y, and the transfer of this signal charge is performed by, for example, supplying four-phase drive pulse signals sequentially to the transfer electrodes aligned in the vertical direction.

As shown in FIG. 5, in the imaging region PA, the light-shield portion SB is disposed in such a way as to cover all over the imaging region PA. However, openings KK are disposed at portions corresponding to the light-receiving regions JA of the photoelectric conversion portions P. In this regard, the light-shield portion SB is indicated by using a broken line in FIG. 5 for purposes of illustration.

Then, as shown in FIG. 5, at the lower end of the imaging region PA, the horizontal transfer resistor portion HT is disposed. This horizontal transfer resistor portion HT extends in the horizontal direction x and transfers sequentially the signal charges transferred in the vertical direction y by each of the plurality of vertical transfer resistor portions VT in the horizontal direction x. That is, the horizontal transfer resistor portion HT is a so-called horizontal transfer CCD and is driven by, for example, a two-phase drive pulse signal, so as to perform transfer of the signal charges transferred on one horizontal line (one line of pixels) basis.

Moreover, as shown in FIG. 5, the output portion OUT is disposed at the left end portion of the horizontal transfer resistor portion HT. This output portion OUT converts the signal charge transferred horizontally by the horizontal transfer resistor portion HT to a voltage and outputs as an analog image signal.

(2) Detailed Configuration

The detailed configuration of the above-described solid-state imaging device 1 will be described.

Figure 6:
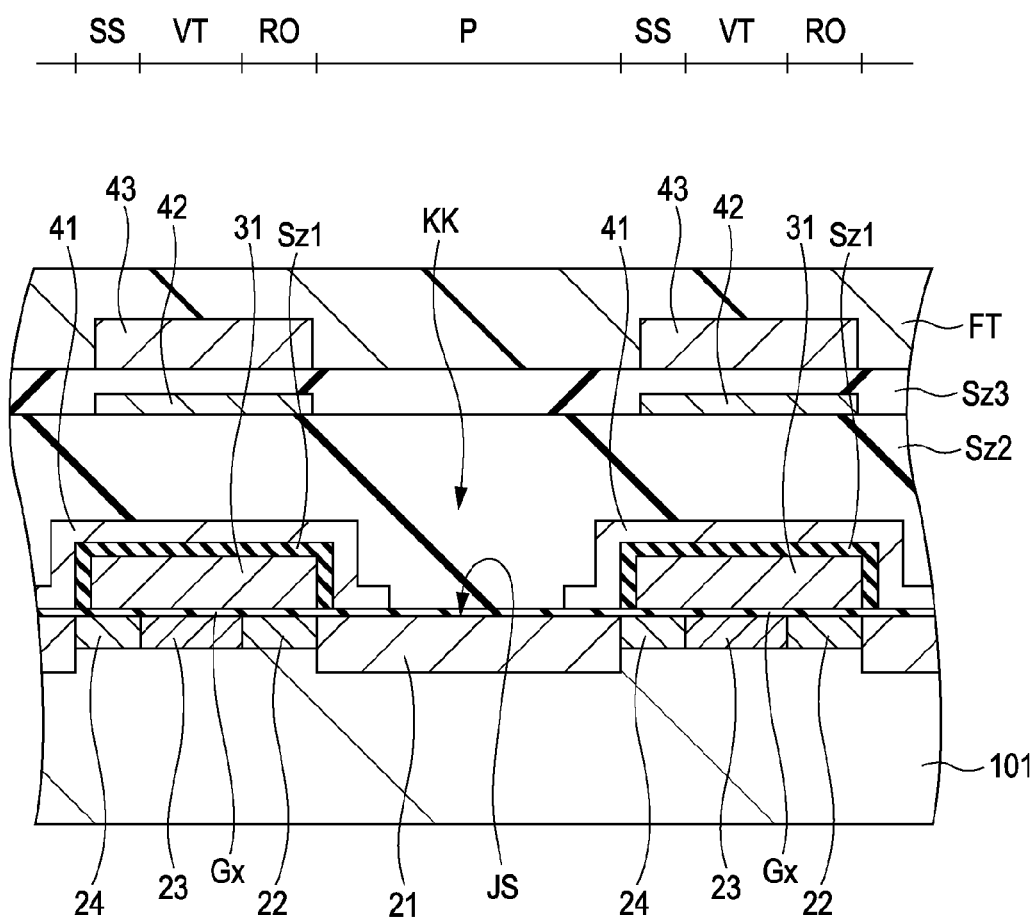
FIG. 6 is a diagram showing a key portion of a solid-state imaging device in the first embodiment according to the present invention.
Figure 7:
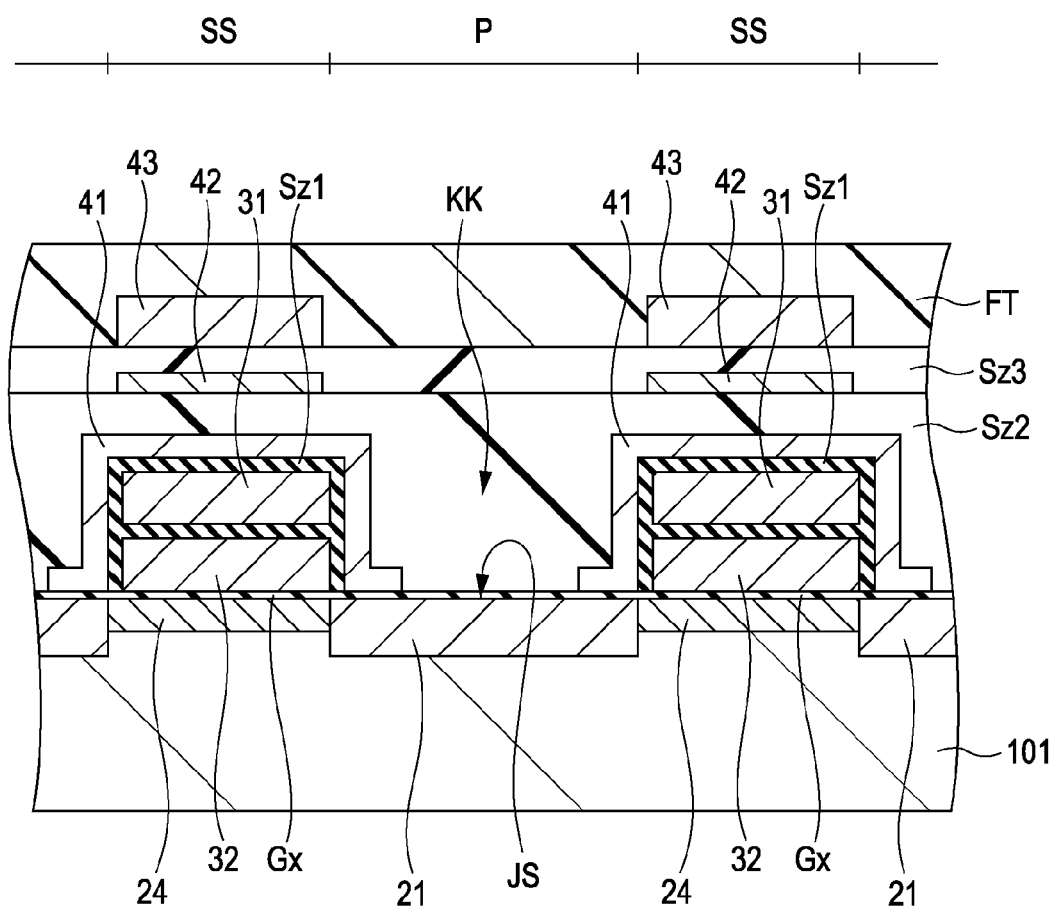
FIG. 7 is a diagram showing a key portion of a solid-state imaging device in the first embodiment according to the present invention.

FIG. 6 and FIG. 7 are diagrams showing key portions of the solid-state imaging device 1 in the first embodiment according to the present invention. Here, each of FIG. 6 and FIG. 7 shows a cross-section of the key portion. FIG. 6 shows the section taken along a line X1-X2 shown in FIG. 5 under magnification. FIG. 7 shows the section taken along a line Y1-Y2 shown in FIG. 5 under magnification.

As shown in FIG. 6 and FIG. 7, the solid-state imaging device 1 includes the substrate 101. The substrate 101 is, for example, an n-type silicon semiconductor substrate. In the inside of the substrate 101, the photodiode 21, the charge readout channel region 22, the charge transfer channel region 23, and the channel stopper region 24 are disposed.

Then, as shown in FIG. 6 and FIG. 7, the first transfer electrode 31, the second transfer electrode 32, the metal light-shield layer 41, the light-reflection layer 42, and the OCB film 43 are disposed on the surface of the substrate 101.

The individual portions constituting the solid-state imaging device 1 will be described sequentially.

As shown in FIG. 6 and FIG. 7, the photodiode 21 is disposed in the substrate 101 in such a way as to correspond to the photoelectric conversion portion P. As shown in FIG. 6 and FIG. 7, this photodiode 21 is configured to receive light with the light-receiving surface JS and generate a signal charge through photoelectric conversion.

Specifically, the photodiode 21 is disposed in a part located on the surface side in the inside of the substrate 101. Although not shown in the drawing, the photodiode 21 is formed by, for example, forming an n-type semiconductor region (n) (not shown in the drawing) and a p-type semiconductor region (p+) (not shown in the drawing) sequentially on a p-type semiconductor well region (p) (not shown in the drawing) disposed in the substrate 101.

Here, the n-type semiconductor region (n) functions as a signal charge accumulation region. Then, the p-type semiconductor region (p+) functions as a hole accumulation region and is configured to suppress an occurrence of a dark current in the n-type semiconductor region (n) serving as the signal charge accumulation region.

Furthermore, a flattening film FT is disposed on the photodiode 21 with interlayer insulating films Sz2 and Sz3 therebetween. Although not shown in the drawing, a color filter (not shown in the drawing) and a microlens (not shown in the drawing) are disposed on the flattening film FT. Consequently, the photodiode 21 receives the light incident through the microlens (not shown in the drawing) and the color filter (not shown in the drawing) sequentially with the light-receiving surface JS.

As shown in FIG. 6, the charge readout channel region 22 is disposed in such a way as to correspond to the charge readout portion RO and is configured to read the signal charge generated in the photodiode 21.

Specifically, as shown in FIG. 6, the charge readout channel region 22 is disposed in a part located on the surface side in the inside of the substrate 101 in such a way as to adjoin the photodiode 21.

Here, the charge readout channel region 22 is disposed on the left of the photodiode 21 in the horizontal direction x. For example, the charge readout channel region 22 is configured to serve as a p-type semiconductor region.

As shown in FIG. 6, the charge transfer channel region 23 is disposed in such a way as to correspond to the vertical transfer resistor portion VT. The charge transfer channel region 23 is configured to transfer the signal charge read by the charge readout portion RO from the photodiode 21.

Specifically, as shown in FIG. 6, the charge transfer channel region 23 is disposed in a part located on the surface side in the inside of the substrate 101 in such a way as to adjoin the charge readout channel region 22.

Here, the charge transfer channel region 23 is disposed on the left of the charge readout channel region 22 in the horizontal direction x. For example, the charge transfer channel region 23 is formed by disposing an n-type semiconductor region (n) (not shown in the drawing) on the p-type semiconductor well region (p) (not shown in the drawing) in the inside of the substrate 101.

As shown in FIG. 6 and FIG. 7, the channel stopper region 24 is disposed in such a way as to correspond to the element isolation portion SS.

Specifically, as shown in FIG. 6 and FIG. 7, the channel stopper region 24 is disposed in a part located on the surface side in the inside of the substrate 101.

Here, as shown in FIG. 6, in the horizontal direction x, the channel stopper region 24 is disposed on the left of the charge readout channel region 22 in such a way as to be interposed between the charge readout channel region 22 and the photodiode 21 disposed in the adjacent line. Then, in the vertical direction y, as shown in FIG. 7, the channel stopper region 24 is disposed between two photodiodes 21 aligned in the vertical direction y.

For example, the channel stopper region 24 is formed by disposing a p-type semiconductor region (p+) (not shown in the drawing) on the p-type semiconductor well region (p) (not shown in the drawing) in the inside of the substrate 101 and forms a potential barrier so as to prevent an outflow and an inflow of signal charge.

As shown in FIG. 6 and FIG. 7, the first transfer electrode 31 and the second transfer electrode 32 are disposed on the surface of the substrate 101 in such a way as to oppose to each other with the gate insulating film Gx therebetween. Each of the first transfer electrode 31 and the second transfer electrode 32 is formed from an electrically conductive material. For example, each of the first transfer electrode 31 and the second transfer electrode 32 is formed from an electrically conductive material, e.g., polysilicon, and is disposed on, for example, the gate insulating film Gx formed from a silicon oxide film.

Although not shown in the drawing, each of the first transfer electrode 31 and the second transfer electrode 32 includes a portion extending in the x direction on the upper surface of the substrate 101, and a plurality of them are disposed aligning alternately in the vertical direction y.

Here, as shown in FIG. 6, for example, merely the first transfer electrode 31 is disposed between the pixels aligned in the x direction. Then, as shown in FIG. 7, between the pixels aligned in the y direction, for example, the first transfer electrode 31 is disposed in such a way as to be laminated on the second transfer electrode 32 with an insulating film Sz1 therebetween.

As shown in FIG. 6, the metal light-shield layer 41 is disposed on the surface of the substrate 101 and above the charge readout channel region 22 and the charge transfer channel region 23, so as to block the light incident on the charge readout channel region 22 and the charge transfer channel region 23. Furthermore, as shown in FIG. 6 and FIG. 7, the metal light-shield layer 41 is disposed in such a way as to cover at least one of the first transfer electrode 31 and the second transfer electrode 32.

Here, the metal light-shield layer 41 is disposed above the substrate 101 and in a region other than a region corresponding to the light-receiving surface JS. Every metal light-shield layer 41 is formed from a light-shield material, which blocks the light. For example, the metal light-shield layer 41 is formed by using a metal material, e.g., tungsten or aluminum.

In this regard, the metal light-shield layer 41 constitutes the light-shield portion SB shown in FIG. 5.

As shown in FIG. 6 and FIG. 7, the light-reflection layer 42 is disposed on the surface of the substrate 101 and above the metal light-shield layer 41. This light-reflection layer 42 is disposed in such a way as to correspond to the pattern shape of the OCB film 43.

Although a detailed explanation will be provided later, the light-reflection layer 42 is formed in such a way as to reflect exposure light to the photoresist film in conduction of the exposing treatment, in which a negative type photoresist film (not shown in the drawing) containing a black colorant is patterned into the OCB film 43. For example, the metal light-shield layer 41 is formed by using a metal material, e.g., tungsten or aluminum.

The OCB film 43 is a black color resist pattern layer and is disposed above the light-reflection layer 42, as shown in FIG. 6 and FIG. 7.

Although a detailed explanation will be provided later, this OCB film 43 is formed by conducting an exposing treatment and a developing treatment of a negative type photoresist film (not shown in the drawing) formed above the light-reflection layer 42.

(3) Camera

Figure 8:
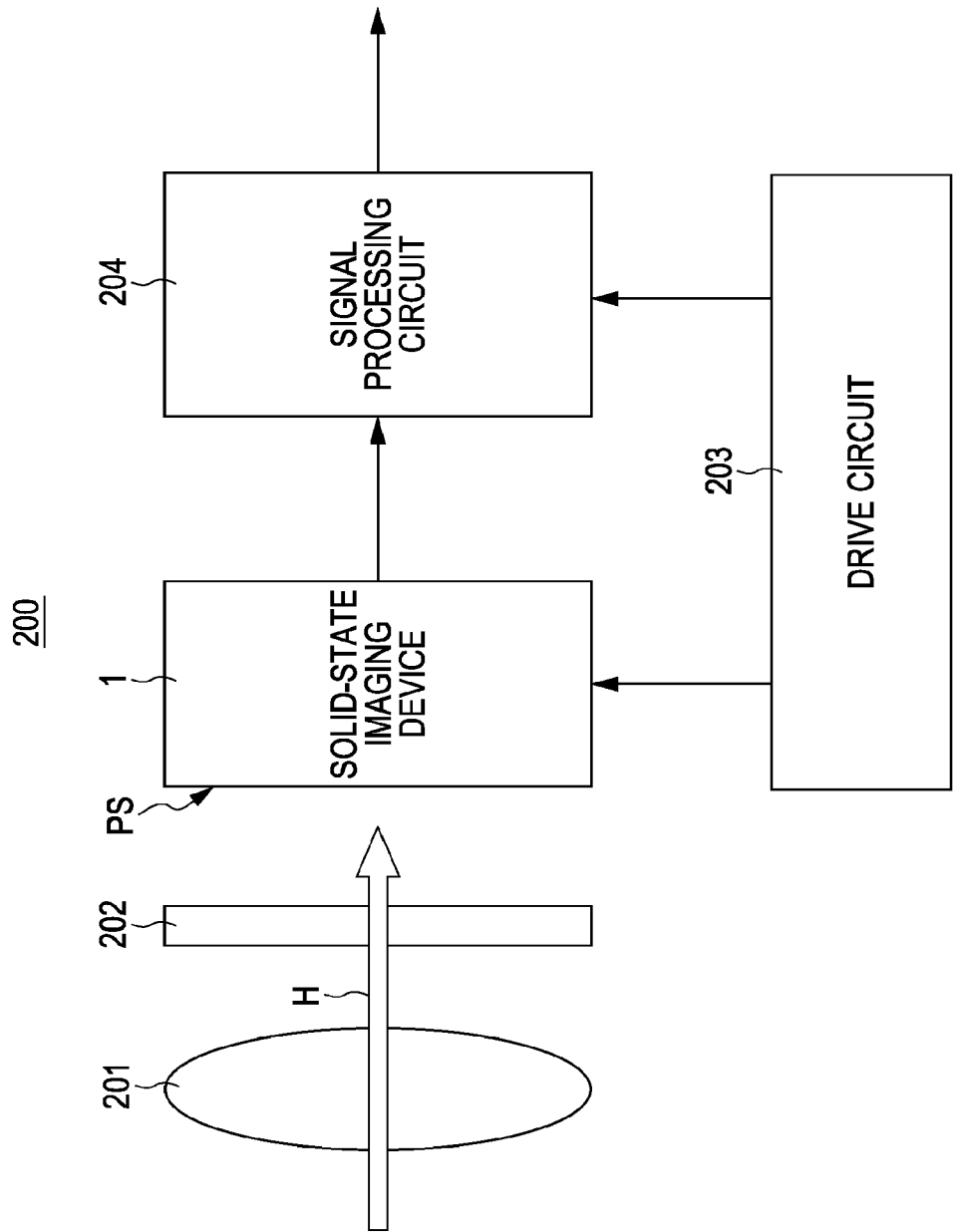
FIG. 8 is a configuration diagram showing the configuration of a camera in first and fourth embodiments according to the present invention.

FIG. 8 is a configuration diagram showing the configuration of a camera 200 in the first embodiment according to the present invention.

As shown in FIG. 8, the camera 200 includes the above-described solid-state imaging device 1 and, in addition, has an optical system 201, a drive circuit 203, and a signal processing circuit 204.

The optical system 201 includes, for example, an optical lens and forms an image of a subject image on an imaging surface of the solid-state imaging device 1.

The drive circuit 203 outputs various drive signals to the solid-state imaging device 1 and the signal processing circuit 204 and drives each of the solid-state imaging device 1 and the signal processing circuit 204.

The signal processing circuit 204 conducts signal processing of raw data output from the solid-state imaging device 1 and, thereby, produce a digital image of the subject image.

Manufacturing Method

A method for manufacturing the above-described solid-state imaging device 1 will be described below.

FIG. 9 to FIG. 14 are diagrams showing key portions formed by the individual steps of the method for manufacturing the solid-state imaging device 1 in the first embodiment according to the present invention.

Figure 9:
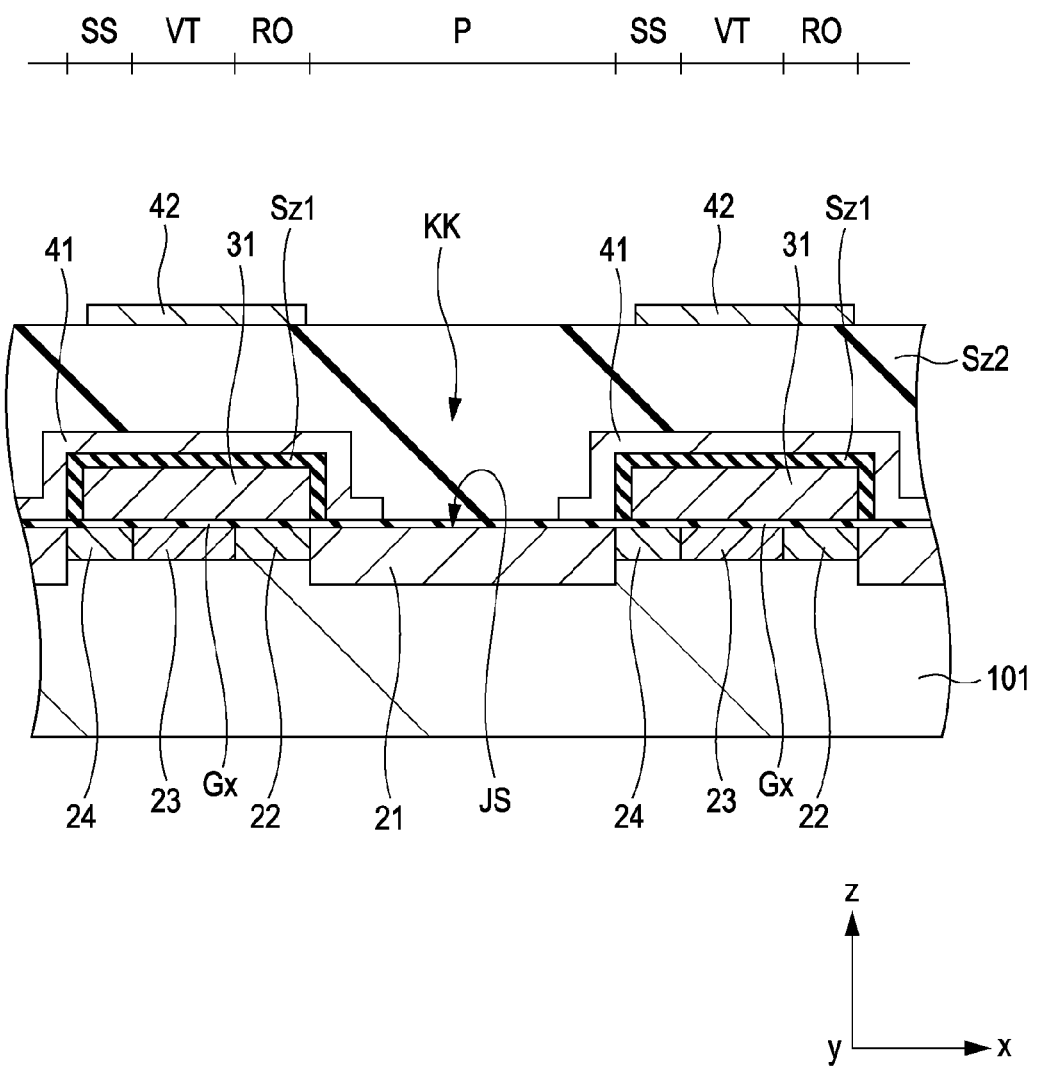
FIG. 9 is a diagram showing a key portion formed by a step of a method for manufacturing a solid-state imaging device in the first embodiment according to the present invention.
Figure 10:
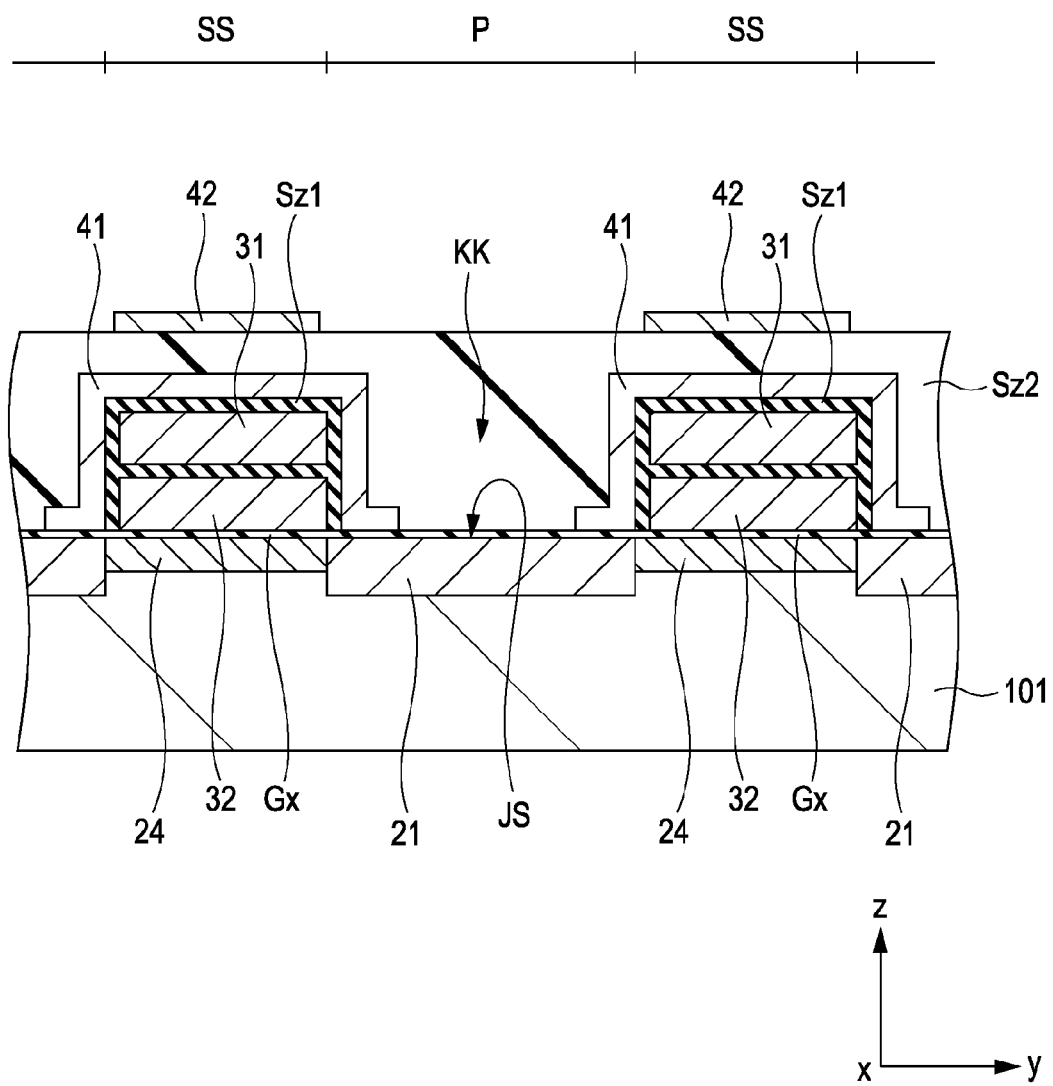
FIG. 10 is a diagram showing a key portion formed by a step of a method for manufacturing a solid-state imaging device in the first embodiment according to the present invention.
Figure 11:
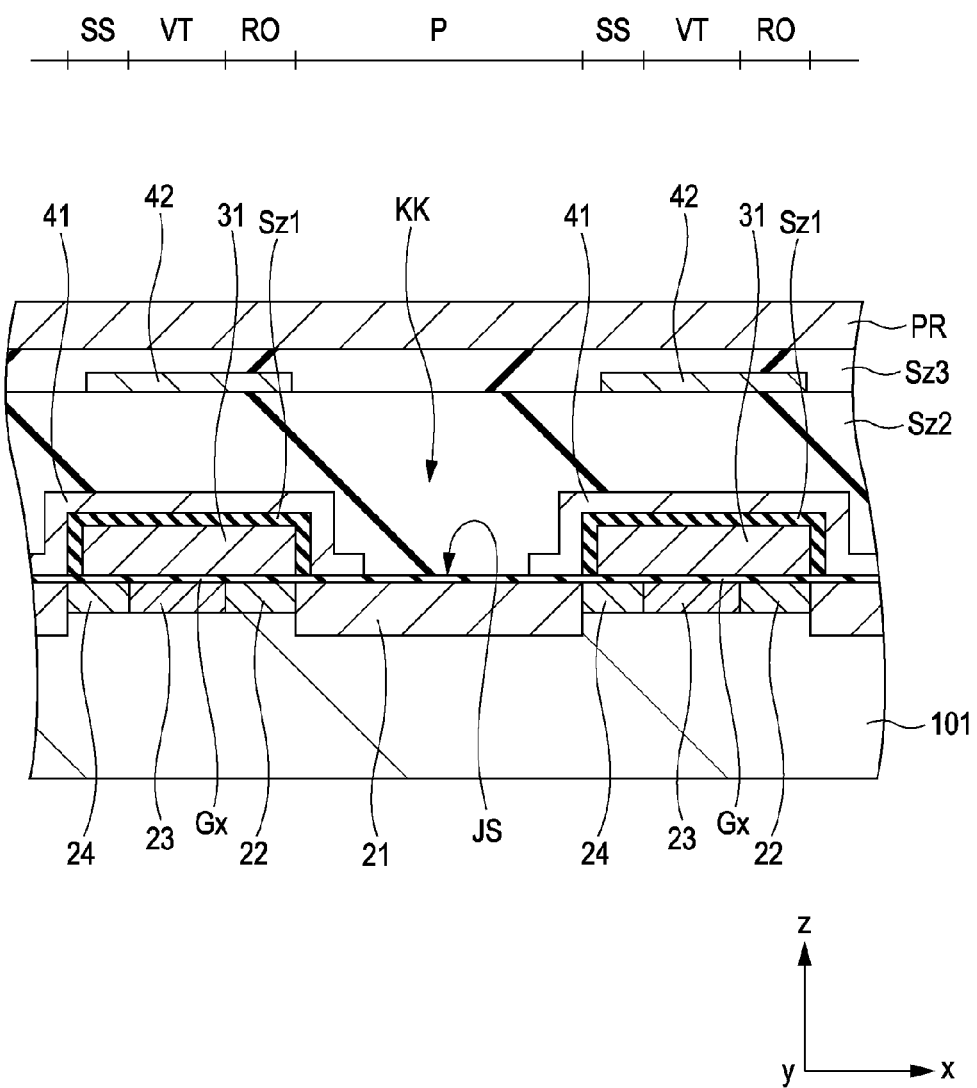
FIG. 11 is a diagram showing a key portion formed by a step of a method for manufacturing a solid-state imaging device in the first embodiment according to the present invention.
Figure 12:
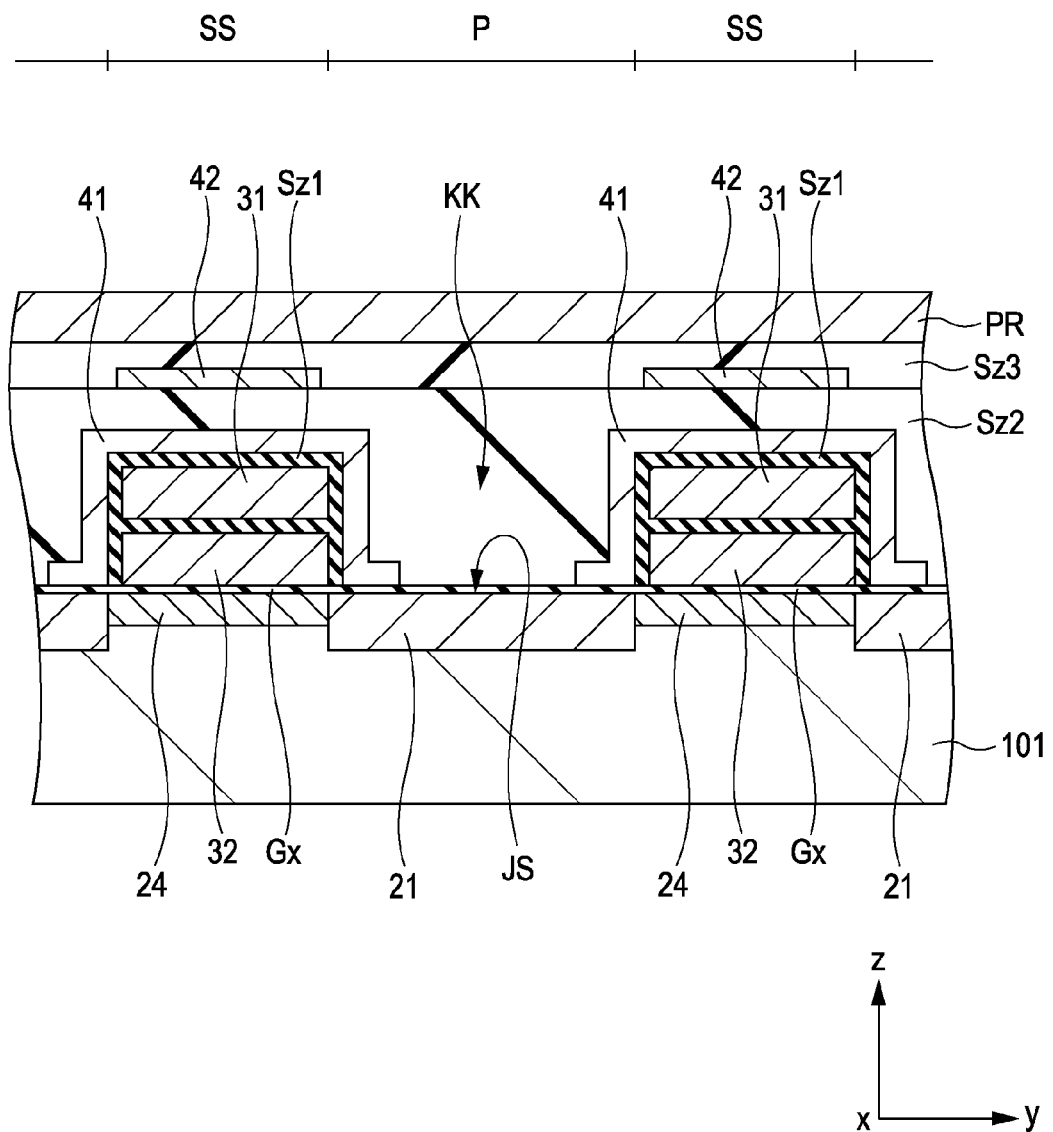
FIG. 12 is a diagram showing a key portion formed by a step of a method for manufacturing a solid-state imaging device in the first embodiment according to the present invention.
Figure 13:
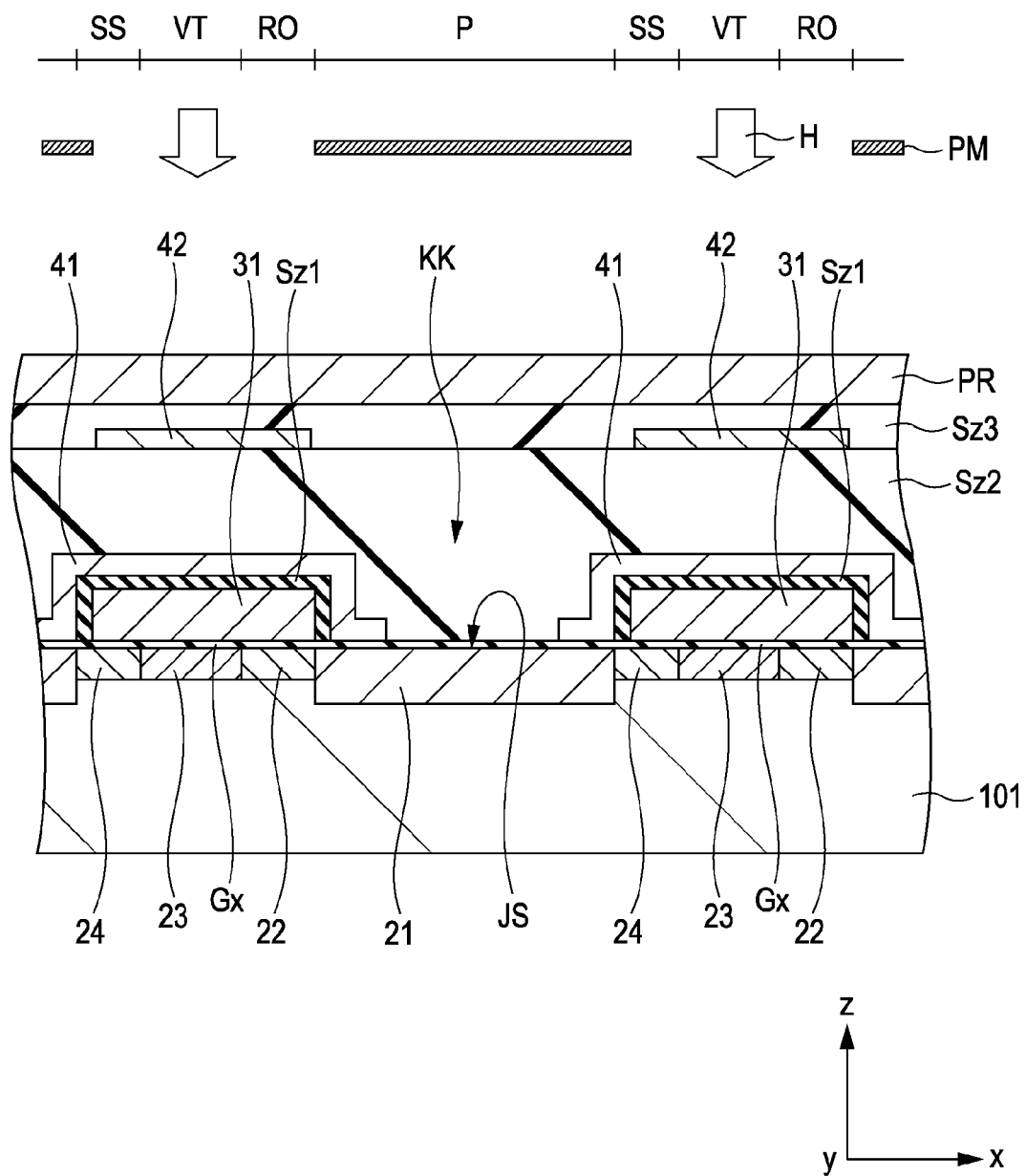
FIG. 13 is a diagram showing a key portion formed by a step of a method for manufacturing a solid-state imaging device in the first embodiment according to the present invention.
Figure 14:
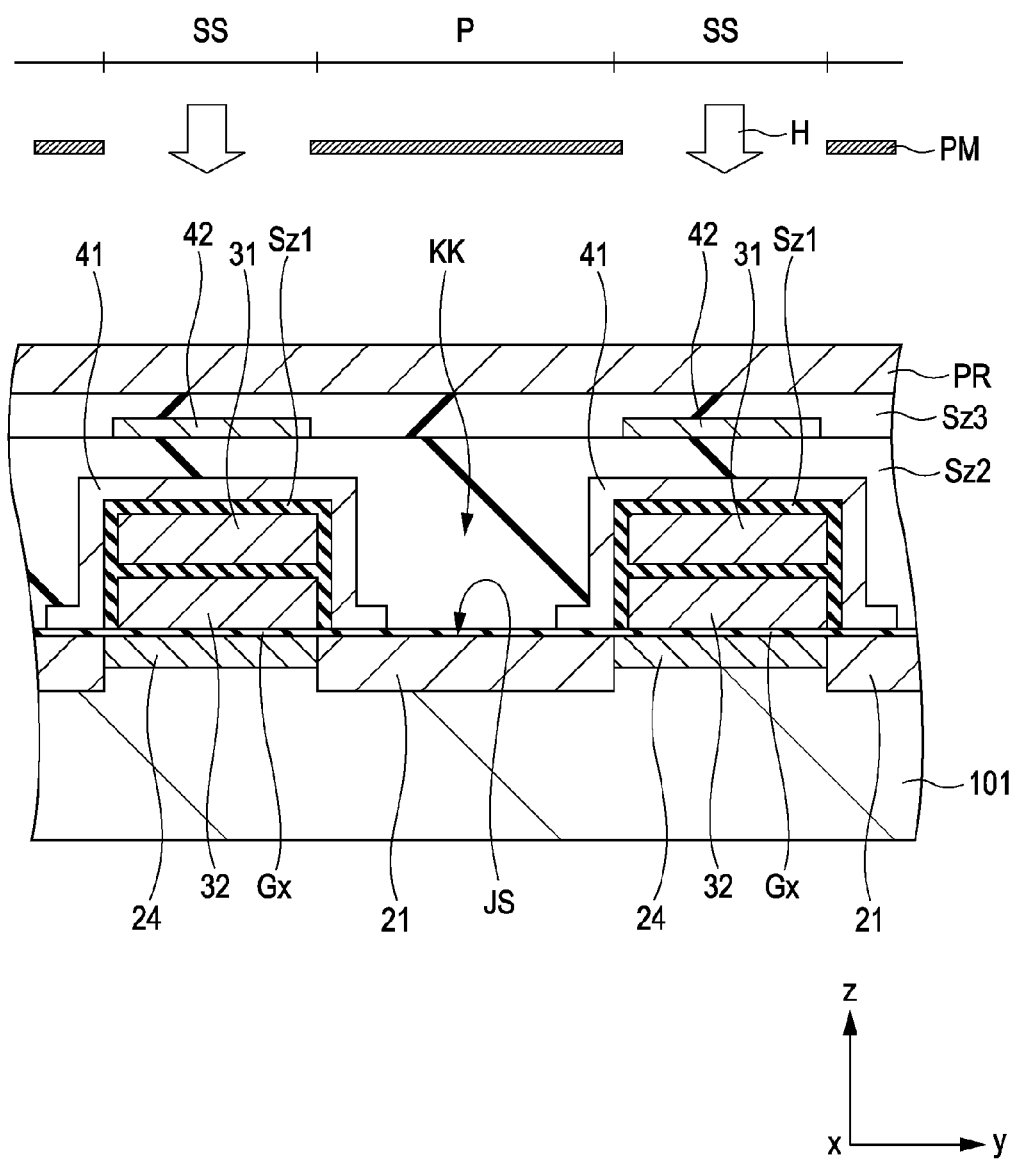
FIG. 14 is a diagram showing a key portion formed by a step of a method for manufacturing a solid-state imaging device in the first embodiment according to the present invention.

Here, FIG. 9, FIG. 11, and FIG. 13 are sectional views showing the section taken along the line X1-X2 shown in FIG. 5 under magnification, as in FIG. 6. FIG. 10, FIG. 12, and FIG. 14 are sectional views showing the section taken along the line Y1-Y2 shown in FIG. 5 under magnification, as in FIG. 7.

(1) Formation of Light-reflection Layer 42

Initially, the light-reflection layer 42 is formed as shown in FIG. 9 and FIG. 10.

Here, prior to formation of the light-reflection layer 42, as shown in FIG. 9 and FIG. 10, the photodiode 21, the charge readout channel region 22, the charge transfer channel region 23, and the channel stopper region 24 are formed in the substrate 101. The individual portions are formed by, for example, introducing an impurity into the substrate 101 through the use of an ion implantation method. Thereafter, the gate insulating film Gx is formed by, for example, forming a silicon oxide film all over the substrate 101 through the use of a thermal oxidation method.

Subsequently, as shown in FIG. 9 and FIG. 10, the first transfer electrode 31 and the second transfer electrode 32 are formed on the surface of the substrate 101. Specifically, the first transfer electrode 31 and the second transfer electrode 32 are formed on the surface of the substrate 101 from an electrically conductive material in such a way as to oppose to each other with the gate insulating film Gx therebetween. For example, after polysilicon films (not shown in the drawing) are formed by a CVD method, the resulting polysilicon films are patterned through photolithography, so that the first transfer electrode 31 and the second transfer electrode 32 are formed.

Then, as shown in FIG. 9 and FIG. 10, the metal light-shield layer 41 is formed on the surface of the substrate 101. Specifically, the metal light-shield layer 41 is formed above at least one of the first transfer electrode 31 and the second transfer electrode 32 and in a region other than a region corresponding to the light-receiving surface JS. For example, after a tungsten film is formed by a sputtering method, the resulting tungsten film is patterned through photolithography, so that the metal light-shield layer 41 is formed. Thereafter, an interlayer insulating film Sz2 is formed from a light-transmitting material in such a way as to cover the metal light-shield layer 41.

After the individual portions are formed as described above, as shown in FIG. 9 and FIG. 10, the light-reflection layer 42 is formed.

Here, the light-reflection layer 42 is formed on the surface of the substrate 101 in such a way as to locate above the metal light-shield layer 41.

In the present embodiment, the light-reflection layer 42 is formed in such a way as to correspond to a pattern shape of the OCB film 43 to be formed in the step following the present step. Furthermore, the light-reflection layer 42 is formed in such a way that in conduction of the exposing treatment, in which a negative type photoresist film containing a black colorant (not shown in the drawing) is patterned into the OCB film 43, in the following step, the exposure light is reflected to the photoresist film.

In the formation of the light-reflection layer 42, it is favorable that the light-reflection layer 42 is formed in such a way as to reflect non-visible light, e.g., ultraviolet rays, which is used in the above-described exposing treatment, at a proportion higher than the proportion of the visible light.

For example, after a tungsten film is formed by a sputtering method, the resulting tungsten film is patterned through photolithography, so that the light-reflection layer 42 is formed.

For example, the light-reflection layer 42 is formed in such a way that the film thickness becomes 50 nm to 200 nm.

(2) Formation of Photoresist Film PR

Next, as shown in FIG. 11 and FIG. 12, the photoresist film PR is formed.

Here, as shown in FIG. 11 and FIG. 12, the photoresist film PR is formed in such a way as to cover the surface of the interlayer insulating film Sz3, which is formed from the light-transmitting material in such a way as to cover the light-reflection layer 42.

In the present embodiment, the photoresist film PR is formed by applying a coating solution containing a black colorant and a negative type photoresist resin to the surface of the interlayer insulating film Sz3.

(3) Conduction of Exposing Treatment

Next, the exposing treatment is conducted as shown in FIG. 13 and FIG. 14.

Here, as shown in FIG. 13 and FIG. 14, the exposing treatment is conducted by using a photomask PM formed as a mask pattern in such a way that a light-transmission hole, through which the exposure light H passes, corresponds to the pattern shape of the above-described OCB film 43 (refer to FIG. 6 and FIG. 7). That is, the exposure light is applied to a portion, in which the OCB film 43 is formed, in the photoresist film PR. For example, ultraviolet rays are used as the exposure light. In this regard, in FIG. 13 and FIG. 14, portions, which block the exposure light, of the photomask PM are indicated by being diagonally shaded.

(4) Formation of OCB Film 43

Next, the OCB film 43 is formed as shown in FIG. 6 and FIG. 7.

Here, as shown in FIG. 6 and FIG. 7, the OCB film 43 is formed above the light-reflection layer 42.

Specifically, the OCB film 43 is formed from the photoresist film PR by conducting the developing treatment of the photoresist film PR subjected to the exposing treatment, as described above. That is, the OCB film 43 is formed by removing the portions, which are not irradiated with the exposure light, of the photoresist film PR through conduction of the developing treatment.

Then, after the flattening film FT is formed on the surface of the substrate 101, the other portions are formed, so that the solid-state imaging device 1 is completed.

As described above, in the present embodiment, the light-reflection layer 42 is disposed below the portion, in which the OCB film 43 is formed, of the photoresist film PR. In conduction of the above-described exposing treatment, the exposure light reflected by the metal light-shield layer 41 located below the photoresist film PR is blocked by the lower surface of the light-reflection layer 42 (refer to FIG. 13 and FIG. 14).

Figure 1:
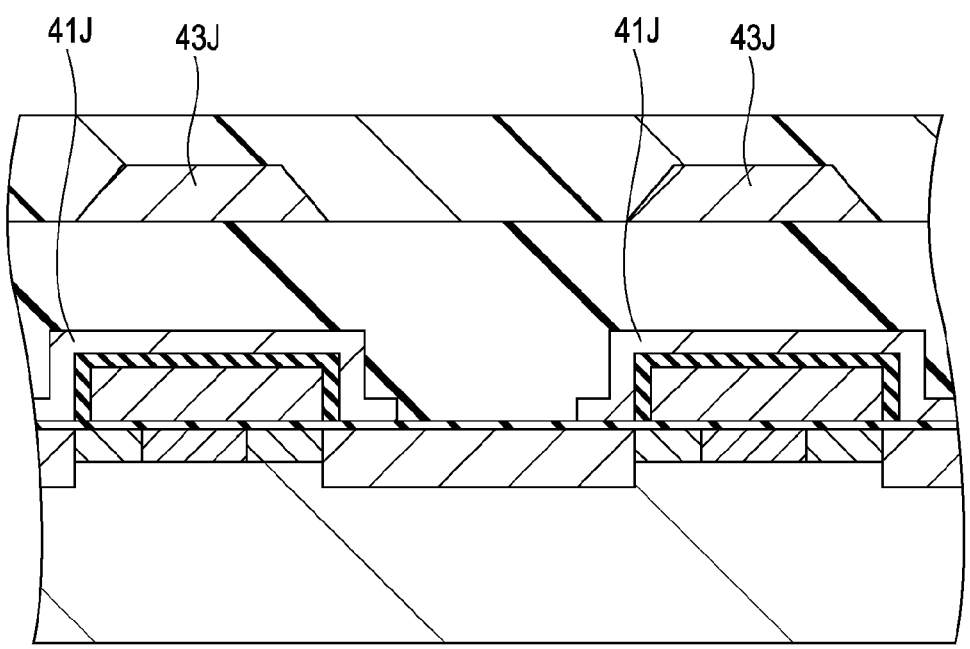
FIG. 1 is a sectional view of a key portion of a solid-state imaging device.
Figure 2:
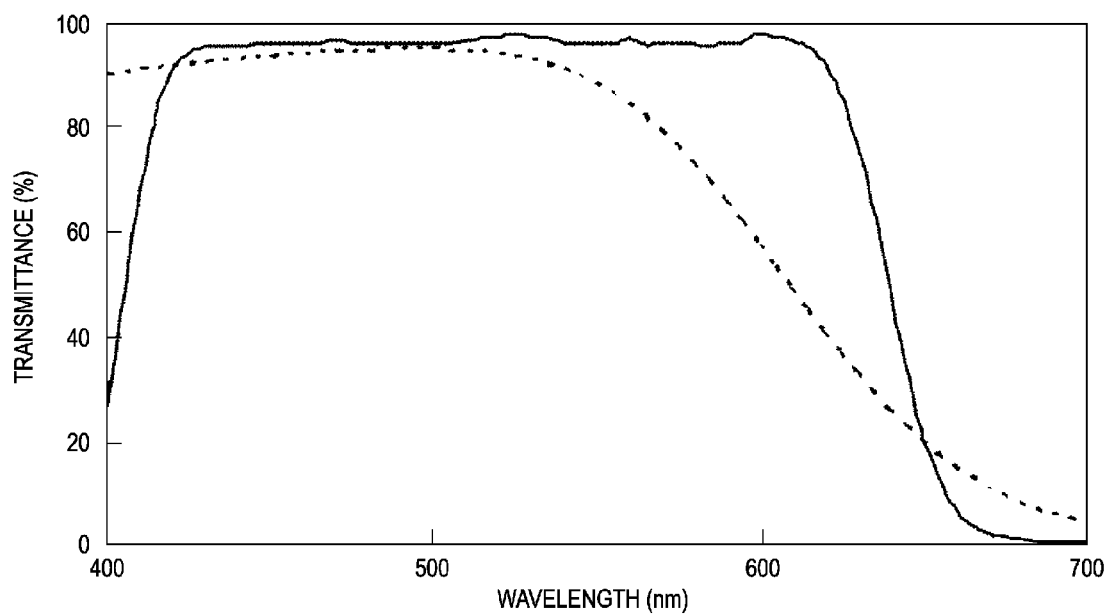
FIG. 2 is a diagram showing a spectral characteristic of an infrared cut filter.
Figure 3A:
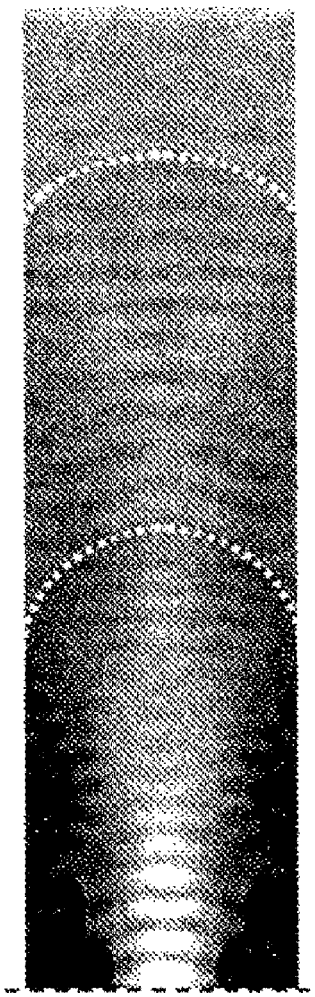
FIGS. 3A and 3B are diagrams showing the results of undulation simulation conducted with respect to the manner, in which the parallel light incident on a solid-state imaging device is transferred passing through a microlens, a color filter, and an intralayer lens.
Figure 3B:
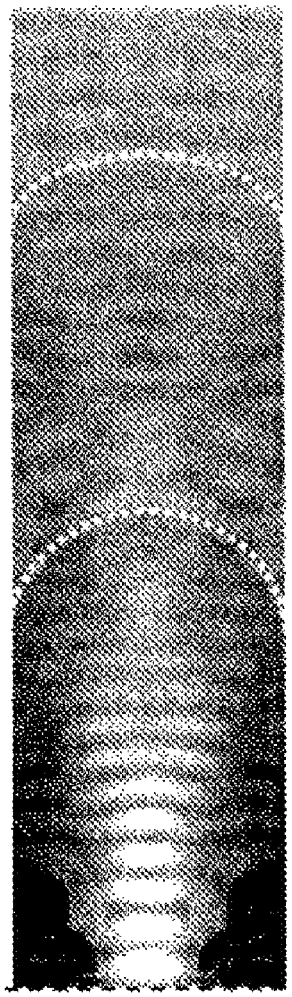
Figure 4:
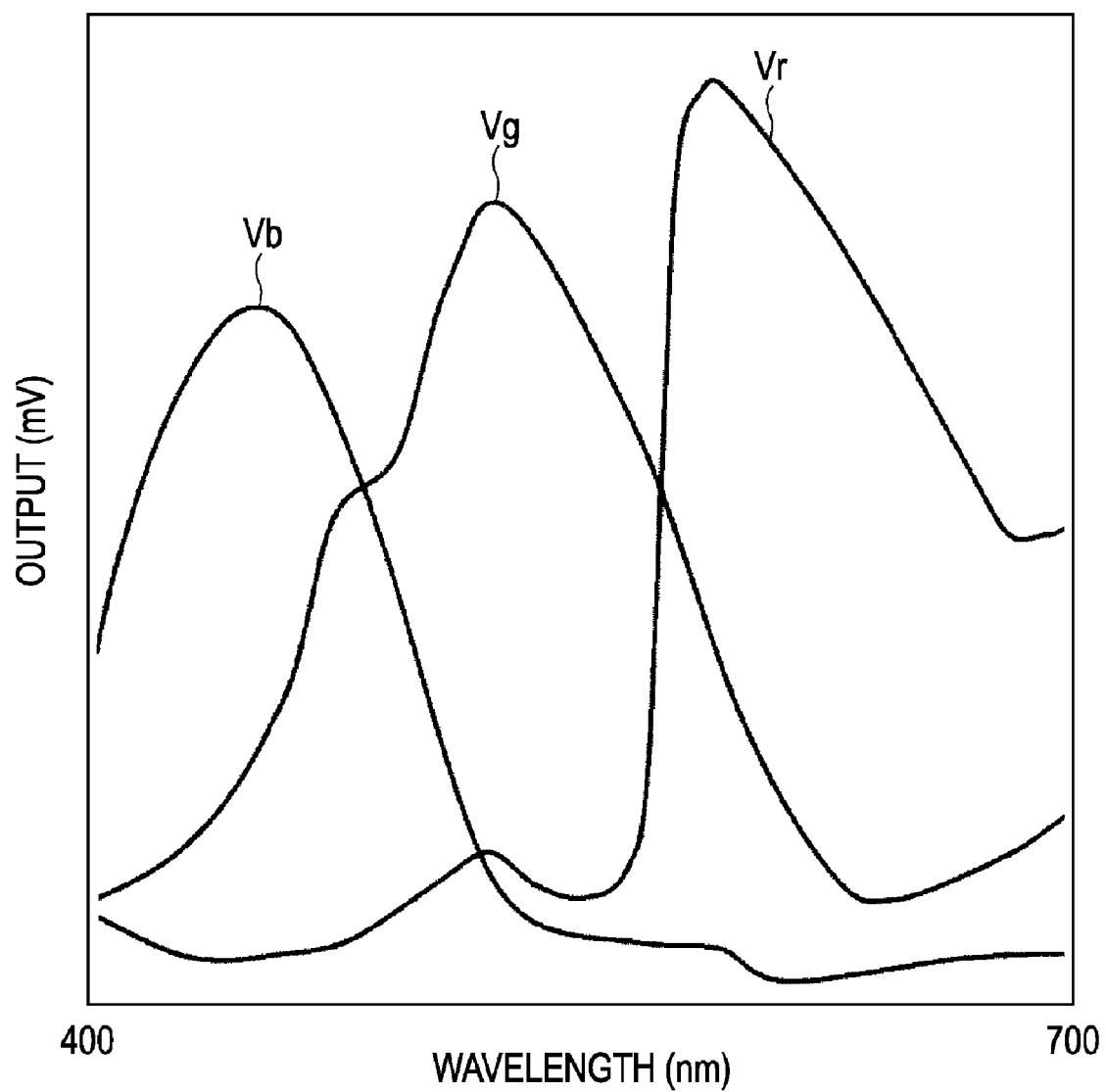
FIG. 4 is a diagram showing the spectral output of a solid-state imaging device.

Consequently, formation of the OCB film 43 into a normal taper shape as shown in FIG. 1 can be prevented.

Furthermore, in the present embodiment, the light-reflection layer 42 is formed in such a way as to correspond to the pattern shape of the OCB film 43, as described above. The exposure light incident from above the photoresist film PR is reflected by the upper surface of the light-reflection layer 42 (refer to FIG. 13 and FIG. 14).

Consequently, the amount of exposure light can be reduced and, therefore, an occurrence of problem due to reflection of the exposure light by the metal light-shield layer 41 can be suppressed.

Hence, in the present embodiment, the OCB film 43 can be formed with a pattern having a desired line width, so that an occurrence of rejection of the light incident in imaging can be prevented.

Therefore, in the present embodiment, the photoresist pattern layer, such as, the OCB film 43, can be formed into a desired pattern, so that the image quality of an image acquired through imaging can be improved.

2. Second Embodiment

Apparatus Configuration and the Like

Figure 15:
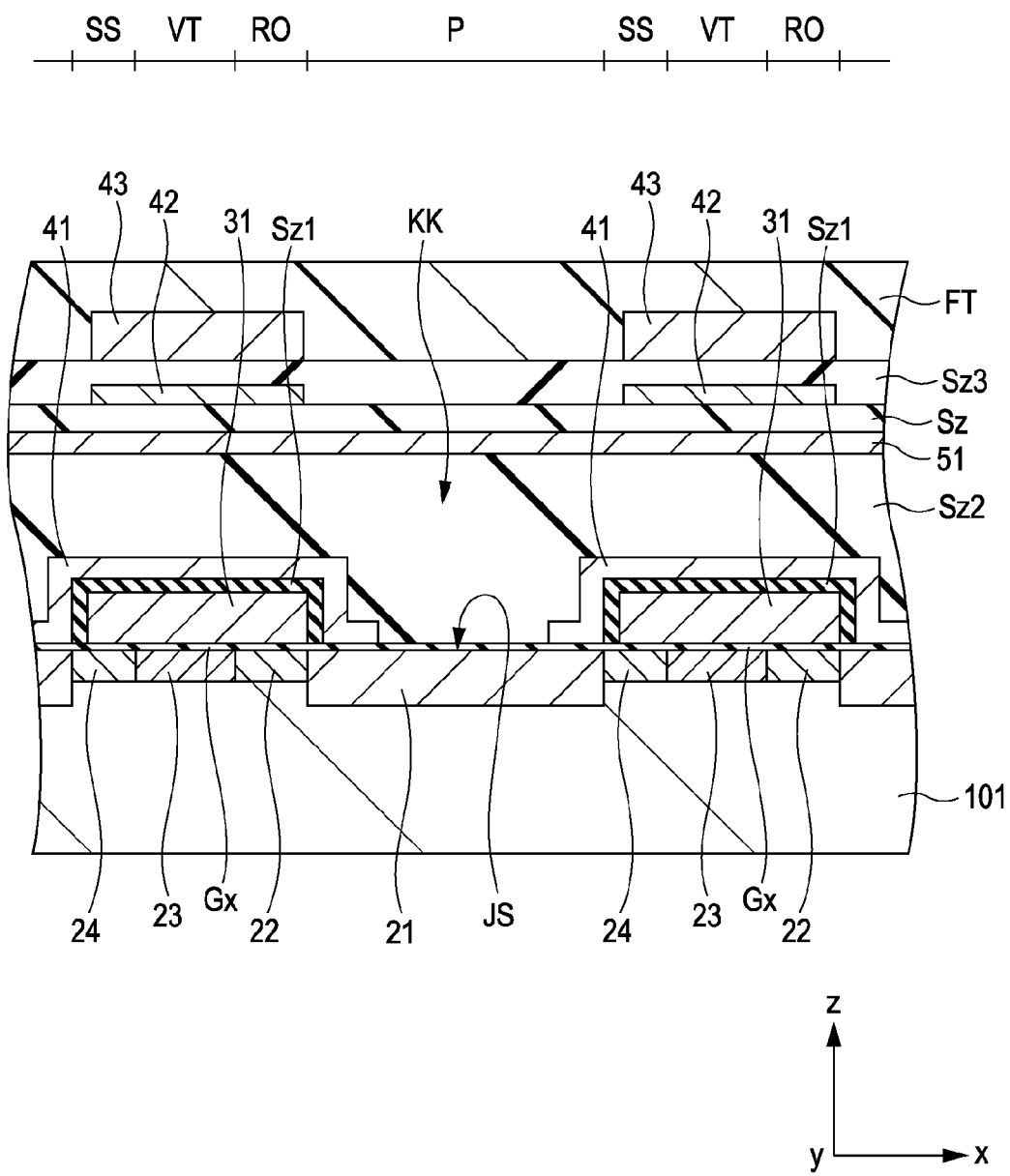
FIG. 15 is a diagram showing a key portion of a solid-state imaging device in a second embodiment according to the present invention.
Figure 16:
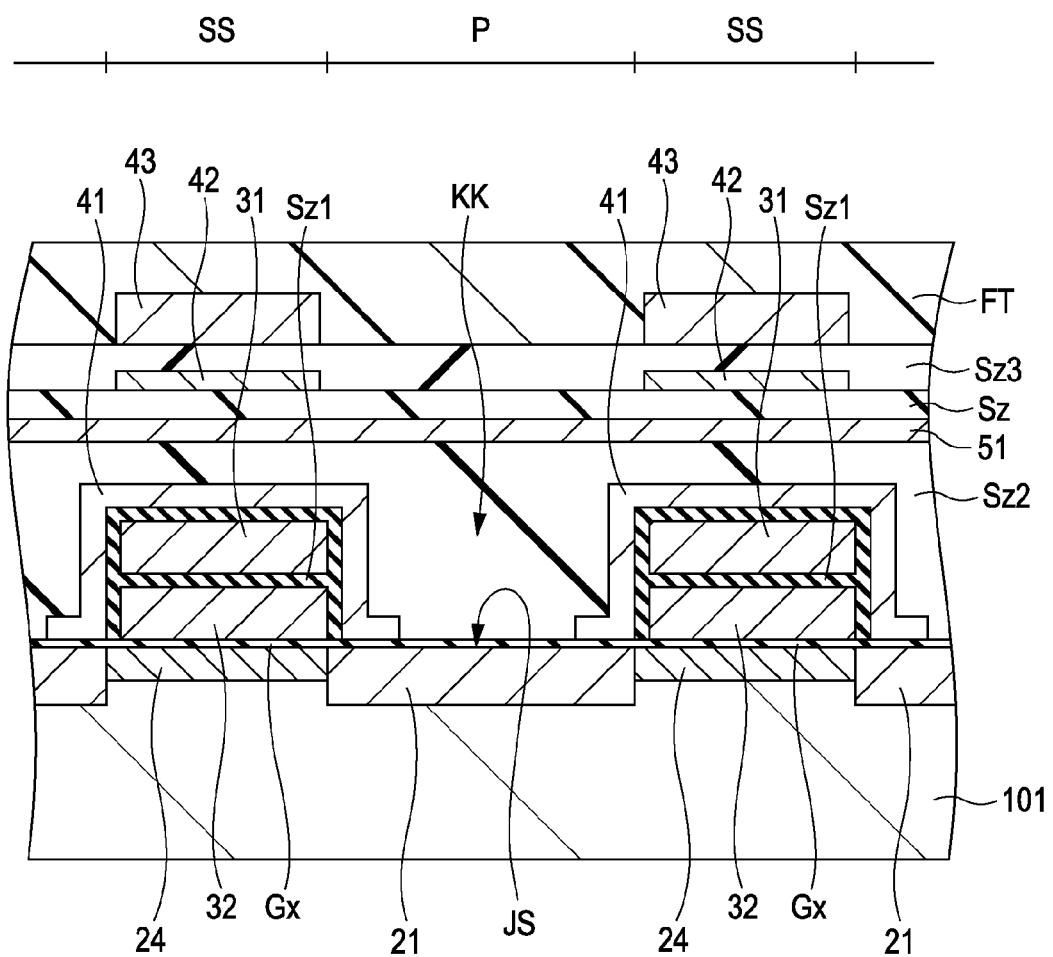
FIG. 16 is a diagram showing a key portion of a solid-state imaging device in the second embodiment according to the present invention.

FIG. 15 and FIG. 16 are diagrams showing key portions of a solid-state imaging device 1b in a second embodiment according to the present invention.

Here, each of FIG. 15 and FIG. 16 shows a cross-section of a key portion. FIG. 15 shows the section taken along a line X1-X2 shown in FIG. 5 under magnification. FIG. 16 shows the section taken along a line Y1-Y2 shown in FIG. 5 under magnification.

As shown in FIG. 15 and FIG. 16, in the present embodiment, the solid-state imaging device 1b includes an exposure light absorption layer 51. The present embodiment is the same as the first embodiment except this point and points related thereto. Therefore, descriptions of the same parts will not be provided.

As shown in FIG. 15 and FIG. 16, the exposure light absorption layer 51 is disposed above the substrate 101 in such a way as to be interposed between the metal light-shield layer 41 and the light-reflection layer 42. That is, the formation of the exposure light absorption layer 51 is conducted after the formation of the metal light-shield layer 41 is conducted and before the formation of the light-reflection layer 42 is conducted, although not shown in the drawing.

This exposure light absorption layer 51 is formed in such a way as to absorb the exposure light used in conduction of the exposing treatment in the formation of the above-described OCB film 43. For example, a polyimide film, in which TiO particles are dispersed, is formed as the exposure light absorption layer 51. In the present embodiment, the exposure light absorption layer 51 is formed in such a way as to cover the region, which corresponds to the light-receiving surface JS, above the substrate 101.

Then, the interlayer insulating film Sz is disposed in such a way as to cover the exposure light absorption layer 51, and the individual portions, e.g., the light-reflection layer 42, are disposed on the interlayer insulating film Sz in a manner similar to that in the first embodiment.

As described above, in the present embodiment, the exposure light absorption layer 51 is disposed in such a way as to be interposed between the metal light-shield layer 41 and the light-reflection layer 42. In conduction of the exposing treatment for patterning the photoresist film PR into the OCB film 43, the exposure light is absorbed by the exposure light absorption layer 51 below the photoresist film PR.

Consequently, entrance of the exposure light into the metal light-shield layer 41 side can be suppressed, so that formation of the OCB film 43 into a normal taper shape can be prevented favorably.

Therefore, in the present embodiment, the photoresist pattern layer, such as, the OCB film 43, can be formed into a desired pattern, so that the image quality of an image acquired through imaging can be improved.

3. Third Embodiment

Apparatus Configuration and the Like

Figure 17:
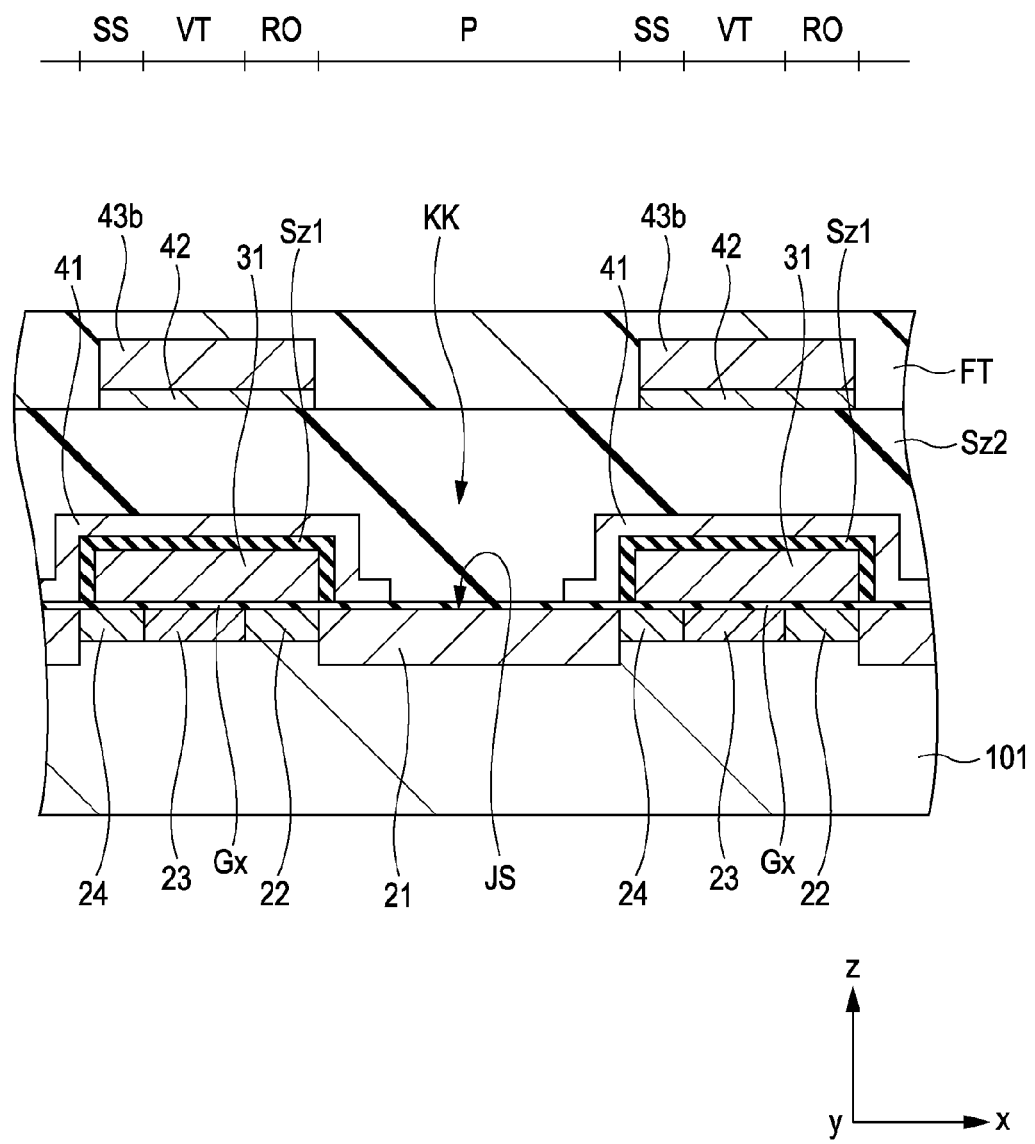
FIG. 17 is a diagram showing a key portion of a solid-state imaging device in a third embodiment according to the present invention.
Figure 18:
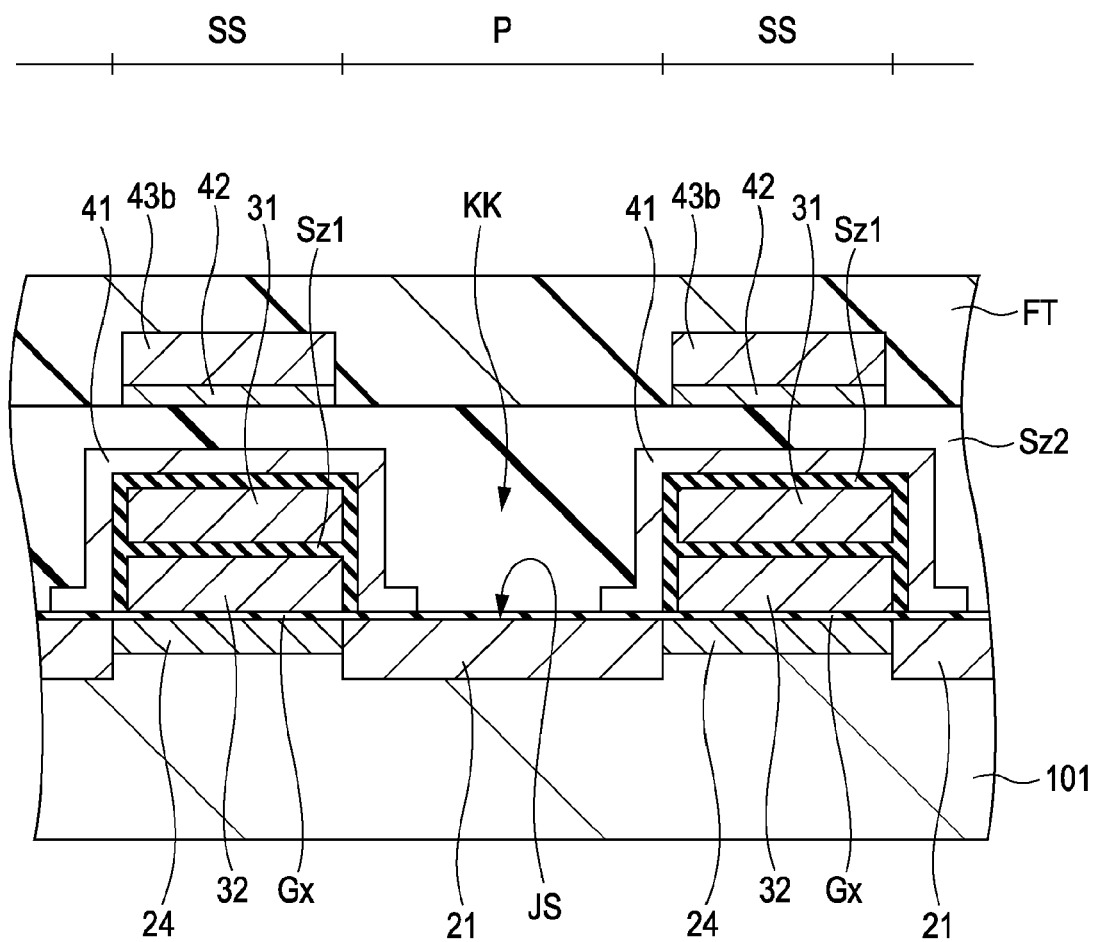
FIG. 18 is a diagram showing a key portion of a solid-state imaging device in the third embodiment according to the present invention.

FIG. 17 and FIG. 18 are diagrams showing key portions of a solid-state imaging device 1c in a third embodiment according to the present invention.

Here, each of FIG. 17 and FIG. 18 shows a cross-section of a key portion. FIG. 17 shows the section taken along a line X1-X2 shown in FIG. 5 under magnification. FIG. 18 shows the section taken along a line Y1-Y2 shown in FIG. 5 under magnification.

As shown in FIG. 17 and FIG. 18, in the present embodiment, the solid-state imaging device 1c do not includes the interlayer insulating film Sz3 between the light-reflection layer 42 and the OCB film 43. The present embodiment is the same as the first embodiment except this point and points related thereto. Therefore, descriptions of the same parts will not be provided.

As shown in FIG. 17 and FIG. 18, the OCB film 43 is disposed while being in direct contact with the upper surface of the light-reflection layer 42.

That is, although not shown in the drawing, in formation of the photoresist film (not shown in the drawing) to be patterned into the OCB film 43, a negative type photoresist film is formed in such a way as to come into direct contact with the light-reflection layer 42. Then, in a manner similar to that in the first embodiment, the exposing treatment and the developing treatment of the resulting photoresist film are conducted sequentially, so as to form the OCB film 43.

As described above, in the present invention, the OCB film 43 is disposed while being in direct contact with the upper surface of the light-reflection layer 42. The exposure light incident from above the photoresist film (not shown in the drawing) to be patterned into the OCB film 43 is reflected by the upper surface of the light-reflection layer 42 directly while no other film is interposed.

Consequently, in the present embodiment, an occurrence of a problem due to reflection of the exposure light by the metal light-shield layer 41 located at a lower position can be suppressed.

Therefore, in the present embodiment, the photoresist pattern layer, such as, the OCB film 43, can be formed into a desired pattern, so that the image quality of an image acquired through imaging can be improved.

4. Other

Execution of the present invention is not limited to the above-described embodiments, but various modified examples can be adopted.

For example, in the above-described embodiment, an application to the CCD type image sensor is explained, although not limited to this. For example, it is possible to apply to various image sensors, e.g., CMOS type image sensors.

Furthermore, in the above-described embodiment, the case where the light-reflection layer is disposed in such a way that the pattern shape of the OCB film serving as the photoresist pattern layer corresponds to the light-reflection layer almost completely has been explained, although not limited to this. For example, the individual portions may be configured to correspond partly.

Specifically, for example, in the CMOS type image sensor, a part of the "wiring" formed from a metal material, which reflects light, may be used as the "light-reflection layer" in the embodiments of the present invention.

As described above, in the image sensor, a part formed by using a light-reflecting material may also be used as the "light-reflection layer" in the embodiments of the present invention.

Moreover, in the above-described embodiment, the case where the OCB film is disposed as the photoresist pattern layer on the metal light-reflection layer has been explained, although not limited to this. The present invention can be applied to the cases where other photoresist pattern layers are disposed.

In this regard, in the above-described embodiments, the solid-state imaging devices 1, 1b, and 1c correspond to the solid-state imaging device according to the embodiments of the present invention. In the above-described embodiments, the charge readout channel region 22 corresponds to the charge readout channel region according to the embodiment of the present invention. In the above-described embodiments, the charge transfer channel region 23 corresponds to the charge transfer channel region according to the embodiment of the present invention. In the above-described embodiments, the metal light-shield layer 41 corresponds to the metal light-shield layer according to the embodiment of the present invention. In the above-described embodiments, the light-reflection layer 42 corresponds to the light-reflection layer according to the embodiment of the present invention. In the above-described embodiments, the OCB film 43 corresponds to the photoresist pattern layer according to the embodiment of the present invention. In the above-described embodiments, the exposure light absorption layer 51 corresponds to the exposure light absorption layer according to the embodiment of the present invention. In the above-described embodiments, the substrate 101 corresponds to the substrate according to the embodiment of the present invention. In the above-described embodiments, the camera 200 corresponds to the camera according to the embodiment of the present invention. In the above-described embodiments, exposure light H corresponds to the exposure light according to the embodiment of the present invention. In the above-described embodiments, the light-receiving surface JS corresponds to the light-receiving surface according to the embodiment of the present invention. In the above-described embodiments, the photoelectric conversion portion P corresponds to the photoelectric conversion portion according to the embodiment of the present invention. In the above-described embodiments, the photoresist film PR corresponds to the photoresist film according to the embodiment of the present invention. In the above-described embodiments, the charge readout portion RO corresponds to the charge readout portion according to the embodiment of the present invention. In the above-described embodiments, the vertical transfer resistor portion VT corresponds to the vertical transfer resistor portion according to the embodiment of the present invention.

The embodiments according to the present invention will be further described below with reference to the drawings.

In this regard, explanations will be made in the following order.

1. Fourth embodiment (in the case where a black colorant is contained in a red filter)

2. Fifth embodiment (in the case where a black colorant-containing layer is disposed under a red filter)

3. Sixth embodiment (in the case where a black colorant is contained in each of filters of three primary colors)

4. Other

1. First Embodiment

Configuration of Apparatus (1) Whole Configuration of Camera

FIG. 8 is a configuration diagram showing the configuration of a camera 200 in a fourth embodiment according to the present invention.

As shown in FIG. 8, the camera 200 includes a solid-state imaging device 1, an optical system 201, an infrared cut filter 202, a drive circuit 203, and a signal processing circuit 204.

The solid-state imaging device 1 is configured to receive the incident light (subject image) H, which enters through the optical system 201 and the infrared cut filter 202, with an imaging surface PS and generates a signal charge. The detailed configuration of the solid-state imaging device 1 will be described later.

The optical system 201 includes, for example, a plurality of optical lenses and forms an image of the incident light H on the imaging surface PS of the solid-state imaging device 1.

The infrared cut filter 202 is disposed between the optical system 201 and the solid-state imaging device 1, so as to cut infrared components contained in the incident light H and emit to the imaging surface PS of the solid-state imaging device 1.

In the present embodiment, the infrared cut filter 202 is a so-called interference filter and is formed from a reflection-type inorganic interference multilayer film.

The drive circuit 203 outputs various drive signals to the solid-state imaging device 1 and the signal processing circuit 204 and drives each of the solid-state imaging device 1 and the signal processing circuit 204.

The signal processing circuit 204 conducts signal processing of raw data output from the solid-state imaging device 1 and, thereby, produces a digital image of the subject image.

(2) Whole Configuration of Solid-state Imaging Device

Figure 19:
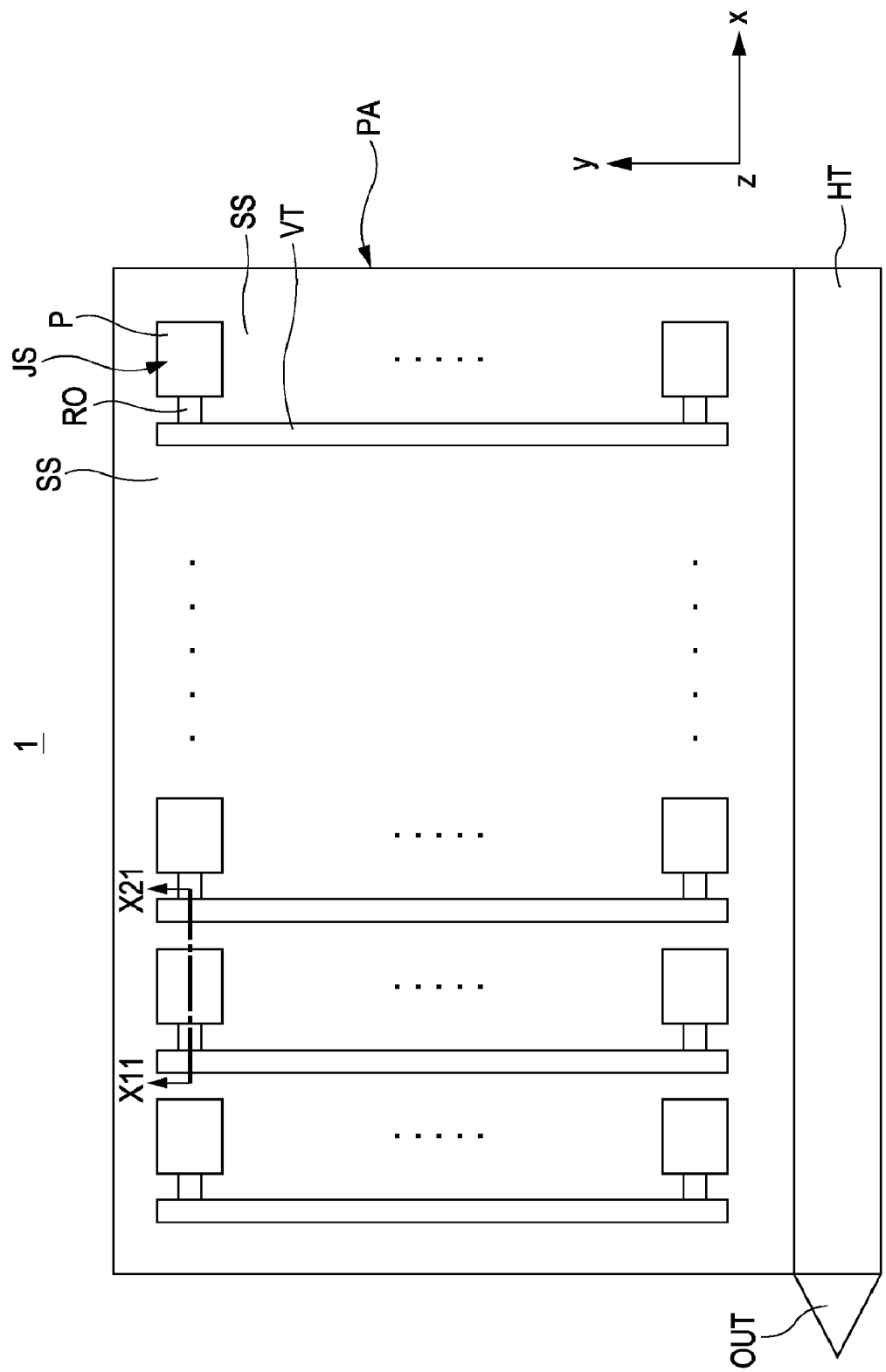
FIG. 19 is a plan view schematically showing the whole configuration of a solid-state imaging device in a fourth embodiment according to the present invention.

FIG. 19 is a plan view schematically showing the whole configuration of a solid-state imaging device 1 in the fourth embodiment according to the present invention.

As shown in FIG. 19, the solid-state imaging device 1 is, for example, a CCD type image sensor of an interline system, and imaging of a subject image is conducted in the imaging region PA. As shown in FIG. 19, a photoelectric conversion portion P, a charge readout portion RO, and a vertical transfer resistor portion VT are disposed in this imaging region PA.

As shown in FIG. 19, a plurality of photoelectric conversion portions P are disposed in the imaging region PA and the individual photoelectric conversion portions P are arranged in both horizontal direction x and vertical direction y. That is, a plurality of pixels for imaging the subject image are arranged in the matrix. Furthermore, an element isolation portion SS is disposed around the plurality of photoelectric conversion portions P in such a way as to isolate the individual photoelectric conversion portions P from each other. Moreover, in the light-receiving surface JS, the photoelectric conversion portion P is configured to receive light from the subject image and generate a signal charge through photoelectrical conversion.

As shown in FIG. 19, in the imaging region PA, a plurality of charge readout portions RO are disposed in such a way as to correspond to the plurality of photoelectric conversion portions P and are configured to read the signal charges generated by the photoelectric conversion portions P to the vertical transfer resistor portions VT.

As shown in FIG. 19, in the imaging region PA, the vertical transfer resistor portion VT extends in the vertical direction y in such a way as to correspond to the plurality of photoelectric conversion portions P arranged in the vertical direction y. Furthermore, the vertical transfer resistor portion VT is disposed between lines, in which the plurality of photoelectric conversion portions P are arranged in the vertical direction y. A plurality of vertical transfer resistor portions VT are disposed in the imaging region PA, and a plurality of vertical transfer resistor portions VT are arranged in the horizontal direction x in such a way as to correspond to each of the plurality of photoelectric conversion portions P arranged in the horizontal direction x. The vertical transfer resistor portion VT is a so-called vertical transfer CCD and transfers signal charges sequentially in the vertical direction y, while the signal charges are read from the photoelectric conversion portions P by the charge readout portion RO. Although a detailed explanation will be provided later, in the vertical transfer resistor portion VT, a plurality of transfer electrodes (not shown in the drawing) are disposed aligning in the vertical direction y, and the transfer of this signal charge is performed by, for example, supplying four-phase drive pulse signals to the transfer electrodes aligned in the vertical direction y.

Then, as shown in FIG. 19, at the lower end of the imaging region PA, a horizontal transfer resistor portion HT is disposed. This horizontal transfer resistor portion HT extends in the horizontal direction x and transfers sequentially the signal charges, which are transferred in the vertical direction y by each of the plurality of vertical transfer resistor portions VT, in the horizontal direction x. That is, the horizontal transfer resistor portion HT is a so-called horizontal transfer CCD and is driven by, for example, a two-phase drive pulse signal, so as to perform transfer of the signal charges transferred on one horizontal line (one line of pixels) basis.

Moreover, as shown in FIG. 19, an output portion OUT is disposed at the left end portion of the horizontal transfer resistor portion HT. This output portion OUT converts the signal charge transferred horizontally by the horizontal transfer resistor portion HT to a voltage and outputs as an image signal.

In this regard, the above-described imaging region PA corresponds to the imaging surface PS shown in FIG. 8.

(3) Detailed Configuration of Solid-state Imaging Device

The detailed configuration of the above-described solid-state imaging device 1 will be described.

Figure 20:
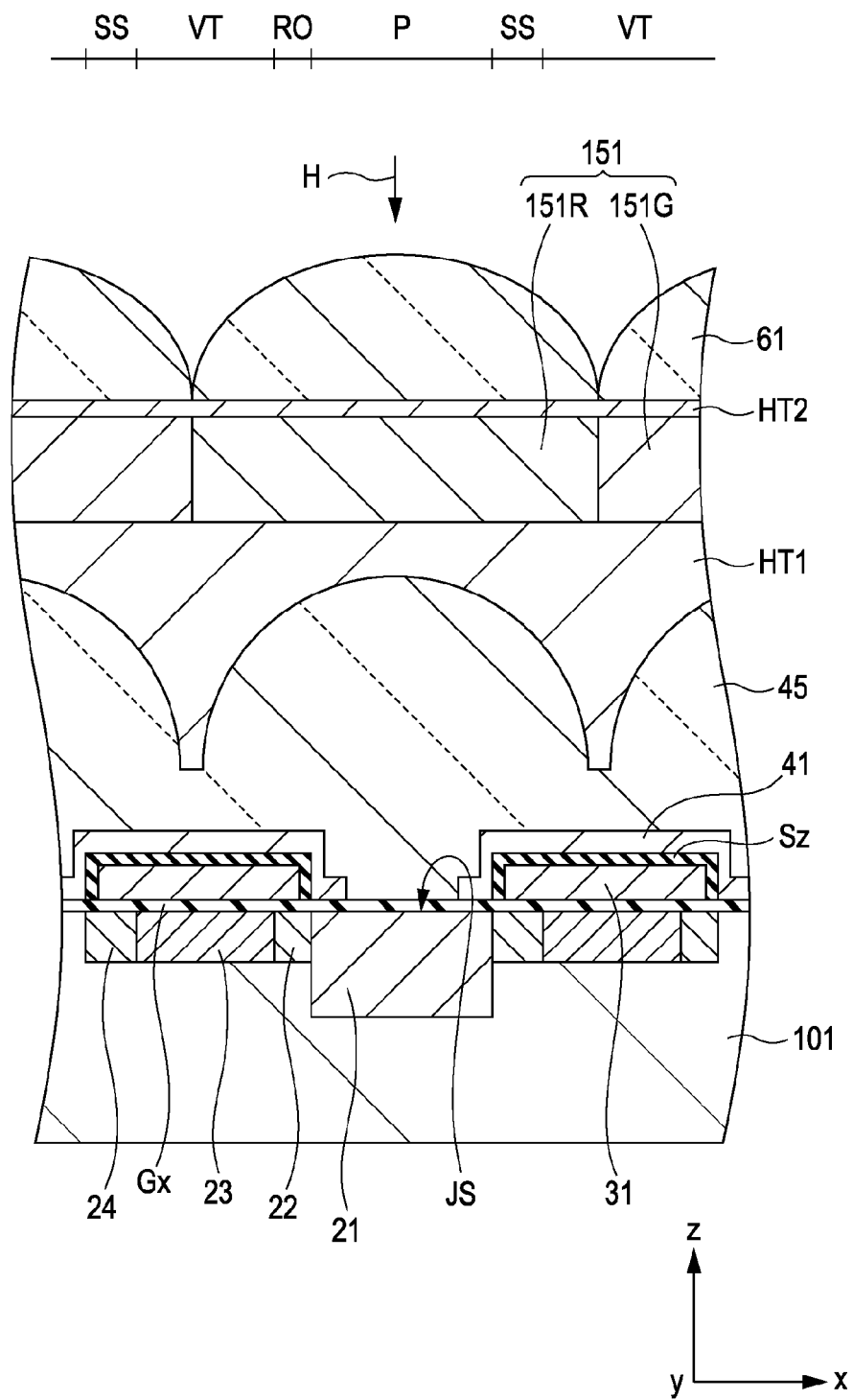
FIG. 20 is a diagram showing a key portion of a solid-state imaging device in the fourth embodiment according to the present invention.

FIG. 20 is a diagram showing a key portion of the solid-state imaging device 1 in the fourth embodiment according to the present invention. Here, FIG. 20 shows a cross-section of the key portion. FIG. 20 shows the section taken along a line X11-X21 shown in FIG. 19 under magnification.

As shown in FIG. 20, the solid-state imaging device 1 includes a substrate 101. The substrate 101 is, for example, an n-type silicon semiconductor substrate. In the inside of the substrate 101, a photodiode 21, a charge readout channel region 22, a charge transfer channel region 23, and a channel stopper region 24 are disposed.

Then, as shown in FIG. 20, a transfer electrode 31, a metal light-shield layer 41, an intralayer lens 45, a color filter 151, and a microlens 61 are disposed on the surface of the substrate 101.

The individual portions constituting the solid-state imaging device 1 will be described sequentially.

As shown in FIG. 20, the photodiode 21 is disposed in the substrate 101 in such a way as to correspond to the photoelectric conversion portion P. This photodiode 21 is configured to receive light with a light-receiving surface JS and generate a signal charge through photoelectric conversion.

Specifically, the photodiode 21 is disposed in a part located on the surface side in the inside of the substrate 101. Although not shown in the drawing, the photodiode 21 is formed by, for example, forming an n-type semiconductor region (n) (not shown in the drawing) and a p-type semiconductor region (p+) (not shown in the drawing) sequentially on a p-type semiconductor well region (p) (not shown in the drawing) disposed in the substrate 101.

Here, the n-type semiconductor region (n) functions as a signal charge accumulation region. Then, the p-type semiconductor region (p+) functions as a hole accumulation region and is configured to suppress an occurrence of a dark current in the n-type semiconductor region (n) serving as the signal charge accumulation region.

Regarding the photodiode 21, the intralayer lens 45, the color filter 151, the microlens 61, and the like are disposed above the light-receiving surface JS from materials, which transmit light. Consequently, the photodiode 21 receives the light H incident through these portions sequentially with the light-receiving surface JS and generates signal charges.

As shown in FIG. 20, the charge readout channel region 22 is disposed in such a way as to correspond to the charge readout portion RO and is configured to read the signal charge generated in the photodiode 21.

Specifically, as shown in FIG. 20, the charge readout channel region 22 is disposed in a part located on the surface side in the inside of the substrate 101 in such a way as to adjoin the photodiode 21.

Here, the charge readout channel region 22 is disposed on the left of the photodiode 21 in the horizontal direction x. For example, the charge readout channel region 22 is configured to serve as a p-type semiconductor region.

As shown in FIG. 20, the charge transfer channel region 23 is disposed in such a way as to correspond to the vertical transfer resistor portion VT. The charge transfer channel region 23 is configured to transfer the signal charge read by the charge readout portion RO from the photodiode 21.

Specifically, as shown in FIG. 20, the charge transfer channel region 23 is disposed in a part located on the surface side in the inside of the substrate 101 in such a way as to adjoin the charge readout channel region 22.

Here, the charge transfer channel region 23 is disposed on the left of the charge readout channel region 22 in the horizontal direction x. For example, the charge transfer channel region 23 is formed by disposing an n-type semiconductor region (n) (not shown in the drawing) on the p-type semiconductor well region (p) (not shown in the drawing) in the inside of the substrate 101.

As shown in FIG. 20, the channel stopper region 24 is disposed in such a way as to correspond to the element isolation portion SS.

Specifically, as shown in FIG. 20, the channel stopper region 24 is disposed in a part located on the surface side in the inside of the substrate 101.

Here, as shown in FIG. 19, in the horizontal direction x, the channel stopper region 24 is disposed on the left of the charge readout channel region 22 in such a way as to be interposed between the charge readout channel region 22 and the photodiode 21 disposed in the adjacent line. Besides, the channel stopper region 24 is disposed in such a way as to correspond to the element isolation portion SS between two photodiodes 21 aligned in the vertical direction y (refer to FIG. 19).

For example, the channel stopper region 24 is formed by disposing a p-type semiconductor region (p+) (not shown in the drawing) on the p-type semiconductor well region (p) (not shown in the drawing) in the inside of the substrate 101 and forms a potential barrier so as to prevent an outflow and an inflow of signal charge.

As shown in FIG. 20, the transfer electrode 31 is disposed on the surface of the substrate 101 in such a way as to oppose to the substrate 101 with the gate insulating film Gx therebetween. The transfer electrode 31 is formed from an electrically conductive material. For example, the transfer electrode 31 is formed from an electrically conductive material, e.g., polysilicon, and is disposed on, for example, the gate insulating film Gx formed from a silicon oxide film.

As shown in FIG. 20, the metal light-shield layer 41 is disposed on the surface of the substrate 101 and above the charge readout channel region 22 and the charge transfer channel region 23, so as to block the light incident on the charge readout channel region 22 and the charge transfer channel region 23. Furthermore, as shown in FIG. 20, the metal light-shield layer 41 is disposed in such a way as to cover the transfer electrode 31 with the insulating film Sz therebetween.

Here, the metal light-shield layer 41 is disposed above the substrate 101 and in a region other than a region corresponding to the light-receiving surface JS. Every metal light-shield layer 41 is formed from a light-shield material, which blocks the light. For example, the metal light-shield layer 41 is formed by using a metal material, e.g., tungsten or aluminum.

As shown in FIG. 20, the intralayer lens 45 is disposed above the substrate 101 in such a way as to correspond to the light-receiving surface JS. A plurality of intralayer lens 45 having the same shape are arranged in such a way as to correspond to the plurality of photoelectric conversion portions P arranged in the imaging region PA.

Here, the intralayer lens 45 is a convex lens formed in such a way that the thickness of the center in a direction from the light-receiving surface JS toward the color filter 151 side is larger than the thickness of the edge and is configured to condense the incident light H on the center of the light-receiving surface JS. For example, the intralayer lens 45 is formed in such a way that a plan view thereof becomes rectangular.

As shown in FIG. 20, the color filter 151 is disposed above the substrate 101 in such a way as to be opposed to the light-receiving surface JS with the intralayer lens 45 therebetween. The color filter 151 is disposed on the upper surface of the flattening film HT1 to flatten the surface of the intralayer lens 45. A plurality of color filters 151 are arranged in such a way as to corresponds to a plurality of photoelectric conversion portions P arranged in the imaging region PA.

Here, the color filter 151 is configured to color the incident light H and transmit to the light-receiving surface JS.

FIG. 21 is a diagram showing the color filter 151 in the fourth embodiment according to the present invention. Here, FIG. 21 is a plan view.

As shown in FIG. 21, the color filter 151 includes a blue filter layer 151B besides the green filter layer 151G and the red filter layer 151R shown in FIG. 20, and each of them is disposed corresponding to each photoelectric conversion portion P.

Specifically, as shown in FIG. 21, the green filter layer 151G, the red filter layer 151R, and the blue filter layer 151B constituting the color filter 151 are arranged in the Bayer pattern, for example.

In the color filter 151, the green filter layer 151G colors the incident light H green. That is, the green filter layer 151G is configured to color the light green with a wavelength smaller than that of red light colored by the red filter layer 151R. Specifically, the green filter layer 151G is formed by using a green colorant and a photoresist resin and is configured to have a high light-transmittance in a waveband of green (for example, wavelength 500 to 565 nm).

In the color filter 151, the red filter layer 151R colors the incident light H red. That is, the red filter layer 151R is configured to color the light red with a wavelength larger than that of green light colored by the green filter layer 151G. Specifically, the red filter layer 151R is formed by using a red colorant and a photoresist resin and is configured to have a high light-transmittance in a waveband of red (for example, wavelength 625 to 740 nm).

In the color filter 151, the blue filter layer 151B colors the incident light H blue. That is, the blue filter layer 151B is configured to color the light blue with a wavelength smaller than those of red light colored by the red filter layer 151R and green light colored by the green filter layer 151G. Specifically, the blue filter layer 151B is formed by using a blue colorant and a photoresist resin and is configured to have a high light-transmittance in a waveband of blue (for example, wavelength 450 to 485 nm).

Each of the layers 151R, 151G, and 151B is formed by applying a coating solution containing, for example, a colorant corresponding to each color, a dispersion resin, a photopolymerization initiator, a polyfunctional photopolymerizable compound, a solvent, and other additives, conducting drying and, thereafter, conducting patterning through lithography.

In the present embodiment, the red filter layer 151R has a black colorant content larger than those of the green filter layer 151G and the blue filter layer 151B, so that the amount of light dropped on the light-receiving surface JS is adjusted. Specifically, the red filter layer 151R is formed in such a way as to contain the black colorant, and the green filter layer 151G and the blue filter layer 151B are formed in such a way as to contain no black colorant.

In the above description, as for the black colorant, for example, the following black pigments (carbon black) can be used. It is favorable that the content of this black colorant is 1 to 10 percent by mass in terms of total solid content.

Produced by Cancarb:
Carbon Black Thermax N990, N991, N907, N908, N990, N991, N90b8, and the like Produced by ASAHI CARBON CO., LTD.:
Carbon Black Asahi #80, Asahi #70, Asahi #70L, Asahi F-200, Asahi #66, Asahi #66HN, Asahi #60H, Asahi #60U, Asahi #60, Asahi #55, Asahi #50H, Asahi #51, Asahi #50U, Asahi #50, Asahi #35, Asahi #15, and Asahi Thermal Produced by Degussa:
ColorBlack Fw200, ColorBlack Fw2, ColorBlack Fw2V, ColorBlack Fw1, ColorBlack Fw18, ColorBlack S170, ColorBlack S160, SpecialBlack 6, SpecialBlack 5, SpecialBlack 4, SpecialBlack 4A, Printex U, Printex V, Printex 140U, Printex 140V, and the like Produced by MITSUBISHI CHEMICAL CORPORATION:

Carbon Black #2700B, #2650, #2600, #2450B, #2400, #2350, #2300, #2200, #1000, #990, #980, #970, #960, #950, #900, #850, #750B, #650B, MCF88, #650, MA600, MA7, MA8, MA11, MA100, MA220, IL30B, IL31B, 1L7B, IL11B, 1L52B, #4000, #4010, #55, #52, #50, #47, #45, #44, #40, #33, #32, #30, #20, #10, #5, CF9, #3050, #3150, #3250, #3750, #3950, DIABLACK A, DIABLACK N220M, DIABLACK N234, DIABLACK I, DIABLACK LI, DIABLACK II, DIABLACK N339, DIABLACK SH, DIABLACK SHA, DIABLACK LH, DIABLACK H, DIABLACK HA, DIABLACK SF, DIABLACK N550M, DIABLACK E, DIABLACK G, DIABLACK R, DIABLACK N760M, DIABLACK LP, and the like Furthermore, as for colorants used for the red filter layer 151R, for example, anthraquinone pigments, perylene pigments, and diketopyrrolopyrrole pigments can be used. Specifically, as for the anthraquinone pigments, for example, C. I. Pigment red 177 can be used. As for the perylene pigments, for example, C. I. Pigment red 155 and C. I. Pigment red 224 can be used. As for the diketopyrrolopyrrole pigments, for example, C. I. Pigment red 254 can be used. Moreover, mixtures of them and disazo yellow pigments, isoindoline yellow pigments, quinophthalone yellow pigments, or perylene red pigments can be used. It is favorable that the content of this colorant is 30 percent by mass or more in terms of total solid content.

As for the dispersion resin, for example, a resin produced by reacting a carboxyl-containing resin with a glycidyl-containing unsaturated compound can be used. In addition, resins produced by polymerizing a hydroxyl-containing (meth) acrylic acid ester compound, (meth)acrylic acid-2-isocyanate ethyl, and other resins can be used. It is favorable that 20 parts by mass of this dispersion resin is used in dispersion of 100 parts by mass of the above-described colorant.

As for the photopolymerization initiator, for example, triazine compounds, alkylamino compounds, oxime compounds, and biimidazole compounds can be used. It is favorable that the content of this photopolymerization initiator is 5 to 25 percent by mass in terms of total solid content.

As for the polyfunctional photopolymerizable compound, for example, polyfunctional photopolymerizable compounds having an acidic functional group and/or an alkyleneoxy chain can be used. It is favorable that the content of this polyfunctional photopolymerizable compound is 2 to 15 percent by mass in terms of total solid content.

As for the solvent, for example, the following compounds can be used alone or in combination. It is favorable that the content of this solvent is 25 to 95 percent by mass in total.

Methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, and propylene glycol monomethyl ether acetate As for the other additives, a sensitizer may be added so as to improve the efficiency of occurrence of radicals due to the photopolymerization initiator. Furthermore, a silicone based or fluorine based surfactant and the like may be added so as to improve the coating characteristic.

As shown in FIG. 20, the microlens 61 is disposed above the surface of the substrate 101 and above the color filter 151 with the flattening film HT2 therebetween. A plurality of microlenses 61 in the same shape are arranged in such a way as to correspond to a plurality of photoelectric conversion portions P aligned in the imaging region PA.

Here, the microlens 61 is a convex lens formed in such a way that the thickness of the center in a direction from the light-receiving surface JS toward the color filter 151 side is larger than the thickness of the edge and is configured to transmit and condense the incident light H on the center of the light-receiving surface JS.

For example, the microlens 61 is formed in such a way that a plan view thereof becomes rectangular. In the present embodiment, the microlens 61 is configured to transmit and condense the incident light H, which has passed through the above-described infrared cut filter 202 (refer to FIG. 8) formed from the reflection-type inorganic interference multilayer film, on the center of the light-receiving surface JS.

Manufacturing Method

A method for manufacturing the above-described solid-state imaging device 1 will be described below.

FIG. 22 to FIG. 26 are diagrams showing key portions formed by the individual steps of the method for manufacturing the solid-state imaging device 1 in the fourth embodiment according to the present invention. Here, FIG. 22 to FIG. 26 show the section taken along the line X11-X21 shown in FIG. 19 under magnification, as in FIG. 20.

(1) Formation of Intralayer Lens 45

Figure 22:
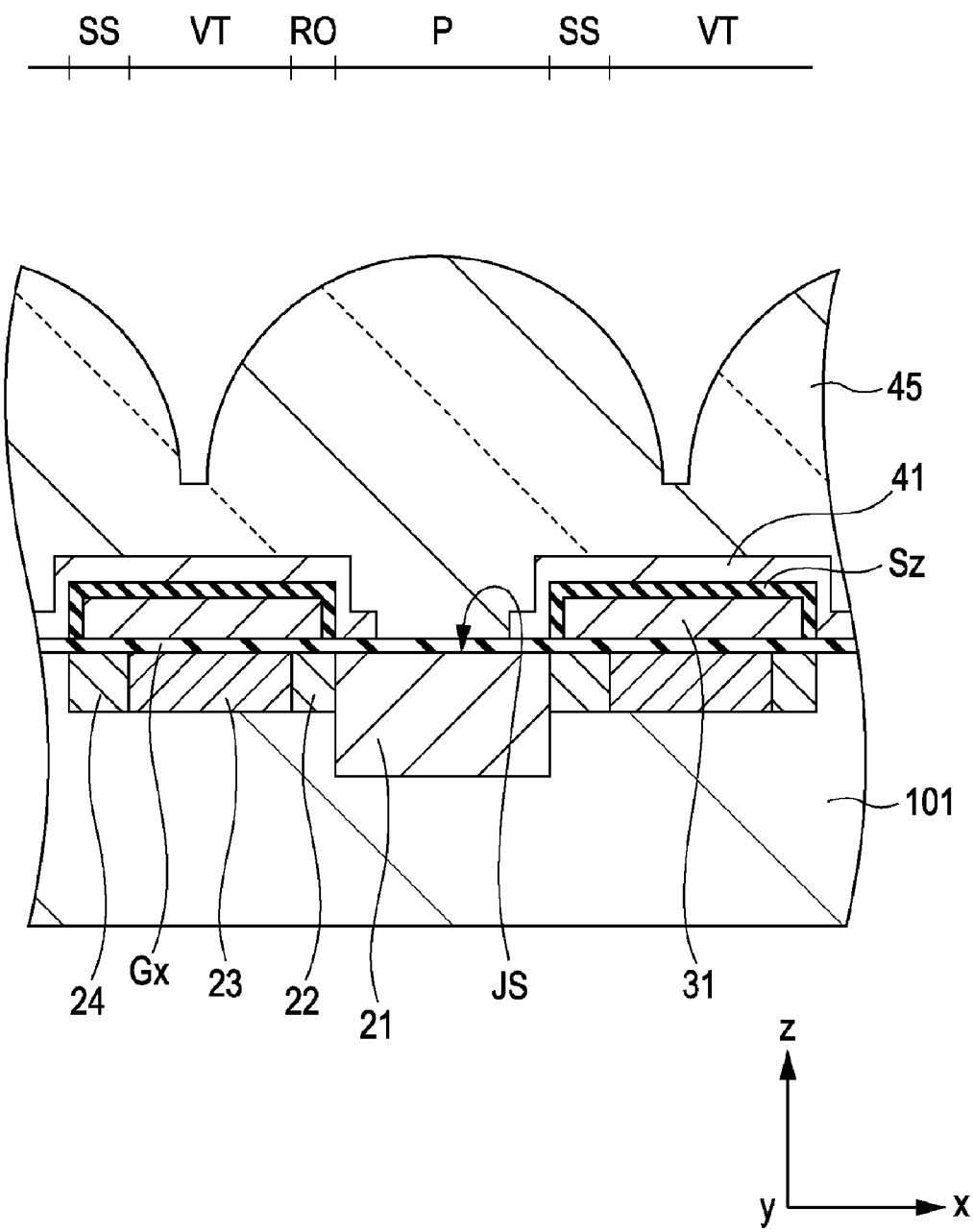
FIG. 22 is a diagram showing a key portion formed by a step of a method for manufacturing a solid-state imaging device in the fourth embodiment according to the present invention.

Initially, the intralayer lens 45 is formed as shown in FIG. 22.

Prior to formation of the intralayer lens 45, as shown in FIG. 22, the photodiode 21, the charge readout channel region 22, the charge transfer channel region 23, and the channel stopper region 24 are formed in the substrate 101. The individual portions are formed by introducing an impurity into the substrate 101 through the use of, for example, an ion implantation method. Thereafter, the gate insulating film Gx is formed by forming a silicon oxide film all over the substrate 101 through the use of, for example, a thermal oxidation method.

Subsequently, as shown in FIG. 22, the individual portions, e.g., the transfer electrode 31, are formed on the surface of the substrate 101. For example, the transfer electrode 31 is formed by forming a polysilicon film (not shown in the drawing) through the use of a CVD method and, thereafter, patterning the resulting polysilicon film through photolithography. Then, the insulating film Sz is formed from, for example, a PSG film in such a way as to cover the transfer electrode 31. After a tungsten film is formed through the use of, for example, a sputtering method, the metal light-shield layer 41 is formed by patterning the resulting tungsten film through photolithography.

Thereafter, as shown in FIG. 22, the intralayer lens 45 is disposed on the surface of the substrate 101 in such a way as to cover the above-described individual portions.

Here, as shown in FIG. 22, the intralayer lens 45 is formed as a convex lens, in which the thickness of the center in a direction from the light-receiving surface JS toward the color filter 151 side is larger than the thickness of the edge.

For example, the intralayer lens 45 is formed by forming a plasma silicon nitride film (refractive index 1.9 to 2.0) by a chemical vapor deposition (CVD) method and, thereafter, working the resulting plasma silicon nitride film.

(2) Formation of Flattening Film HT1

Figure 23:
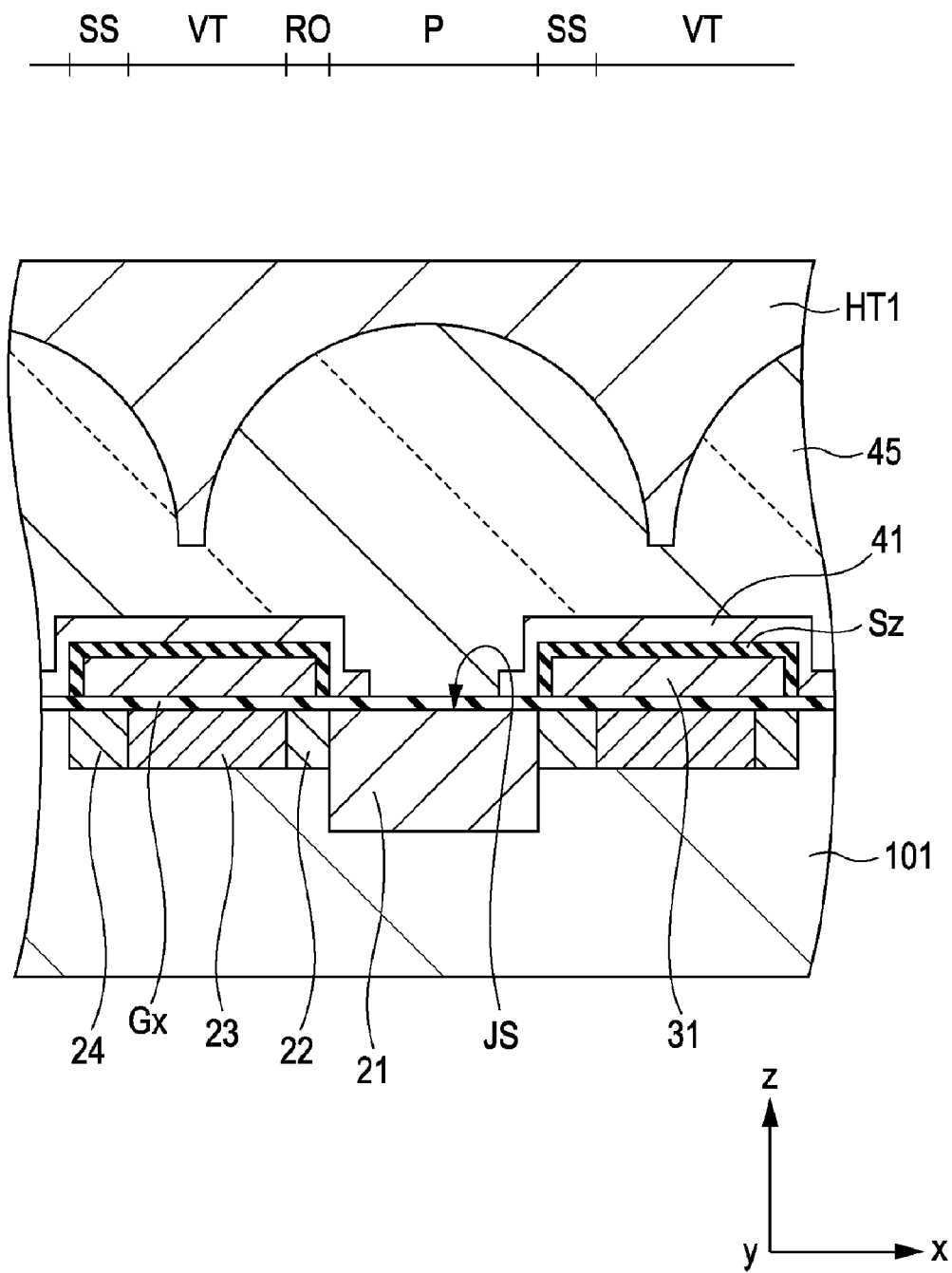
FIG. 23 is a diagram showing a key portion formed by a step of a method for manufacturing a solid-state imaging device in the fourth embodiment according to the present invention.

Next, as shown in FIG. 23, the flattening film HT1 is formed.

Here, the flattening film HT1 is disposed in such a way as to flatten unevenness of the surface formed by the intralayer lens 45.

Specifically, a film of a thermosetting resin is formed on the upper surface of the intralayer lens 45 by a spin coating method and, thereafter, a heat-curing treatment is conducted, so that the flattening film HT1 is formed.

For example, a thermosetting acrylic resin (refractive index about 1.5 to 1.55) having a refractive index lower than that of the material for the intralayer lens 45 is used. In addition, a material, in which fluorine is contained in an acrylic resin, a material, in which fluorine is contained in a siloxane resin, a material, in which fluorine is contained in an acrylic resin and fine hollow silica serving as an additive is dispersed therein, and a material, in which fluorine is contained in a siloxane resin and fine hollow silica serving as an additive is further dispersed therein, are used favorably. The refractive index of the material is reduced (about 1.3 to 1.45) by allowing the siloxane resin to contain fluorine or allowing the resin to contain and disperse the hollow silica, so that an intralayer lens structure having a stronger power is obtained.

(3) Formation of Green Filter Layer 151G

Figure 24:
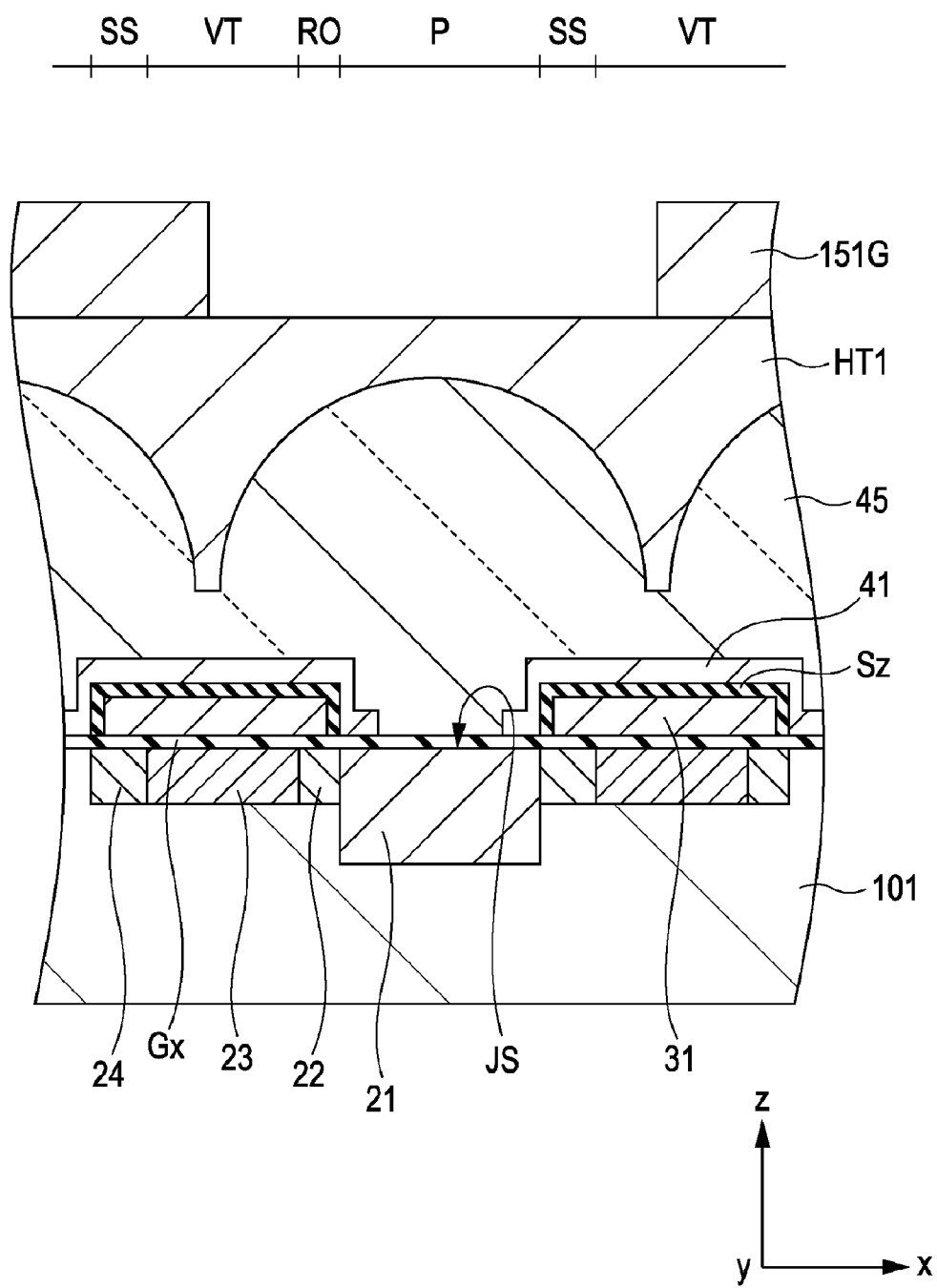
FIG. 24 is a diagram showing a key portion formed by a step of a method for manufacturing a solid-state imaging device in the fourth embodiment according to the present invention.

Next, as shown in FIG. 24, the green filter layer 151G constituting the color filter 151 is formed.

Here, as shown in FIG. 24, the green filter layer 151G is disposed on the surface of the flattening film HT1.

Specifically, a photoresist film (not shown in the drawing) is formed by applying a coating solution containing a colorant to obtain a green spectral characteristic and a photosensitive resin by a spin coating method.

Subsequently, a prebaking treatment is conducted. Thereafter, the resulting photoresist film is patterned, so that the green filter layer 151G is formed.

For example, an i-line stepper is used and a pattern exposing treatment is conducted, in which a pattern image is transferred to a photoresist film. Thereafter, an organic alkali aqueous solution (for example, a solution in which a nonionic surfactant is added to tetramethylammonium hydroxide) is used as a developing solution, and a developing treatment of the photoresist film subjected to the pattern exposing treatment is conducted. Then, a post baking treatment is conducted, so that the green filter layer 151G is formed.

(4) Formation of Red Filter Layer 151R

Figure 25:
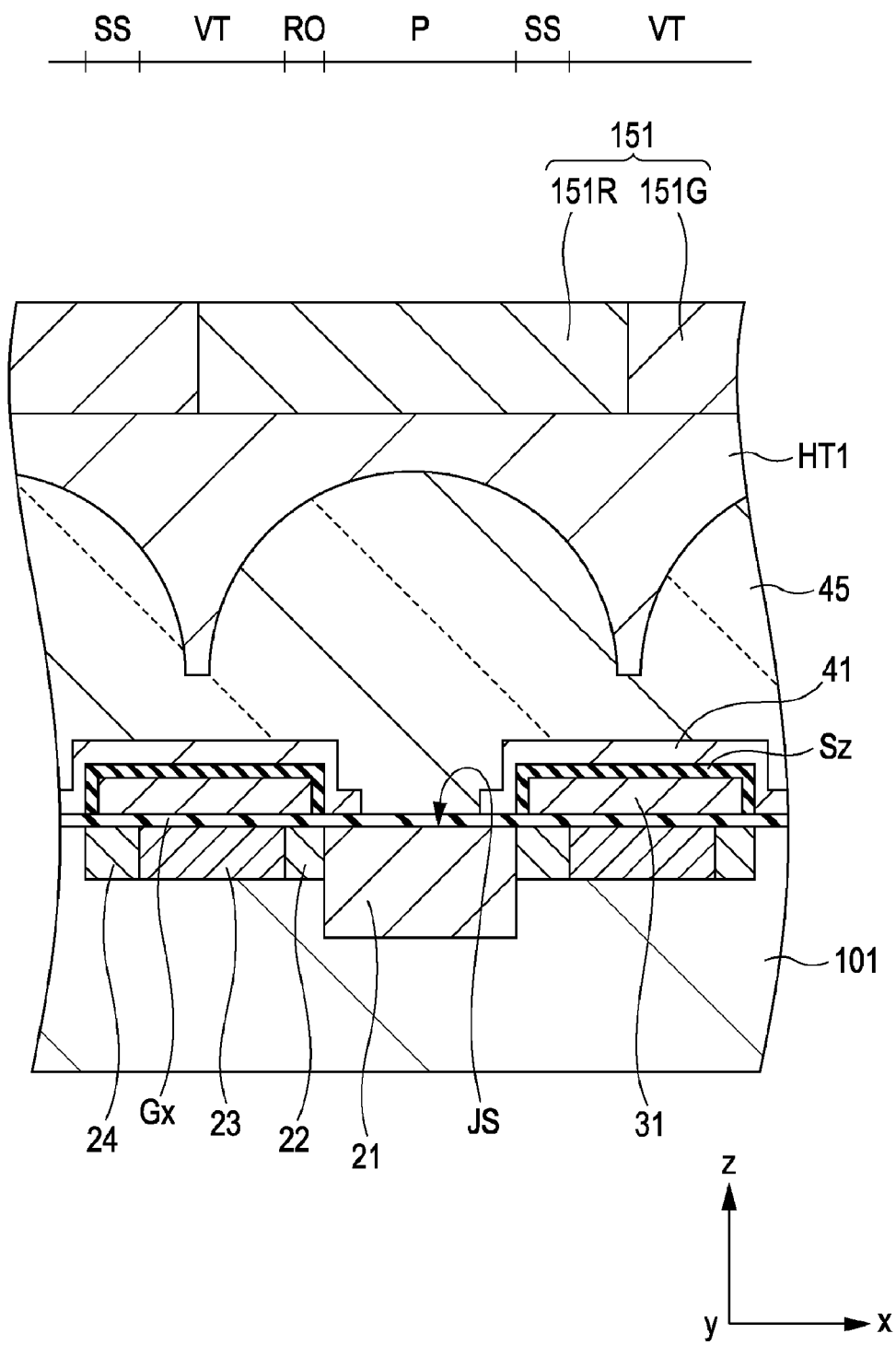
FIG. 25 is a diagram showing a key portion formed by a step of a method for manufacturing a solid-state imaging device in the fourth embodiment according to the present invention.

Next, as shown in FIG. 25, the red filter layer 151R constituting the color filter 151 is formed.

Here, as shown in FIG. 25, the red filter layer 151R is disposed on the surface of the flattening film HT1.

Specifically, a photoresist film (not shown in the drawing) is formed by applying a coating solution containing a red colorant and a photosensitive resin by a spin coating method.

In the present embodiment, as described above, a black colorant, besides the red colorant, is further contained in the above-described coating solution and, thereby, this photoresist film (not shown in the drawing) is formed.

Subsequently, a prebaking treatment is conducted. Thereafter, the resulting photoresist film is patterned, so that the red filter layer 151R is formed.

For example, the i-line stepper is used and a pattern exposing treatment is conducted, in which a pattern image is transferred to a photoresist film. Thereafter, an organic alkali aqueous solution (for example, a solution in which a nonionic surfactant is added to tetramethylammonium hydroxide) is used as a developing solution, and a developing treatment of the photoresist film subjected to the pattern exposing treatment is conducted. Then, a post baking treatment is conducted, so that the red filter layer 151R is formed.

Subsequently, although not shown in the drawing, the blue filter layer 151B is disposed on a surface of the flattening film HT1 and, thereby, the color filter 151 composed of three primary colors is completed.

(5) Formation of Flattening Film HT2

Figure 26:
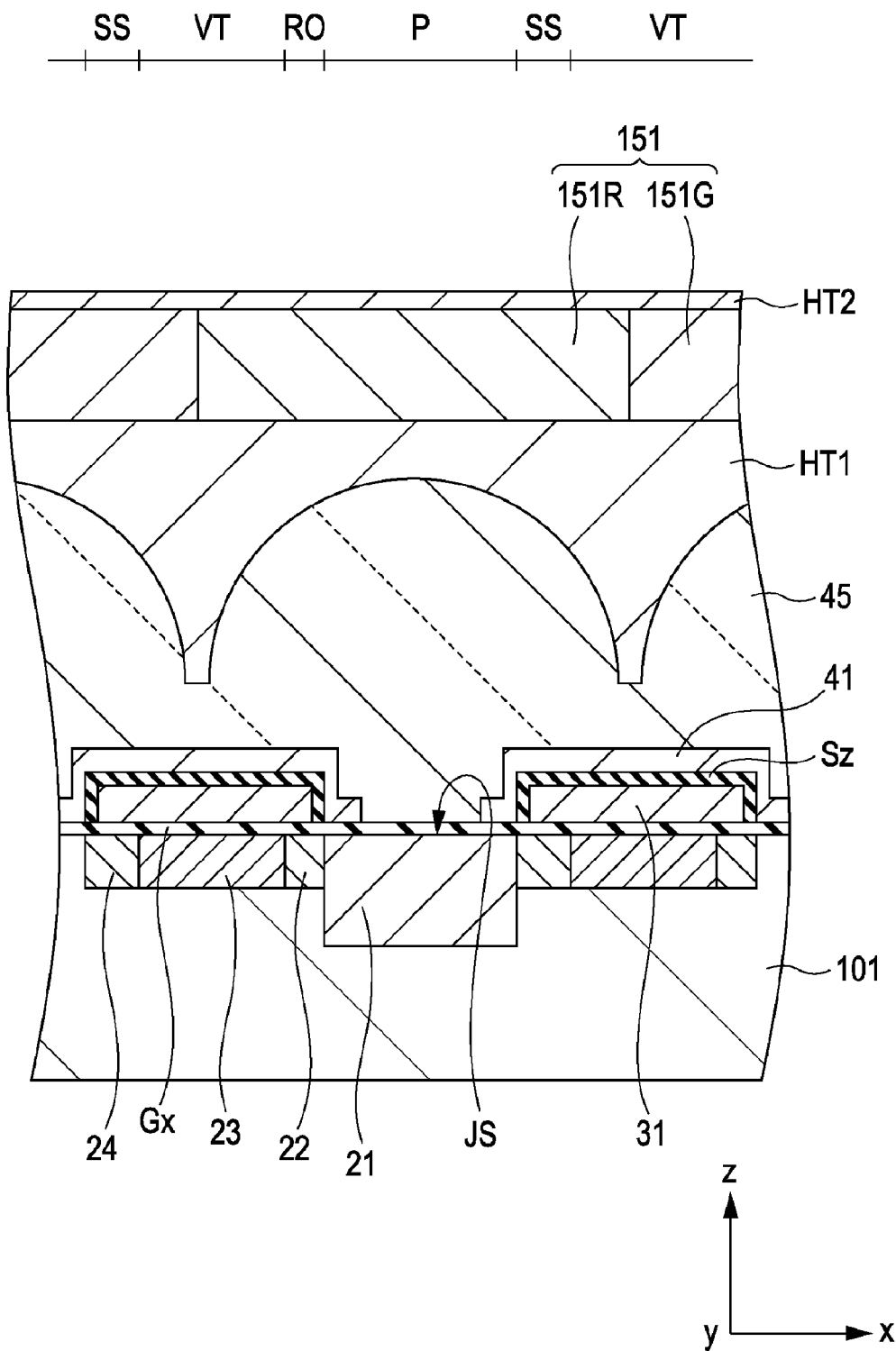
FIG. 26 is a diagram showing a key portion formed by a step of a method for manufacturing a solid-state imaging device in the fourth embodiment according to the present invention.

Next, as shown in FIG. 26, the flattening film HT2 is formed on the color filter 151.

Here, the flattening film HT2 is disposed in such a way as to cover and flatten the upper surface of the color filter 151.

Specifically, a film of a thermosetting resin is formed on the upper surface of the color filter 151 by a spin coating method. Thereafter, a heat-curing treatment is conducted, so that the flattening film HT2 is formed.

(6) Formation of Microlens 61

Next, as shown in FIG. 20, the microlens 61 is formed on the upper surface of the flattening film HT2.

Here, as shown in FIG. 20, the microlens 61 is formed as a convex lens, in which the thickness of the center in a direction from the light-receiving surface JS toward the color filter 151 side is larger than the thickness of the edge.

For example, a positive type photoresist film (not shown in the drawing) is formed on the upper surface of the flattening film HT2 and, thereafter, is worked, so that the microlens 61 is formed.

Specifically, polystyrene is used as a base resin, diazonaphthoquinone is used as a sensitizer, the positive type photoresist film is formed by a spin coating method, and a prebaking treatment is conducted. Then, the i-line stepper is used and an exposing treatment is conducted, in which a pattern image is applied to the positive type photoresist film. Thereafter, a developing treatment of the photoresist film subjected to the exposing treatment is conducted. In this developing treatment, for example, an organic alkali aqueous solution (for example, a solution in which a nonionic surfactant is added to tetramethylammonium hydroxide) is used as a developing solution. Subsequently, ultraviolet rays are applied all over the surface to decolorize in such a way that absorption of light in a small wavelength region of the visible light is eliminated. Thereafter, a heat treatment of the photoresist film is conducted at a temperature higher than or equal to the heat softening point. In this manner, the microlens 61 is completed.

As described above, in the present embodiment, the color filter 151, which colors the incident light H and transmits to the light-receiving surface, is disposed above the light-receiving surface JS (refer to FIG. 20). Here, in the color filter 151, the red filter layer 151R is a filter to color the incident light H red, which is a color with a wavelength larger than those of green and blue, and contains the black colorant. On the other hand, the green filter layer 151G and the blue filter layer 151B contain no black colorant. Consequently, in the present embodiment, an output of the red component is reduced, and spectral outputs of the individual colors become equal, so that the color reproducibility is excellent and the image quality of the image acquired through imaging can be improved.

This operation and effects will be described below specifically.

Figure 27:
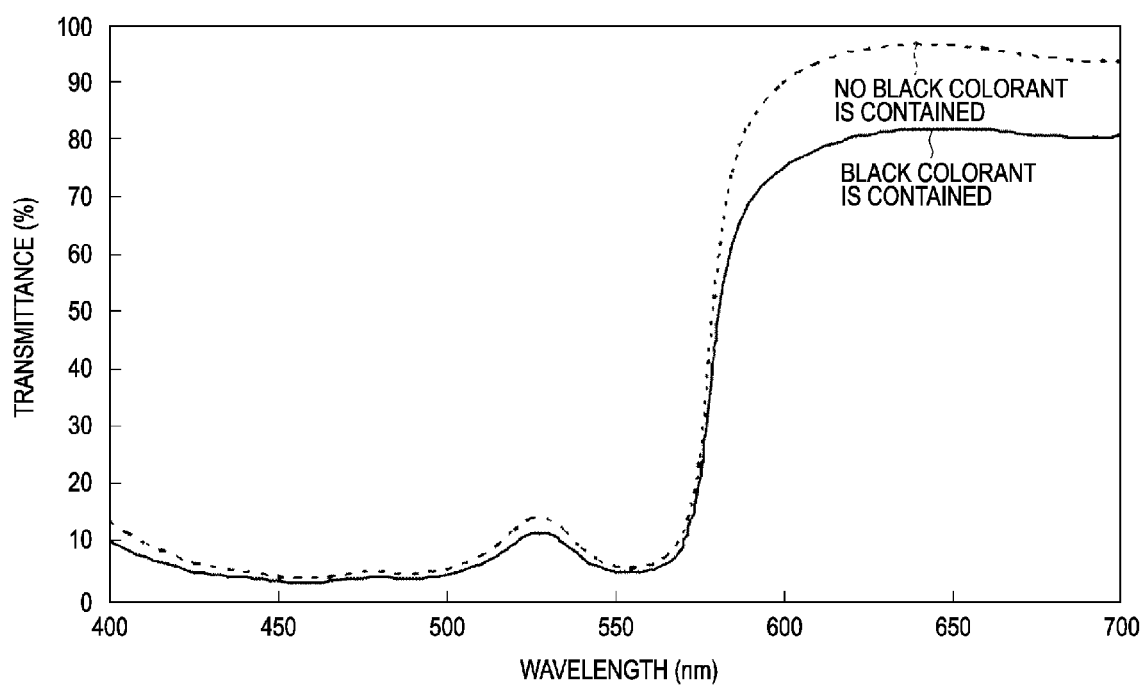
FIG. 27 is a diagram showing the spectral transmission characteristic of a red filter layer in the fourth embodiment according to the present invention.

FIG. 27 is a diagram showing the spectral transmission characteristic of the red filter layer 151R in the fourth embodiment according to the present invention. In FIG. 27, the horizontal axis indicates the wavelength (nm) and the vertical axis indicates the transmittance (%). Here, the spectral characteristic of an interline type CCD having a pixel size of 1.55 µm□ is shown. In FIG. 27, a solid line indicates the case of the present embodiment, in which a black colorant is contained. On the other hand, a broken line indicates the case where no black colorant is contained in contrast to the present embodiment. Specifically, the spectral characteristic indicated by the solid line shows the case where 5.1 percent by weight of black colorant (carbon black) is added relative to the total solid content to obtain the spectral characteristic indicated by the broken line. Consequently, the film thickness in the case of the solid line is 0.735 μm and that in the case of the broken line is 0.7 μm.

Figure 28:
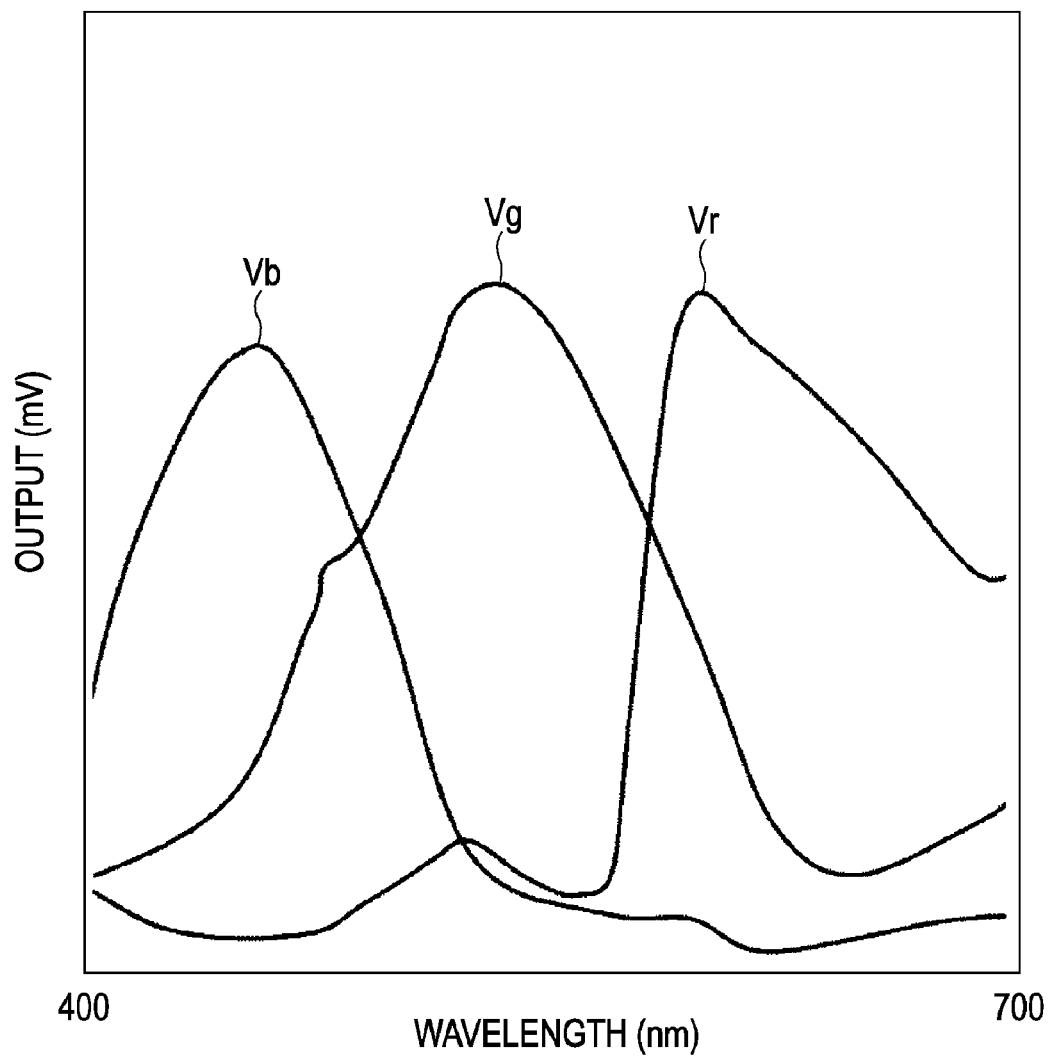
FIG. 28 is a diagram showing the spectral output of a solid-state imaging device in the fourth embodiment according to the present invention.

FIG. 28 is a diagram showing the spectral output of a solid-state imaging device 1 in the fourth embodiment according to the present invention. In FIG. 28, a spectral output Vr of the red component, a spectral output Vg of the green component, and a spectral output Vb of the blue component are shown.

As shown in FIG. 27, since the red filter layer 151R contains the black colorant (solid line), the transmittance is reduced as compared with that in the case where no black colorant is contained (broken line).

Specifically, in the case where no black colorant is contained (broken line), the average transmittance in the wavelength range of the red is 97.5%. On the other hand, the average transmittance in the wavelength range of the red of the red filter layer 151R containing the black colorant (solid line), as in the present embodiment, is 80.2%.

Consequently, as shown in FIG. 28, the spectral output Vr of the red component can be reduced. That is, in the present embodiment, the black colorant is contained in the color filter in order that the spectral outputs of the individual colors become equal.

Hence, in the present embodiment, adjustment of the above-described white balance can be conducted easily and the color separability of the red can be improved, so that excellent color reproducibility is exhibited.

Therefore, according to the present embodiment, the image quality of the image acquired through imaging can be improved.

Furthermore, in the present embodiment, the infrared cut filter 202 formed from a reflection-type inorganic interference multilayer film is disposed in such a way as to cut the infrared component of the incident light H and transmit to the microlens 61 (refer to FIG. 8).

In this case, as described above, the ghost phenomenon may occur and the image quality of the image acquired through imaging may deteriorate.

Figure 29:
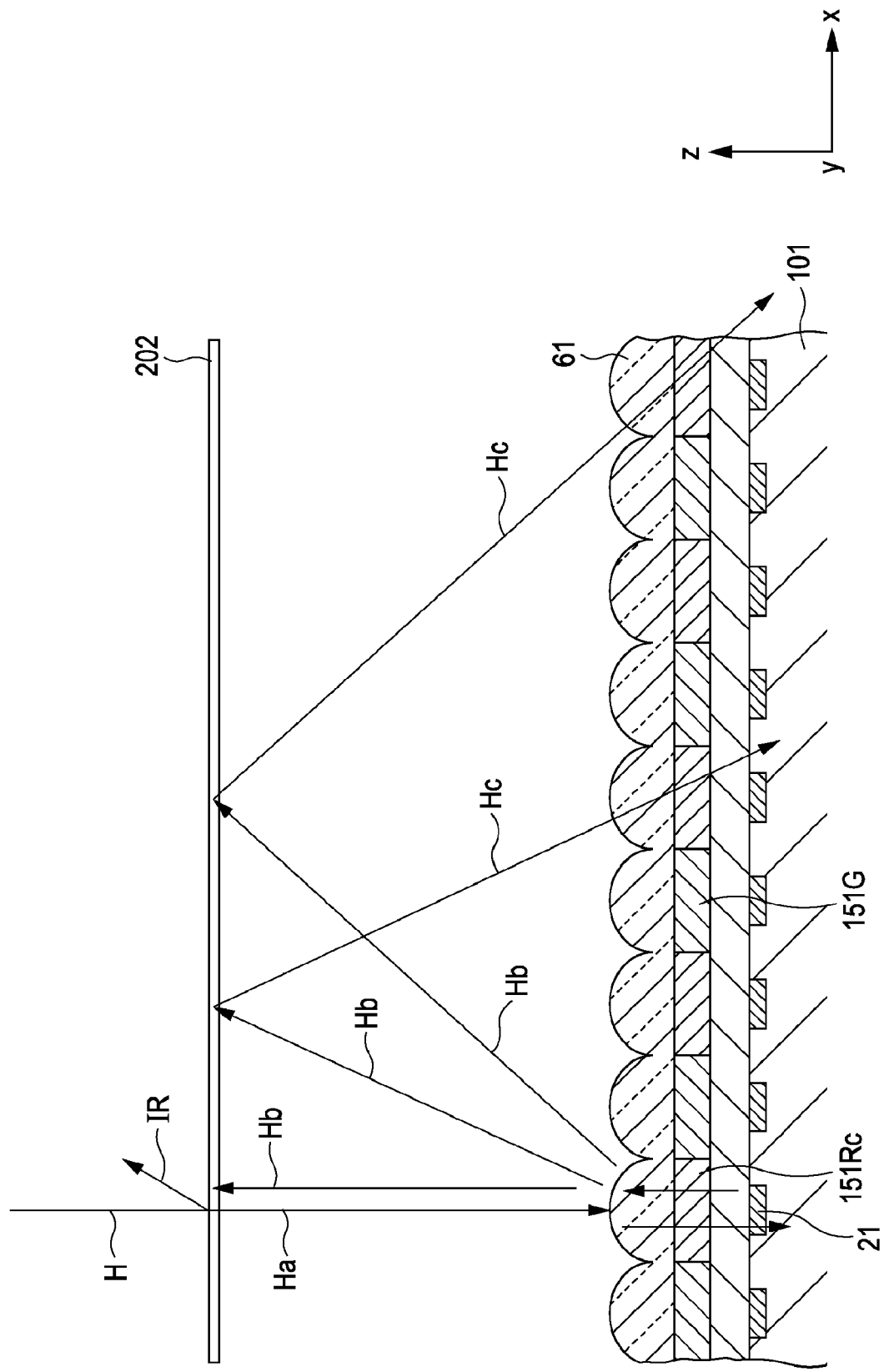
FIG. 29 is a diagram for explaining a ghost phenomenon.
Figure 30:
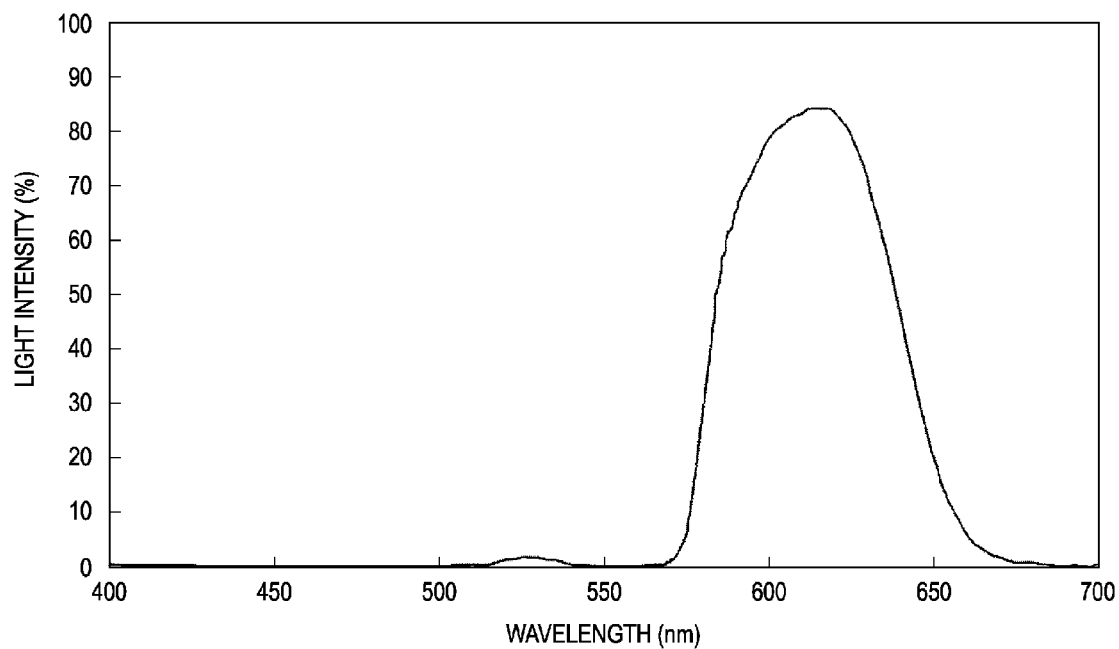
FIG. 30 is a diagram for explaining a ghost phenomenon.
Figure 31:
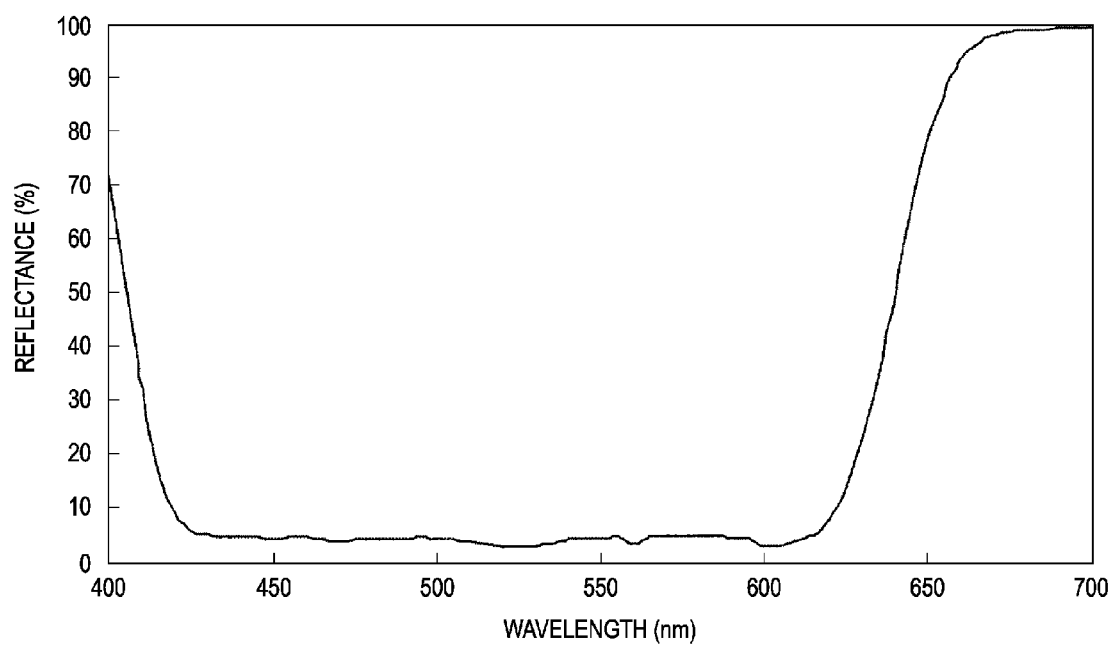
FIG. 31 is a diagram for explaining a ghost phenomenon.
Figure 32:
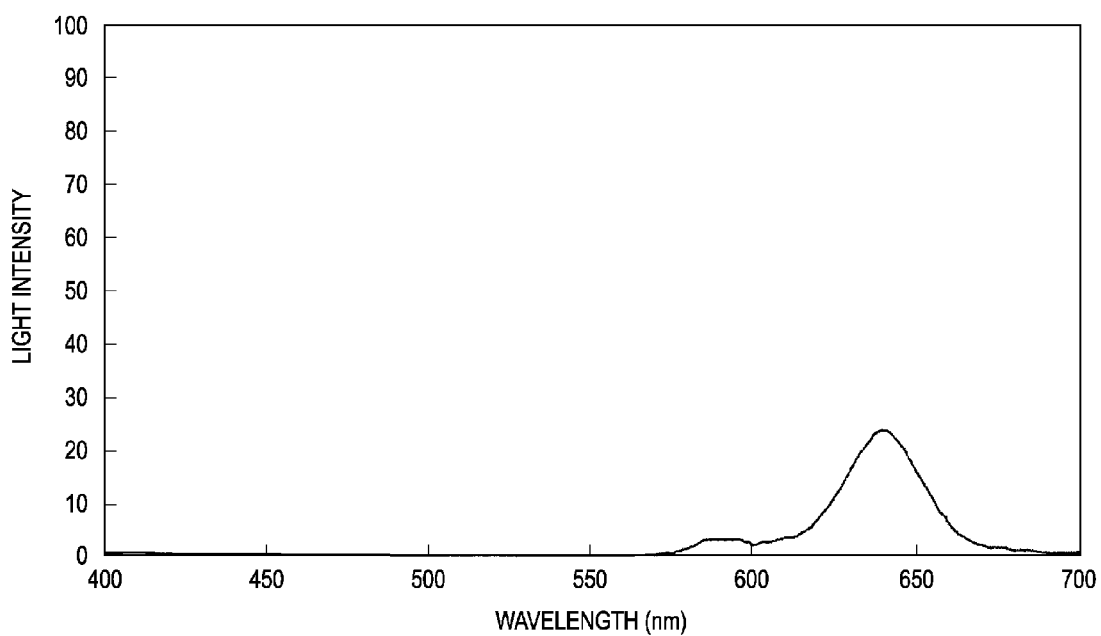
FIG. 32 is a diagram for explaining a ghost phenomenon.

FIG. 29 to FIG. 32 are diagrams for explaining the ghost phenomenon. FIG. 29 schematically shows the behavior of the incident light H incident on the portion of the red filter layer 151R containing no black colorant, in contrast to the present embodiment. FIG. 30 and FIG. 32 show the spectral characteristics of the light incident on the solid-state imaging device 1. FIG. 31 shows the reflection characteristic of the infrared cut filter 202.

As shown in FIG. 29, first, the incident light H enters the infrared cut filter 202. Then, the light IR composed of large-wavelength components is reflected by the infrared cut filter 202, so that the infrared rays are cut.

Next, as shown in FIG. 29, the transmitted light Ha passed through the infrared cut filter 202 enters the photodiode 21 through the members, e.g., the microlens 61 and the red filter layer 151Rc. Then, photoelectric conversion is conducted in the photodiode 21.

At this time, there are components reflected without being photoelectrically converted, and the reflected light Hb thereof returns to the members, e.g., the red filter layer 151Rc and the microlens 61, as shown in FIG. 29.

Subsequently, as shown in FIG. 29, the reflected light Hb, which is diffracted light based on the arrangement pitch of the pixels, returns to the infrared cut filter 202. Here, the reflected light Hb has the spectral characteristic shown in FIG. 30 and enters the infrared cut filter 202.

Next, as shown in FIG. 29, the reflected light Hb is reflected by the infrared cut filter 202. The infrared cut filter 202 has the spectral characteristic shown in FIG. 31. Consequently, the reflected light Hc reflected by the infrared cut filter 202 has the spectral characteristic shown in FIG. 32 and enters the members, e.g., the red filter layer 151Rc and the microlens 61, again.

Then, the reflected light Hc containing the red component, as shown in FIG. 32, enters the photodiode 21 and photoelectric conversion is conducted.

Although not shown in FIG. 32, the light of the green component is hardly reflected by the infrared cut filter 202, and passes through the infrared cut filter 202 (refer to FIG. 31). Furthermore, as shown in FIG. 31, regarding the light of the blue component, a part of the light (in the range of 400 to 420 nm) is reflected, whereas most of the light is attenuated by set lenses and the like at the time of entrance.

Consequently, a ghost phenomenon resulting from the light of the red component may occur and the image quality of the image acquired through imaging may deteriorate.

However, in the present embodiment, as described above, the red filter layer 151R contains the black colorant. Consequently, an occurrence of a ghost can be suppressed.

Figure 33:
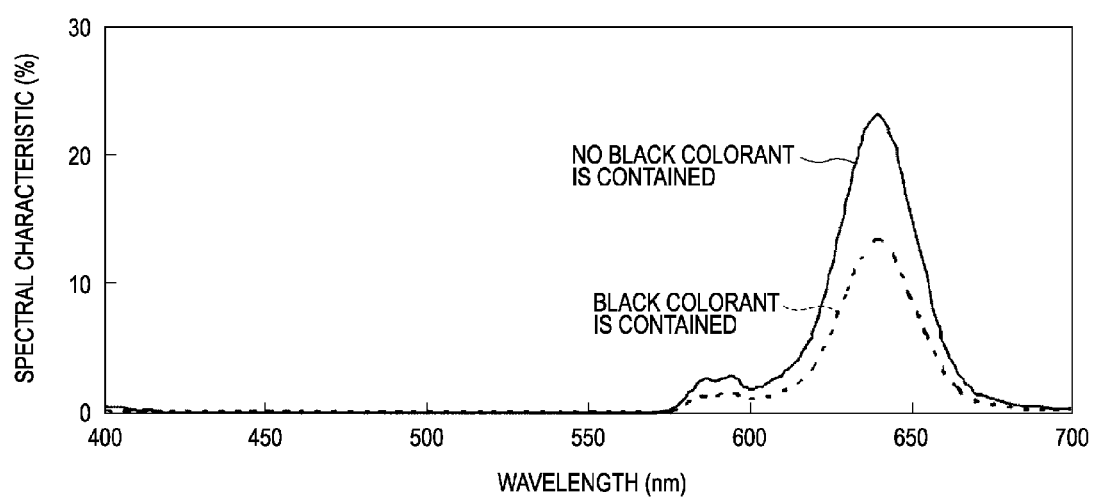
FIG. 33 is a diagram for explaining that an occurrence of a ghost phenomenon is suppressed in the fourth embodiment according to the present invention.

FIG. 33 is a diagram for explaining that an occurrence of a ghost phenomenon is suppressed in the fourth embodiment according to the present invention. FIG. 33 shows, as in FIG. 32, the spectral characteristic of the reflected light (Hc in FIG. 29) reflected by the infrared cut filter 202. In FIG. 33, a broken line indicates the case of the present embodiment, and a solid line indicates the case where no black colorant is contained in the red filter layer 151R according to the present embodiment.

As shown in FIG. 33, in the present embodiment, the red filter layer 151R contains the black colorant. Therefore, the reflected light (Hc in FIG. 29) reflected by the infrared cut filter 202 is absorbed by the red filter layer 151R, and the amount of the light is reduced. Specifically, as is clear from the integral of the spectrum, the amount of the light can be reduced to about 40%.

Therefore, in the present embodiment, an occurrence of a ghost can be suppressed and the image quality of the image acquired through imaging can be improved.

2. Fifth Embodiment

Configuration of Apparatus

Figure 34:
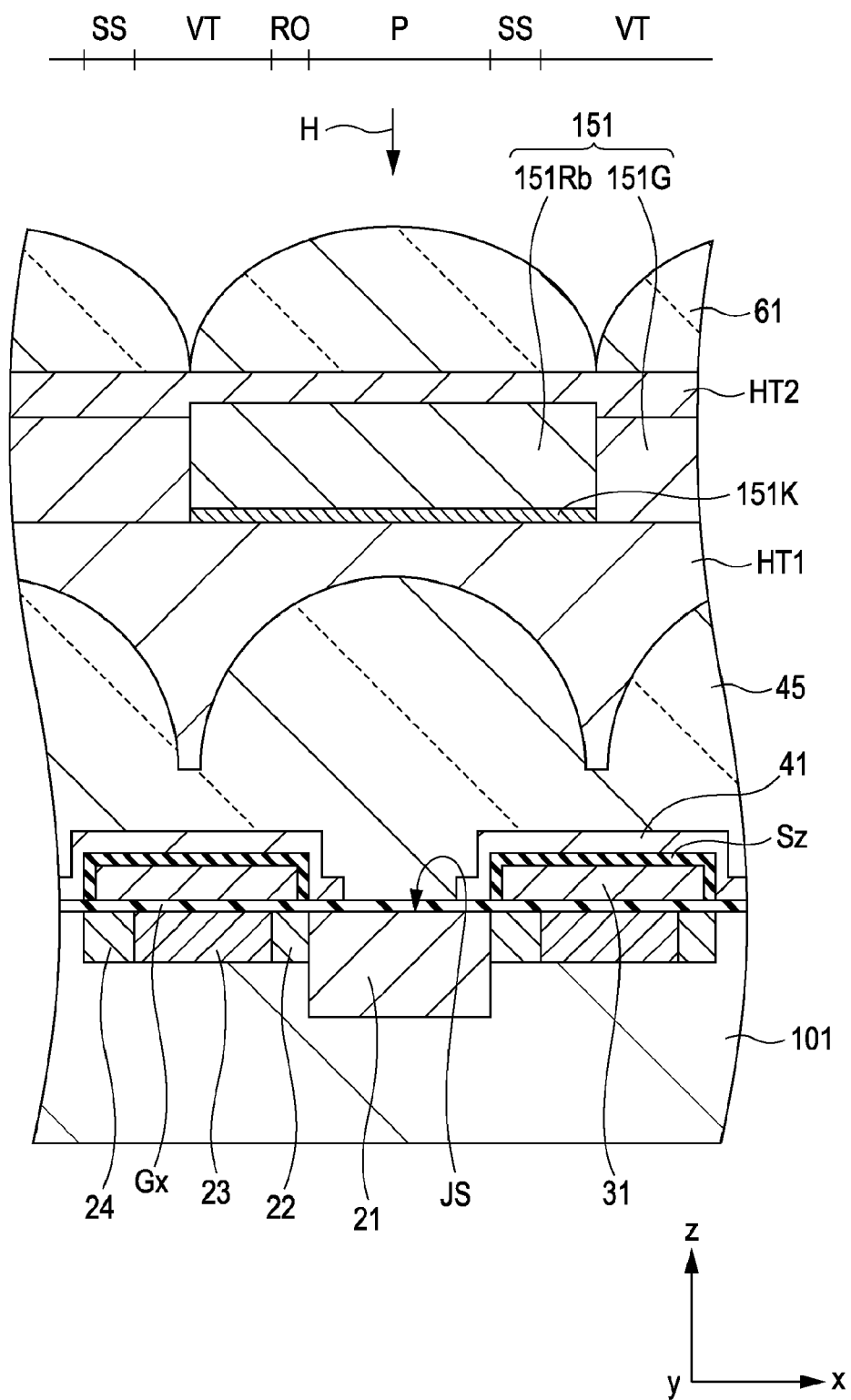
FIG. 34 is a diagram showing a key portion of a solid-state imaging device in a fifth embodiment according to the present invention.

FIG. 34 is a diagram showing a key portion of a solid-state imaging device 1b in a fifth embodiment according to the present invention. Here, FIG. 34 shows a cross-section of the key portion. FIG. 34 shows the section taken along a line X11-X21 shown in FIG. 19 under magnification.

As shown in FIG. 34, in the present embodiment, a red filter layer 151Rb of the solid-state imaging device 1b is different from that in the fourth embodiment. In addition, a black colorant-containing layer 151K is further disposed relative to the fourth embodiment. The present embodiment is the same as the fourth embodiment except this point and points related thereto. Therefore, descriptions of the same parts will not be provided.

In contrast to the fourth embodiment, the red filter layer 151Rb contains no black pigment. The red filter layer 151Rb is formed in a manner similar to that in the fourth embodiment except this point.

As shown in FIG. 34, the black colorant-containing layer 151K is disposed on the upper surface of the flattening layer HT1. The black colorant-containing layer 151K is disposed in the imaging region PA of the substrate 101 in such a way as to be interposed between the light-receiving surface of the photodiode 21 and the red filter layer 151Rb. The black colorant-containing layer 151K contains a black colorant. Furthermore, the black colorant-containing layer 151K is disposed above the light-receiving surface JS and is configured to transmit the incident light H to the light-receiving surface JS.

FIG. 35 is a magnified diagram showing a black colorant-containing layer 151K in the fifth embodiment according to the present invention. Here, FIG. 35 shows an upper surface of the black colorant-containing layer 151K.

As shown in FIG. 35A, black colorant-containing layer 151K is formed in such a way that a plan view in a direction along the surface (xy face) of the substrate 101 is square and the sides thereof are arranged along the horizontal direction x and the vertical direction y.

Besides, as shown in FIGS. 35B to 35D, the black colorant-containing layer 151K may be formed exhibiting various plan views.

For example, as shown in FIG. 35B, the black colorant-containing layer 151K may be formed in such a way that the plan view becomes a rectangle that is half the square plan view shown in FIG. 35A. Alternatively, as shown in FIG. 35C, the black colorant-containing layer 151K may be formed in such a way that the plan view becomes a square shape, in which isosceles triangles are disposed at four corners of the square and the inside of the square is opened. Alternatively, as shown in FIG. 35D, the black colorant-containing layer 151K may be formed in such a way that the plan view becomes a square shape, in which the sides thereof are arranged in directions inclined at an angle of 45° relative to the horizontal direction x and the vertical direction y. Alternatively, the shape of the black colorant-containing layer 151K may be a shape other than those shown in FIGS. 35A to 35D insofar as a part of the light flux condensed by the microlens passes through the black colorant-containing layer 151K.

Manufacturing Method

A method for manufacturing the above-described solid-state imaging device 1b will be described below.

FIG. 36 to FIG. 39 are diagrams showing key portions formed by the individual steps of the method for manufacturing the solid-state imaging device 1b in the fifth embodiment according to the present invention. Here, FIG. 36 to FIG. 39 show the section taken along the line X11-X21 shown in FIG. 19 under magnification, as in FIG. 34. The key portions formed by the individual steps are shown in the order of FIG. 36 to FIG. 39.

(1) Formation of Black Colorant-containing Layer 151K

Figure 36:
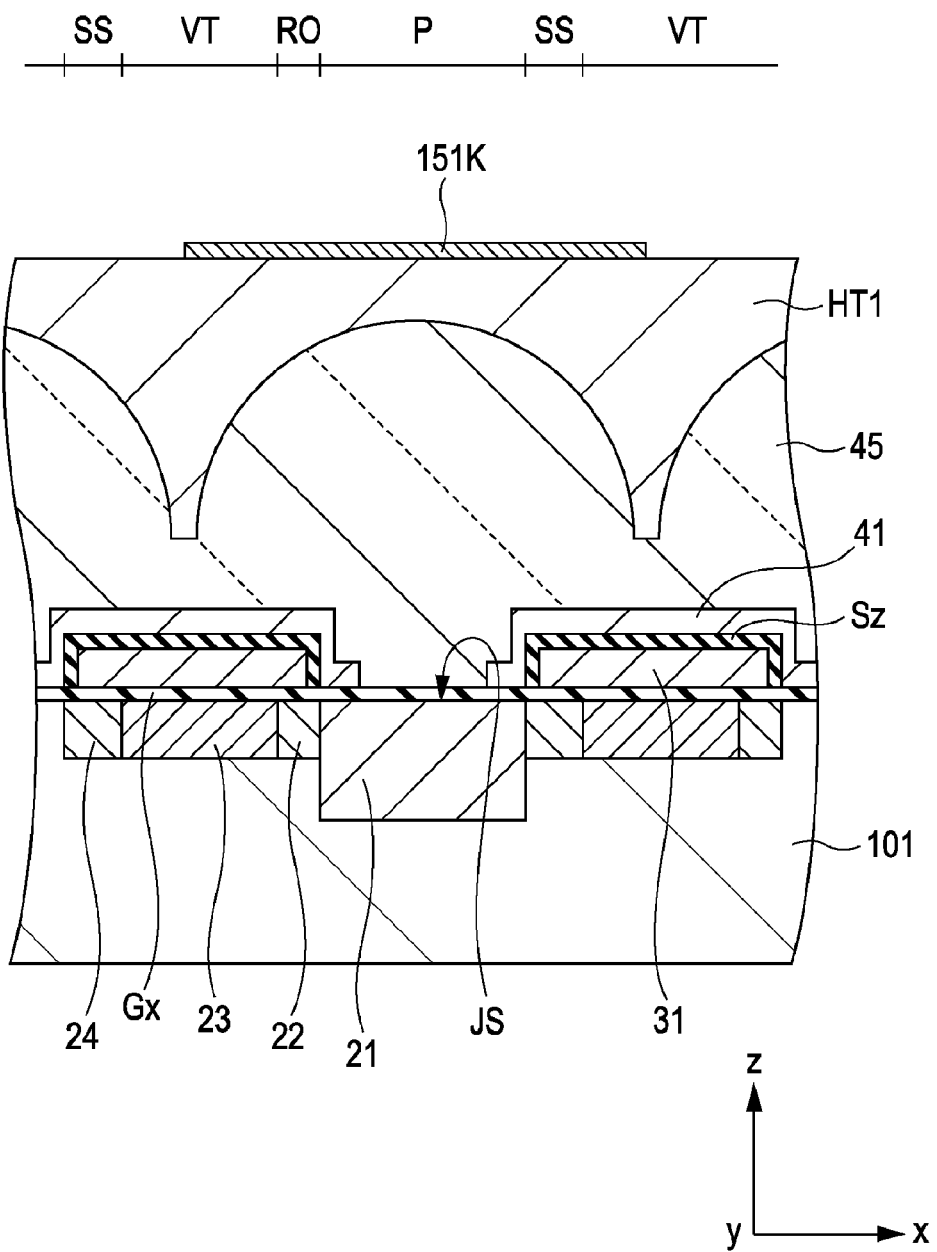
FIG. 36 is a diagram showing a key portion formed by a step of a method for manufacturing a solid-state imaging device in the fifth embodiment according to the present invention.

Initially, the black colorant-containing layer 151K is formed, as shown in FIG. 36.

Prior to formation of the black colorant-containing layer 151K, as shown in the above-described fourth embodiment, the intralayer lens 45 and the flattening film HT1 are formed (refer to FIG. 22 and FIG. 23).

Thereafter, as shown in FIG. 36, the black colorant-containing layer 151K is disposed on the upper surface of the flattening film HT1.

Here, the black colorant-containing layer 151K is disposed in such a way as to correspond to the region, in which the red filter layer 151R is formed, on the flattening film HT1.

Specifically, a photoresist film (not shown in the drawing) is formed by applying a coating solution containing a black colorant and a photosensitive resin by a spin coating method.

Subsequently, a prebaking treatment is conducted and, thereafter, the resulting photoresist film is patterned, so that the black colorant-containing layer 151K is formed.

For example, the photoresist film is formed by using SK-9000C (produced by FUJIFILM Electronic Materials Co., Ltd.). For example, this film formation is conducted in such a way that the film thickness becomes 0.04 μm. Here, SK-9000 is diluted with propylene glycol monomethyl ether acetate and propylene glycol monomethyl ether at a ratio of 9:1 and adjustment is conducted in such a way as to obtain the above-described film thickness. Then, for example, an i-line stepper is used and a pattern exposing treatment is conducted, in which a pattern image is transferred to the photoresist film. Thereafter, an organic alkali aqueous solution (for example, a solution in which a nonionic surfactant is added to tetramethylammonium hydroxide) is used as a developing solution, and a developing treatment of the photoresist film subjected to the pattern exposing treatment is conducted. Then, a post baking treatment is conducted, so that the black colorant-containing layer 151K is formed.

It is favorable that the film thickness of the black colorant-containing layer 151K is 0.2 μm or less, and 0.1 μm or less is more favorable. In this regard, the film thickness may be optimized by adjusting the content of the black colorant appropriately.

(2) Formation of the Green Filter Layer 151G

Figure 37:
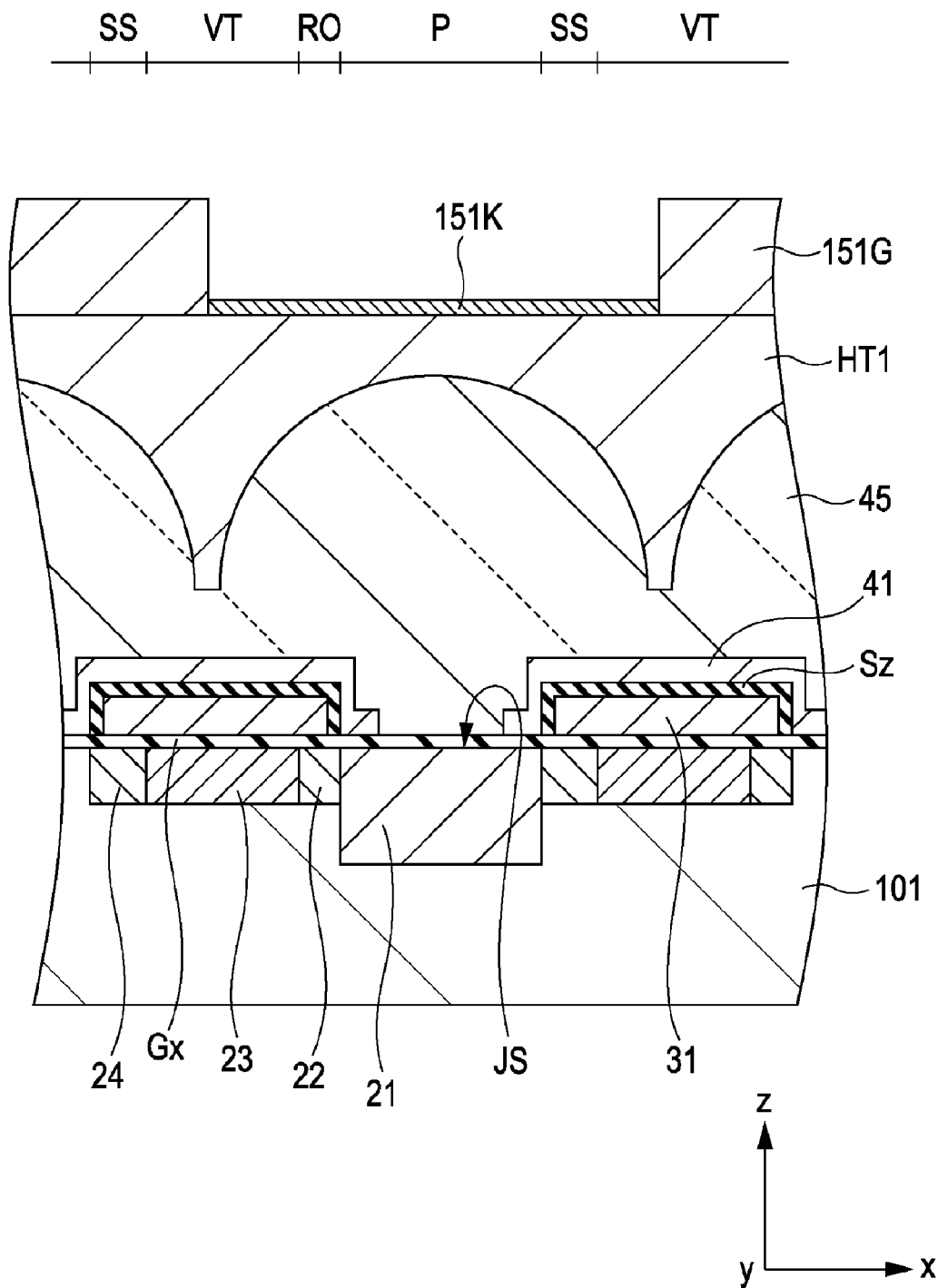
FIG. 37 is a diagram showing a key portion formed by a step of a method for manufacturing a solid-state imaging device in the fifth embodiment according to the present invention.

Next, as shown in FIG. 37, the green filter layer 151G constituting the color filter 151 is formed.

Here, as shown in FIG. 37, the green filter layer 151G is disposed on the surface of the flattening film HT1.

Specifically, as in the fourth embodiment, a photoresist film (not shown in the drawing) is formed by applying a coating solution containing a green colorant and a photosensitive resin by a spin coating method. Subsequently, a prebaking treatment is conducted. Thereafter, the resulting photoresist film is patterned, so that the green filter layer 151G is formed.

(3) Formation of Red Filter Layer 151Rb

Figure 38:
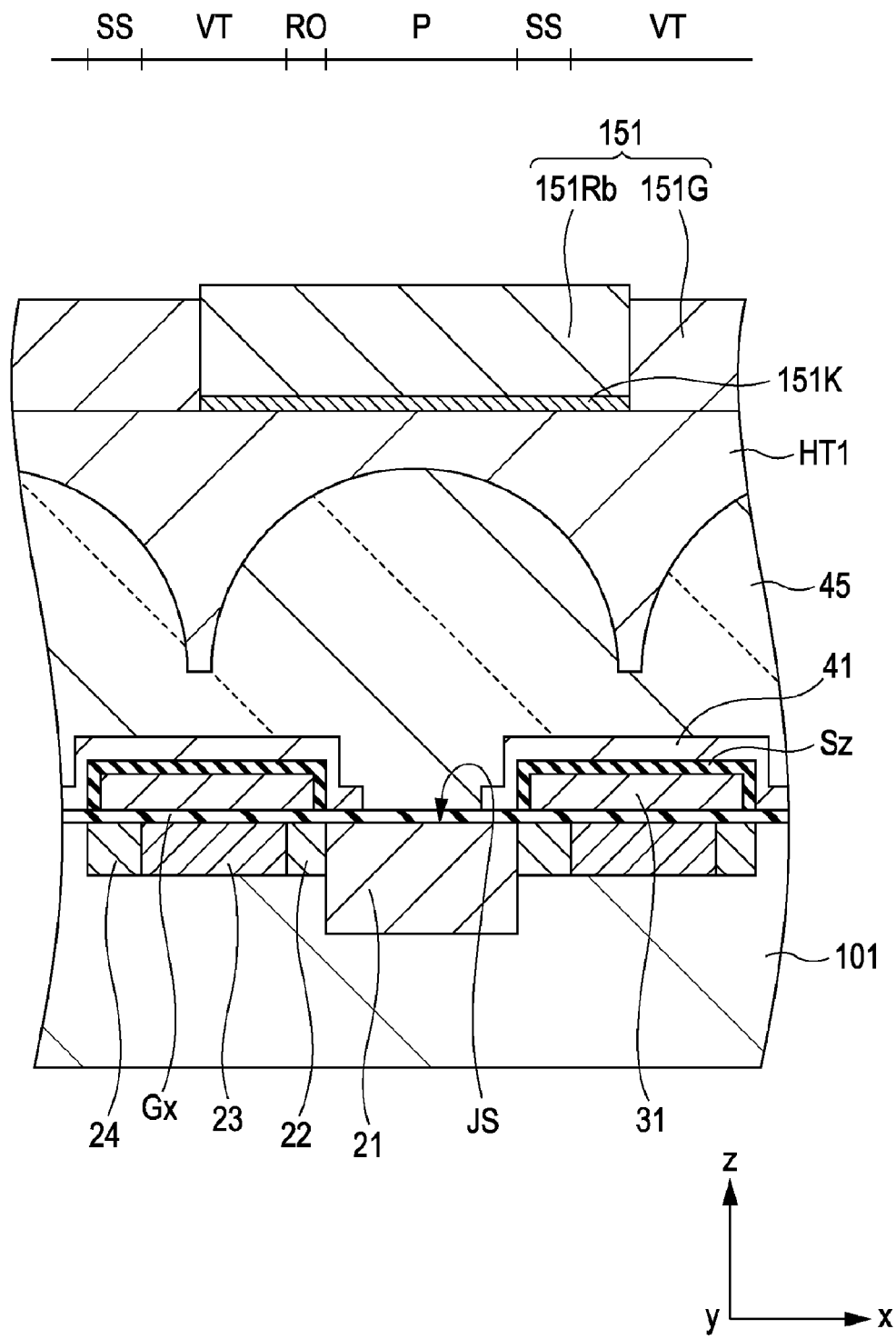
FIG. 38 is a diagram showing a key portion formed by a step of a method for manufacturing a solid-state imaging device in the fifth embodiment according to the present invention.

Next, as shown in FIG. 38, a red filter layer 151Rb constituting the color filter 151 is formed.

Here, as shown in FIG. 38, the red filter layer 151Rb is disposed on the surface of the black colorant-containing layer 151K disposed on the flattening film HT1.

Specifically, as in the fourth embodiment, a photoresist film (not shown in the drawing) is formed by applying a coating solution containing a red colorant and a photosensitive resin by a spin coating method. In the present embodiment, this photoresist film (not shown in the drawing) is formed without containing a black colorant, besides the red colorant, in the above-described coating solution.

Subsequently, a prebaking treatment is conducted and, thereafter, the resulting photoresist film is patterned, so that the red filter layer 151Rb is formed.

Thereafter, although not shown in the drawing, the blue filter layer 151B is disposed on a surface of the flattening film HT1 and, thereby, the color filter 151 composed of three primary colors is completed, as in the fourth embodiment.

(4) Formation of Flattening Film HT2

Figure 39:
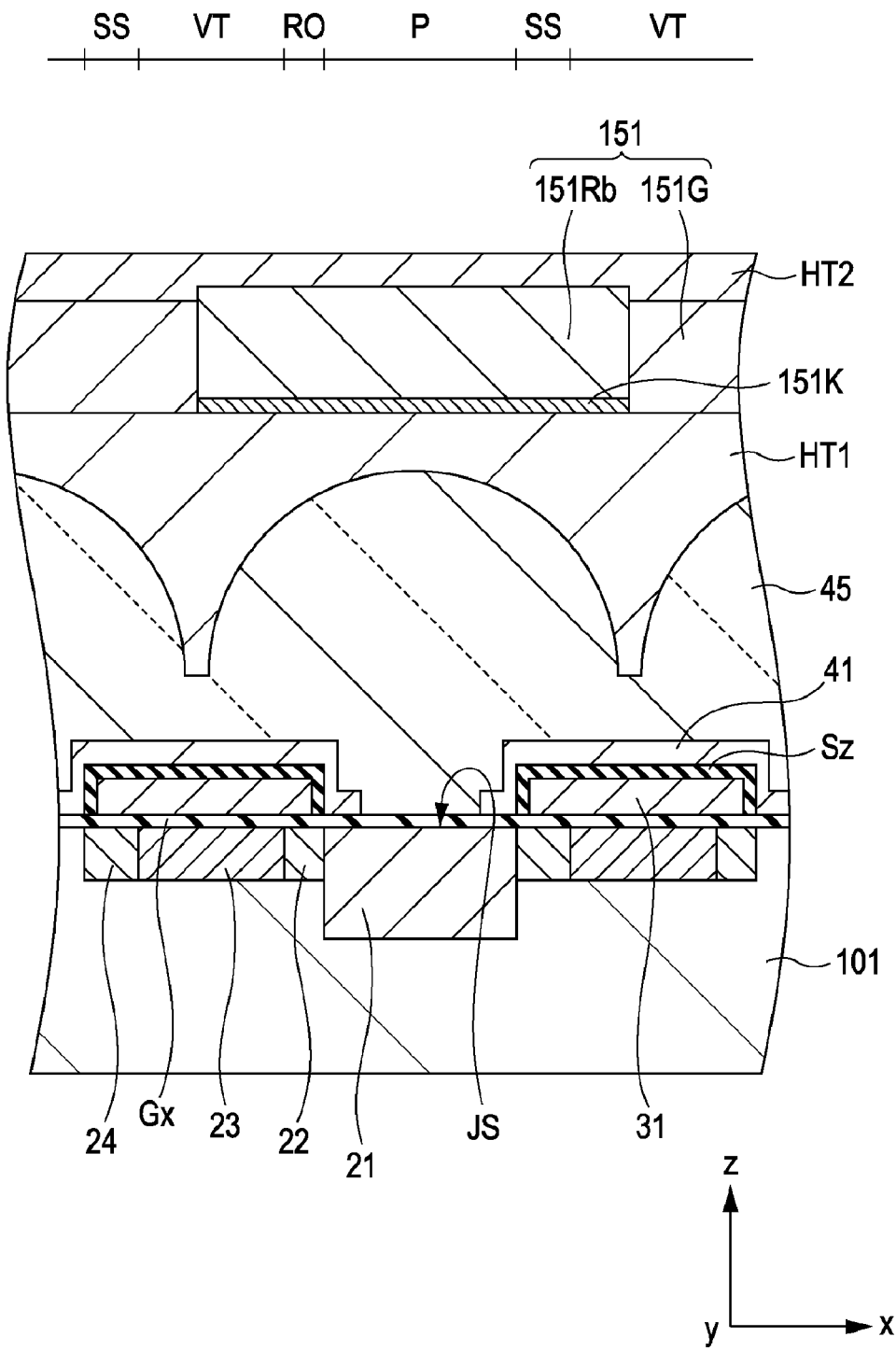
FIG. 39 is a diagram showing a key portion formed by a step of a method for manufacturing a solid-state imaging device in the fifth embodiment according to the present invention.

Next, as shown in FIG. 39, the flattening film HT2 is formed on the color filter 151.

Here, the flattening film HT2 is disposed in such a way as to cover and flatten the upper surface of the color filter 151.

Specifically, a film of a thermosetting resin is formed on the upper surface of the color filter 151 by a spin coating method and, thereafter, a heat-curing treatment is conducted, so that the flattening film HT2 is formed.

(5) Formation of Microlens 61

Next, as shown in FIG. 34, the microlens 61 is formed on the upper surface of the flattening film HT2.

Here, as shown in FIG. 34, the microlens 61 is disposed as a convex lens, in a manner similar to that in the fourth embodiment.

As described above, in the present embodiment, the black colorant-containing layer 151K containing the black colorant is disposed. The black colorant-containing layer 151K is interposed between the red filter layer 151Rb and the light-receiving surface JS above the light-receiving surface JS and is configured to transmit the incident light H incident from the red filter layer 151Rb to the light-receiving surface JS.

Figure 40:
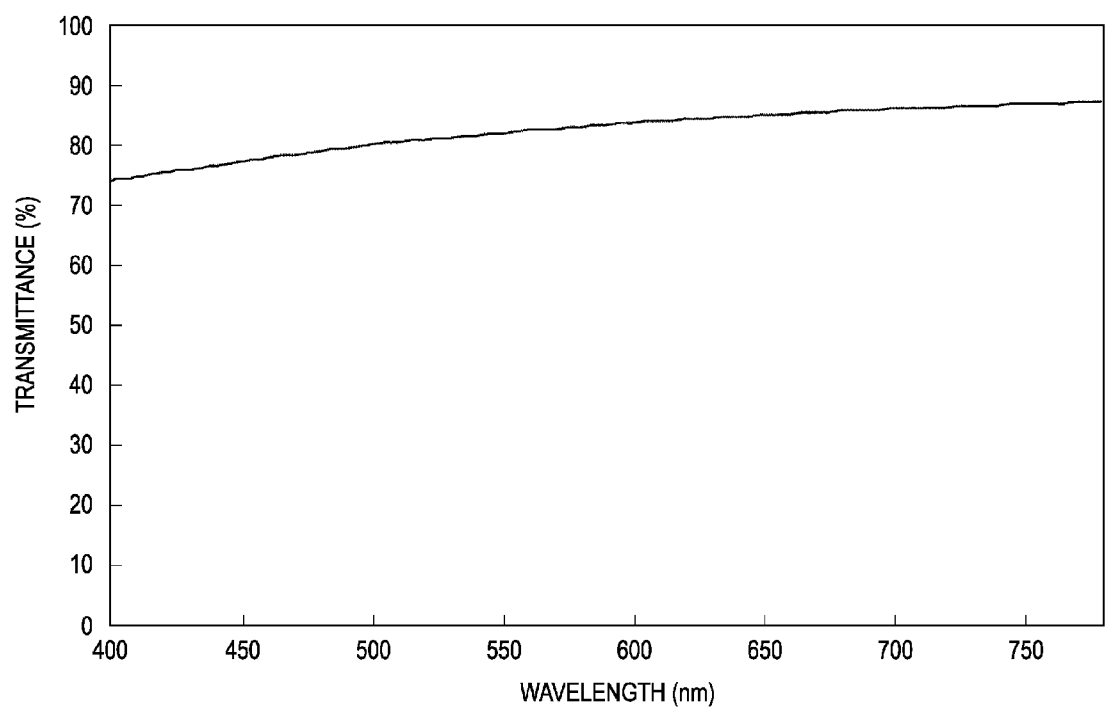
FIG. 40 is a diagram showing the spectral characteristic of a black colorant-containing layer in the fourth embodiment according to the present invention.

FIG. 40 is a diagram showing the spectral characteristic of the black colorant-containing layer 151K in the fifth embodiment according to the present invention. In FIG. 40, the horizontal axis indicates the wavelength (nm) and the vertical axis indicates the transmittance (%).

As is shown in FIG. 40, the black colorant-containing layer 151K is formed in such a way that the light transmittance becomes 75 to 88% in the wavelength of about 400 to 750 nm containing the wavelength region of the visible light. Furthermore, the black colorant-containing layer 151K is formed in such a way that the light transmittance increases as the wavelength increases.

Consequently, in the present embodiment, the spectral characteristic in the case where both the red filter layer 151Rb containing no black colorant and the black colorant-containing layer 151K are stacked becomes the same spectral characteristic as that shown in FIG. 27 in the fourth embodiment.

Hence, in the present embodiment, adjustment of the white balance can be conducted easily and the color separability of the red can be improved, so that excellent color reproducibility is exhibited, as in the fourth embodiment.

Moreover, in the present embodiment, an occurrence of a ghost can be suppressed.

Therefore, in the present embodiment, the image acquired through imaging can be improved.

3. Sixth Embodiment

Configuration of Apparatus and the Like

FIG. 41 is a diagram showing a key portion of a solid-state imaging device 1c in a sixth embodiment according to the present invention. FIG. 41 is a plan view of the color filter 151.

As shown in FIG. 41, in the present embodiment, a green filter layer 151Gc and the blue filter layer 151Bc constituting the color filter 151 of the solid-state imaging device 1c are different from those in the fourth embodiment. The present embodiment is the same as the fourth embodiment except this point and points related thereto. Therefore, descriptions of the same parts will not be provided.

As shown in FIG. 41, the color filter 151 includes a coloring filter of the three primary colors, that is, the red filter layer 151R, the green filter layer 151Gc, and the blue filter layer 151Bc, as in the fourth embodiment.

Then, as shown in FIG. 41, the red filter layer 151R, the green filter layer 151Gc, and the blue filter layer 151Bc are arranged in the Bayer pattern, for example.

The red filter layer 151R constituting the color filter 151 is formed in a manner similar to that in the fourth embodiment and is formed containing a black colorant.

Besides, each of the green filter layer 151Gc and the blue filter layer 151Bc constituting the color filter 151 is formed in such a way as to contain a black colorant in contrast to those in the forth embodiment.

In the present embodiment, the red filter layer 151R, the green filter layer 151Gc, and the blue filter layer 151Bc are formed in such a way that the individual contents of black colorant are the same.

In the above description, for example, the black pigments (carbon black) mentioned in the fourth embodiment can be used as the black colorant. It is favorable that the content of this black colorant becomes 1 to 10 percent by mass in terms of total solid content.

As described above, in the color filter 151 in the present embodiment, the black colorant is contained in each of the green filter layer 151Gc and the blue filter layer 151Bc in addition to the red filter layer 151R. Consequently, in the case where the pixel size is relatively large (for example, 2.0 μm☐ or more), a ghost phenomenon resulting from the light of the green component and the blue component can be suppressed, as described below, besides the effects in the fourth embodiment.

Figure 42:
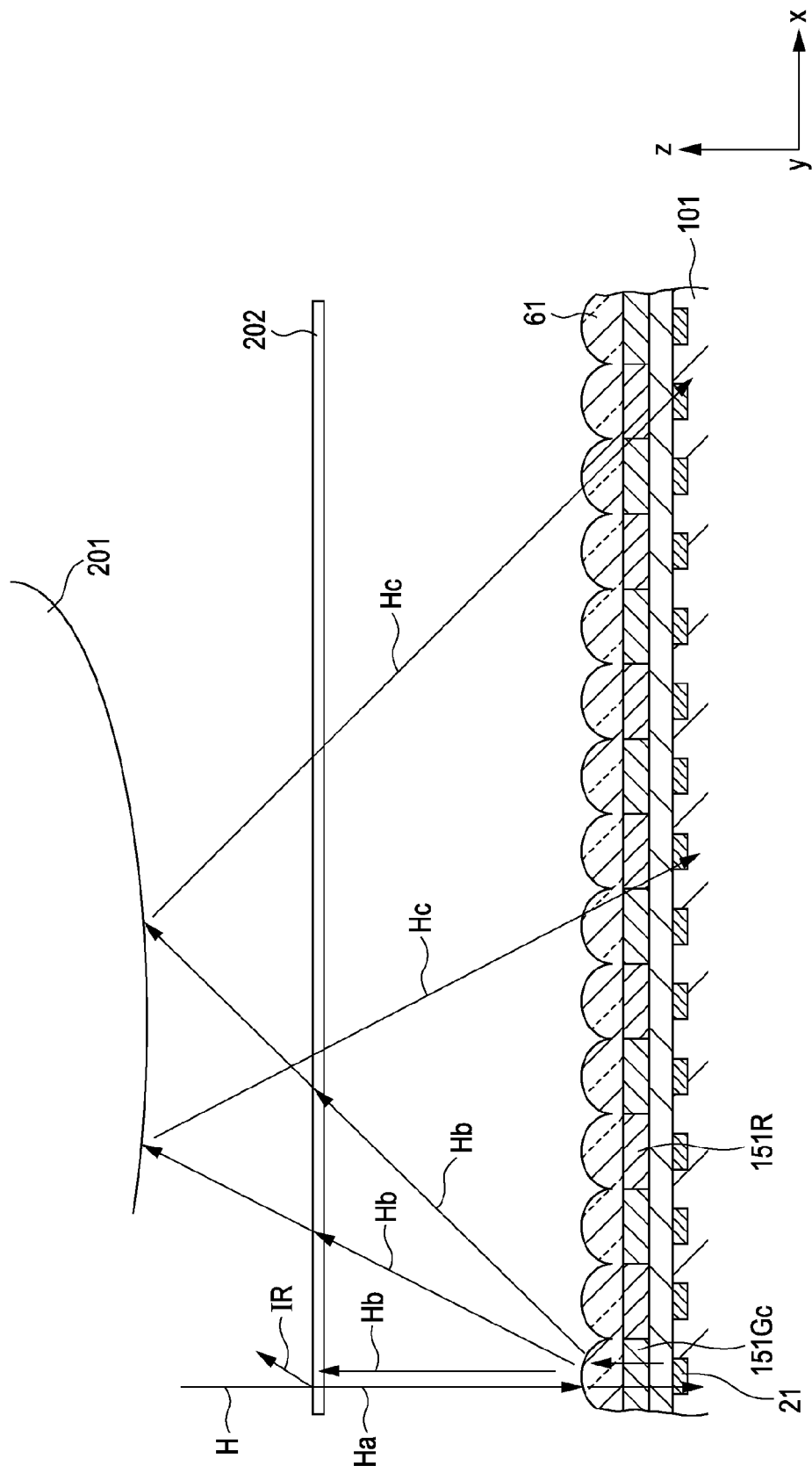
FIG. 42 is a diagram for explaining the manner in which an occurrence of a ghost phenomenon is suppressed in the sixth embodiment according to the present invention.

FIG. 42 is a diagram for explaining the manner in which an occurrence of a ghost phenomenon resulting from the light of the green component is suppressed in the sixth embodiment according to the present invention.

As shown in FIG. 42, first, the incident light H enters the infrared cut filter 202. Then, the light IR composed of large-wavelength components is reflected by the infrared cut filter 202, so that the infrared rays are cut.

Next, as shown in FIG. 42, the transmitted light Ha passed through the infrared cut filter 202 enters the photodiode 21 through the members, e.g., the microlens 61 and the green filter layer 151Gc. Then, photoelectric conversion is conducted in the photodiode 21.

At this time, there are components reflected without being photoelectrically converted, and the reflected light Hb thereof returns to the members, e.g., the green filter layer 151Gc and the microlens 61, as shown in FIG. 42.

Subsequently, as shown in FIG. 42, the reflected light Hb moves in various directions and returns to the infrared cut filter 202.

Next, as shown in FIG. 42, the reflected light Hb passes through the infrared cut filter 202. That is, since the infrared cut filter 202 has the reflection characteristic shown in FIG. 31, the reflected light Hc is not reflected by the infrared cut filter 202 and most of the light is transmitted so as to enter an optical system 201.

Thereafter, as shown in FIG. 42, the reflected light Hc is reflected by the surface of the optical system 201. Then, the reflected light Hc reflected by the surface of the optical system 201 enters the members, e.g., the green filter layer 151Gc and the microlens 61, again.

Next, as shown in FIG. 42, the reflected light Hc containing the green component enters the photodiode 21 and photoelectric conversion is conducted.

Although not shown in the drawing, regarding the light of the blue component, a part of the light may be reflected by the optical system 201, the reflected light thereof may enter photodiode 21, and photoelectric conversion may be conducted in a manner similar to that of the reflected light Hc containing the green component.

Consequently, a ghost phenomenon resulting from the light of the green component and the blue component may occur and the image quality of the image acquired through imaging may deteriorate.

However, in the present embodiment, as described above, each of the green filter layer 151Gc and the blue filter layer 151Bc contains the black colorant, as in the case of the red filter layer 151R in the fourth embodiment. Consequently, in the present embodiment, the amount of light of the reflected light (Hc in FIG. 42) reflected by the optical system 201 is reduced by each of the green filter layer 151Gc and the blue filter layer 151Bc.

Hence, in the present embodiment, an occurrence of a ghost phenomenon resulting from the light of the green component and the blue component can be suppressed and the image quality of the image acquired through imaging can be improved.

In addition to this, in the present embodiment, each of the green filter layer 151Gc and the blue filter layer 151Bc contains the black colorant. Therefore, "spectrum floating" in a wavelength region to be suppressed (as for blue, 485 nm or more, and as for green, 400 to 500 nm and 565 nm or more) can be reduced. Hence, the color separability can be improved and, thereby, the image quality of the image acquired through imaging can be improved.

In this regard, in the present embodiment, the case where the same black colorant is contained in the red filter layer 151R, the green filter layer 151Gc, and the blue filter layer 151Bc at the same proportion is shown, although not limited to this. The content of the black colorant may be different between the red filter layer 151R, the green filter layer 151Gc, and the blue filter layer 151Bc. For example, in the case where the output of the red component is larger than the output of the other color components or in the case where an occurrence of a ghost due to red is significant, it is favorable that the red filter layer 151R has a black colorant content larger than the contents in the green filter layer 151Gc and the blue filter layer 151Bc.

Furthermore, in the case where the black colorant-containing layer 151K shown in the fifth embodiment is disposed in such a way as to correspond to each of the red filter layer, the green filter layer, and the blue filter layer as well, the same operation and effects as those in the present embodiment can be obtained.

4. Other

Execution of the present invention is not limited to the above-described embodiments, but various modified examples can be adopted.

For example, in the above-described embodiment, the case where the microlens 61 is disposed on the flattening film FT2 is explained, although not limited to this. For example, besides the above description, the microlens 61 may be formed without disposing the flattening film FT2 on the color filter 151. In this case, a film of a microlens material is applied flatly and directly to the surface of the color filter 151. Then, a photoresist film in the shape of a rectangle is disposed through patterning on the film of the microlens material. Thereafter, the resulting photoresist film is subjected to a heat treatment at a heat-softening point or higher so as to be made into the shape of a lens. Subsequently, the resulting photoresist mask in the shape of the lens is used, and the film of the microlens material serving as a base material is subjected to a dry etching treatment, so that the microlens 61 may be formed.

For example, in the above-described embodiment, the application to the CCD type image sensor is explained, although not limited to this. For example, it is possible to apply to various image sensors, e.g., CMOS type image sensors.

Furthermore, the structure of the intralayer lens 45 is not limited to the structure shown in the above-described embodiment. Besides the above-described convex lens, various shapes of lens, e.g., concave lens, may be employed.

In the above-described embodiment, the case where the black colorant-containing layer 151K is disposed between the light-receiving surface JS and the color filter 151, e.g., the red filter layer 151Rb, is shown, although not limited to this. The black colorant-containing layer 151K may be disposed above the color filter 151. In this case, for example, a microlens is allowed to contain a black colorant and the resulting microlens may be configured to function as a black colorant-containing layer.

The black colorant-containing layer may be disposed in such a way as to cover the surface of the microlens. In this case, for example, the black colorant-containing layer, in which a black colorant is contained in a resin material (for example, a fluororesin) having a refractive index smaller than that of the microlens, may be disposed in such a way that the surface of the microlens 61 is flattened.

In addition to this, a layer containing titanium black or graphite black may be disposed as the black colorant-containing layer. In the case of the graphite black, for example, formation through patterning can be conducted by a lift-off method in the related art.

In the above-described embodiment, the case where the present invention is applied to the camera is explained, although not limited to this. The present invention may be applied to other electronic apparatuses, e.g., scanners and copiers, provided with solid-state imaging devices.

In this regard, in the above-described embodiments, the solid-state imaging devices 1, 1b, and 1c correspond to the solid-state imaging devices according to the embodiments of the present invention. In the above-described embodiments, the intralayer lens 45 corresponds to the intralayer lens according to the embodiment of the present invention. In the above-described embodiments, the color filter 151 corresponds to the color filter according to the embodiment of the present invention. In the above-described embodiments, the blue filter layers 151B and 151Bc correspond to the third color filters according to the embodiments of the present invention. In the above-described embodiments, the green filter layers 151G and 151Gc correspond to the second color filters according to the embodiments of the present invention. In the above-described embodiments, the red filter layers 151R and 151Rb correspond to the first color filters according to the embodiments of the present invention. In the above-described embodiments, the black colorant-containing layer 151K corresponds to the black colorant-containing layer according to the embodiment of the present invention. In the above-described embodiments, the microlens 61 corresponds to the microlens according to the embodiment of the present invention. In the above-described embodiments, the substrate 101 corresponds to the substrate according to the embodiment of the present invention. In the above-described embodiments, the camera 200 corresponds to the electronic apparatus according to the embodiment of the present invention. In the above-described embodiments, the infrared cut filter 202 corresponds to the cut filter according to the embodiment of the present invention. In the above-described embodiments, the light-receiving surface JS corresponds to the light-receiving surface according to the embodiment of the present invention. In the above-described embodiments, the photoelectric conversion portion P corresponds to the photoelectric conversion portion according to the embodiment of the present invention. In the above-described embodiments, the imaging region PA corresponds to the imaging region according to the embodiment of the present invention.

The present application contains subject matter related to that disclosed in Japanese Priority Patent Application JP 2009-027341 filed in the Japan Patent Office on Feb. 9, 2009 and JP 2009-075978 filed in the Japan Patent Office on Mar. 26, 2009, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a solid-state imaging device, in which a photoelectric conversion portion to receive light via a light-receiving surface and generate a signal charge is disposed in a substrate, the method comprising the steps of:

forming an electrode over the substrate in a region of the substrate other than a region of the substrate corresponding to the light-receiving surface;

forming a metal light-shield layer above the electrode;

forming a light-reflection layer, which reflects light, above and in alignment with the metal light-shield layer; and forming a photoresist pattern layer over and in alignment with the light-reflection layer from a negative type photoresist film by conducting an exposing treatment and a developing treatment of the photoresist film, wherein in the forming of the light-reflection layer,
the light-reflection layer includes a shape corresponding to a pattern shape of the photoresist pattern layer, and
the light-reflection layer is formed in such a way as to reflect exposure light to the photoresist film in conduction of the exposing treatment in the forming of the photoresist pattern layer.

2. The method for manufacturing a solid-state imaging device according to claim 1, the method further comprising the steps prior to forming the light shield layer of:

forming a charge readout portion, in the substrate, to read the signal charge generated by the photoelectric conversion portion in a charge readout channel region; and forming a transfer resistor portion, in the substrate, to transfer the signal charge in the charge transfer channel region, the signal charge being read from the photoelectric conversion portion by the charge readout portion, wherein,
in the forming of the metal light-shield layer, the metal light-shield layer is formed above the charge readout channel region and the charge transfer channel region in such a way as to block the light incident on the charge readout channel region and the charge transfer channel region.

3. The method for manufacturing a solid-state imaging device according to claim 2, wherein in the forming of the photoresist pattern layer, a black color resist pattern layer is formed as the photoresist pattern layer.

4. A method for manufacturing a camera including a solid-state imaging device in which a photoelectric conversion portion to receive light via a light-receiving surface and generate a signal charge is disposed in a substrate, the method comprising the steps of:

forming an electrode over the substrate in a region of the substrate other than a region of the substrate corresponding to the light-receiving surface;

forming a metal light-shield layer above the electrode;

forming a light-reflection layer, which reflects light, above and in alignment with the metal light-shield layer; and forming a photoresist pattern layer over and in alignment with the light-reflection layer from a negative type photoresist film by conducting an exposing treatment and a developing treatment of the photoresist film, wherein,
in the forming of the light-reflection layer, the light-reflection layer includes a shape corresponding to a pattern shape of the photoresist pattern layer, and
the light-reflection layer is formed in such a way as to reflect exposure light to the photoresist film in conduction of the exposing treatment in the forming of the photoresist pattern layer.

5. A solid-state imaging device comprising:

a photoelectric conversion portion, which is disposed in a substrate to receive light via a light-receiving surface and generate a signal charge;

a charge readout portion in the substrate in a region other than a region corresponding to the light receiving surface;

a readout transistor portion in the substrate in the region other than the region corresponding to the light receiving surface;

an electrode over the substrate in the region other than the region corresponding to the light receiving surface;

a metal light-shield layer over the electrode;

a light-reflection layer disposed above and in alignment with the metal light-shield layer; and a photoresist pattern layer disposed above and in alignment with the light-reflection layer, wherein,
the photoresist pattern layer is formed from a negative type photoresist film by conducting an exposing treatment and a developing treatment of the photoresist film,
the light-reflection layer includes a shape corresponding to a pattern shape of the photoresist pattern layer, and
the light-reflection layer is formed in such a way as to reflect exposure light to the photoresist film in conduction of the exposing treatment.

6. A camera comprising:

a photoelectric conversion portion, which is disposed in a substrate, to receive light via a light-receiving surface and generate a signal charge;

a charge readout portion in the substrate in a region other than a region corresponding to the light receiving surface;

a readout transistor portion in the substrate in the region other than the region corresponding to the light receiving surface;

an electrode over the substrate in the region other than the region corresponding to the light receiving surface;

a metal light-shield layer disposed above the electrode;

a light-reflection layer disposed above and in alignment with the metal light-shield layer; and a photoresist pattern layer disposed above and in alignment with the light-reflection layer, wherein,
the photoresist pattern layer is formed from a negative type photoresist film by conducting an exposing treatment and a developing treatment of the photoresist film,
the light-reflection layer includes a shape corresponding to a pattern shape of the photoresist pattern layer, and
the light-reflection layer is formed in such a way as to reflect exposure light to the photoresist film in conduction of the exposing treatment.

* * * * *